United States Patent
Schultz et al.

[11] Patent Number: 6,004,617
[45] Date of Patent: *Dec. 21, 1999

[54] COMBINATORIAL SYNTHESIS OF NOVEL MATERIALS

[75] Inventors: Peter G. Schultz, Oakland; Xiaodong Xiang, Alameda; Isy Goldwasser, Menlo Park, all of Calif.

[73] Assignees: The Regents of the University of California, Oakland; Symyx Technologies, Santa Clara, both of Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/480,007

[22] Filed: Jun. 7, 1995

Related U.S. Application Data

[60] Division of application No. 08/438,043, May 8, 1995, Pat. No. 5,776,359, which is a continuation-in-part of application No. 08/327,513, Oct. 18, 1994.

[51] Int. Cl.$^6$ ....................................................... B05D 1/06
[52] U.S. Cl. .............................. 427/8; 427/559; 427/266; 427/510; 427/504; 427/333; 427/448; 436/810; 436/809
[58] Field of Search ..................................... 427/559, 266, 427/8, 510, 504, 333, 448; 436/810, 809

[56] References Cited

U.S. PATENT DOCUMENTS

| | | | |
|---|---|---|---|
| 3,520,716 | 7/1970 | Okamoto et al. | 427/266 X |
| 3,764,370 | 10/1973 | Bragole | 427/333 X |

(List continued on next page.)

FOREIGN PATENT DOCUMENTS

| | | |
|---|---|---|
| 58-223618 | 12/1983 | Japan . |
| 6-171954 | 6/1994 | Japan . |
| 7-74003 | 3/1995 | Japan . |
| WO 90/00626 | 1/1990 | WIPO . |
| WO 90/15070 | 12/1990 | WIPO . |
| WO 92/10092 | 6/1992 | WIPO . |
| WO 93/09668 | 5/1993 | WIPO . |

OTHER PUBLICATIONS

Briceno, et al., *Science*, 270:273–275 (1995).
Jonker, et al., *Physica*, XIX:120–130 (1953).
Mahendiran, et al., *Rev. Sci. Instrum.*, 66(4):3071–3072 (1995).

(List continued on next page.)

*Primary Examiner*—Cynthia Hamilton
*Attorney, Agent, or Firm*—Townsend & Townsend & Crew LLP

[57] ABSTRACT

Methods and apparatus for the preparation and use of a substrate having an array of diverse materials in predefined regions thereon. A substrate having an array of diverse materials thereon is generally prepared by delivering components of materials to predefined regions on a substrate, and simultaneously reacting the components to form at least two materials. Materials which can be prepared using the methods and apparatus of the present invention include, for example, covalent network solids, ionic solids and molecular solids. More particularly, materials which can be prepared using the methods and apparatus of the present invention include, for example, inorganic materials, intermetallic materials, metal alloys, ceramic materials, organic materials, organometallic materials, non-biological organic polymers, composite materials (e.g., inorganic composites, organic composites, or combinations thereof), etc. Once prepared, these materials can be screened for useful properties including, for example, electrical, thermal, mechanical, morphological, optical, magnetic, chemical, or other properties. Thus, the present invention provides methods for the parallel synthesis and analysis of novel materials having useful properties.

61 Claims, 22 Drawing Sheets

U.S. PATENT DOCUMENTS

| | | | |
|---|---|---|---|
| 4,225,575 | 9/1980 | Piasio et al. | 436/810 X |
| 4,728,502 | 3/1988 | Hamill . | |
| 5,024,992 | 6/1991 | Morris . | |
| 5,045,916 | 9/1991 | Vor et al. . | |
| 5,120,707 | 6/1992 | Maxfield et al. | 205/1 |
| 5,143,854 | 9/1992 | Pirrung et al. . | |
| 5,288,514 | 2/1994 | Ellman . | |
| 5,306,411 | 4/1994 | Mazanec et al. | 204/265 |
| 5,324,483 | 6/1994 | Cody et al. . | |
| 5,356,756 | 10/1994 | Cavicchi et al. | 427/8 X |
| 5,384,261 | 1/1995 | Winkler et al. . | |
| 5,478,800 | 12/1995 | Itozaki et al. | 505/475 |
| 5,527,681 | 6/1996 | Holmes | 435/6 |

OTHER PUBLICATIONS

Yamaguchi, et al., *Journal of the Physical Society of Japan*, 64(6):1885–1888 (1995).

Borman, Stu (1995) "Combinatorial strategy targets new materials", *Chemical & Engineering News*, p. 7.

Xiang, X.D., et al. (1995) "A Combinatorial Approach to Materials Discovery", *Science*, 268:1738–1740.

Barbas, et al., "Assembly of combinatorial antibody libraries on phage surfaces: The gene III site," *Proc. Natl. Acad. Sci.*, 88:7978–7982 (1991).

Blake, et al., "Evaluation of Peptide Libraries: An Iterative Strategy to Analyze the Reactivity of Peptide Mixtures with Antibodies," *Bioconjugate Chem.*, 3(6):510–513 (1992).

Bray, et al., "The Simultaneous Multiple Production of Solution Phase Peptides; Assessment of the Geysen Method of Simultaneous Peptide Synthesis," *Tetrahedron Letters*, 31(40):5811–5814 (1990).

Bunin, et al., "The combinatorial synthesis and chemical and biological evaluation of 1,4–benzodiazepine library," *Proc. Natl. Acad. Sci. USA*, 91:4708–4712 (1994).

Cava, "Structural Chemistry and the Local Charge Picture of Copper Oxide Superconductors," *Science*, 247:656–662 (1990).

Cwirla, et al., "Peptides on phage: A vast library of peptides for identifying ligands," *Proc. Natl. Acad. Sci.*, 87:6378–6382 (1990).

Devlin, et al., "Random Peptide Libraries: A Source of Specific Protein Binding Molecules." *Science*, 249:404–406 (1990).

DiSalvo, "Solid State Chemistry: A Rediscovered Chemical Frontier," *Science*, 247:649–655 (1990).

Ellington, et al., "In vitro selection of RNA molecules that bind specific ligands," *Nature*, 346:818–822 (1990).

Fister, et al., "Controlling Solid State Reactions via Rational Design of Superlattice Reactants" in *Advances in the Synthesis and Reactivity of Solids* (city of publication?), JAI Press Inc., 1994, 155 et seq.

Fodor, et al., "Light–Directed, Spatially Addressable Parallel Chemical Synthesis," *Science*, 251:767–773 (1991).

Houghton, et al., "Generation and use of synthetic peptide combinatorial libraries for basic research and drug discovery," *Nature*, 354:84–86 (1991).

Jin, et al., "Thousandfold Change in Resistivity in Magnetoresistive La–Ca–Mn–O Films," *Science*, 264:413–415 (1994).

Lam, et al., "A new type of synthetic peptide library for identifying liband–binding activity," *Nature*, 354:82–84 (1994).

Lerner, et al., "At the Crossroads of Chemistry and Immunology: Catalytic Antibodies," *Science*, 242:659–667 (1991).

Maeda, et al., "A New High–$T_c$ Oxide Superconductor without a Rare Earth Element," *The Journal of Applied Physics*, 27(2):L209–L210 (1988).

Needels, et al. "Generation and screening of an oligonucleotide–encoded synthetic peptide library," *Proc. Natl. Acad. Sci. USA*, 90:10700–10704 (1993).

Ohlmeyer, et al., "Complex synthetic chemical libraries indexed with molecular tags," *Proc. Natl. Acad. Sci. USA*, 90:10922–10926 (1993).

Pollack, "Selective Chemical Catalysis by an Antibody," *Science*, 234:1570–1573 (1986).

Scott, et al., "Searching for Peptide Ligands with an Epotope Library," *Science*, 249:386–390 (1990).

Sleight, "Chemistry of High–Temperature Superconductors," *Science*, 242:1519–1527 (1988).

Tramontano, et al., "Catalytic Antibodies," *Science*, 234:1566–1570 (1986).

Tuerk, et al., "Systematic Evolution of Ligands by Exponential Enrichment: RNA Ligands to Bacteriophage T4 DNA Polymerase," *Science*, 249:505–510 (1990).

Geysen, et al., "Strategies for Epitope Analysis Using Peptide Synthesis," *Journal of Immunological Methods*, 102:259–274 (1987).

Hor, et al., Superconductivity at 93 K in a New Mixed–Phase Y–Ba–Cu–O–Compound System, *Physical Review Letters*, 58(9):908–910 (1987).

Hor, et al., "High–Pressure Study of the New Y–Ba–Cu–O–Superconducting Compound System," *Physical Review Letters*, 58(9):911–912 (1987).

Bednorz, et al., "Possible High Tc Superconductivity in the Ba–La–Cu–O System," *Zeitschrift fur Physik B*, Condensed Matter 64, pp. 189–193 (1986).

Hanak, "The 'Multiple–Sample Concept' in Materials Research: Synthesis, Compositional Analysis and Testing of Entire Multicomponent Systems," *Journal of Materials Science*, 5:964–971 (1970).

Hanak, "A Step Toward Automation of Materials Research," *RCA Technical Report* (Apr. 3, 1969).

Berlincourt, "Proposed Search for High–Temperature Superconductors," Research proposal (Aug. 28, 1973).

Hanak, et al., "The Effect of Grain Size of the Superconducting Transition Temperature of the Transition Metals," *Physics Letters*, 30A(3):201–202 (1969).

Hanak, et al., "Radio–Frequency Sputtered Films of β–Tungsten Structure Compounds," *J. Appl. Phys.*, 41(12):4958–4962 (1970).

Hanak, "Electroluminescence in $ZnS:Mn_x$: $Cu_y$ rf–Sputtered Films," *Japan J. Appl. Phys., Suppl. 2, Pt. 1*, pp. 809–812 (1974).

Hanak, et al., "Calculation of composition of dilute cosputtered multicomponent films," *J. Appl. Phys.*, 44(11):5142–5147 (1973).

Hanak, "Compositional Determination of rf Co–Sputtered Multicomponent Systems," *J. Vac. Sci. and Tech.*, 8(1):172–175 (1971).

DaSilva, et al., "Variable Thin Film Thickness Apparatus," *IBM Technical Disclosure Bulletin*, 22(7):2922 (1979).

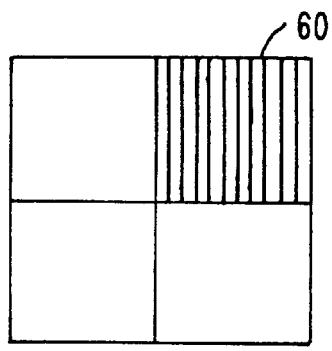
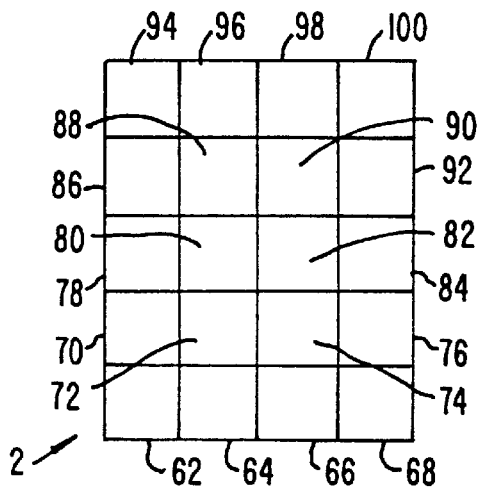
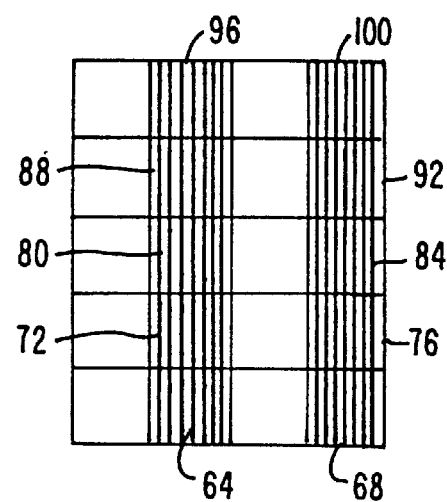
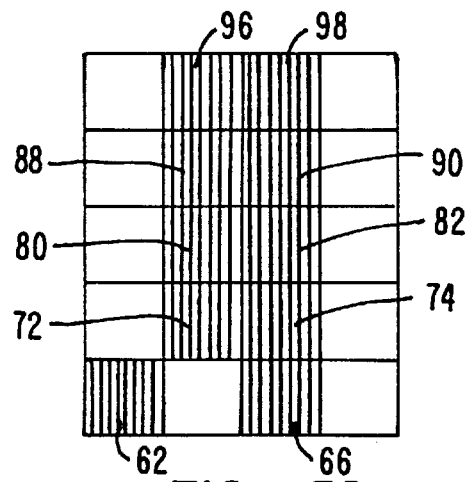
FIG. 4G.   FIG. 4H.   FIG. 4I.
FIG. 5A.   FIG. 5B.
FIG. 5C.   FIG. 5D.

| | | | |
|---|---|---|---|
| CuSr Ca | CuCa | CuPb SrCa | CuPb Ca |
| CuSr | Cu | CuPb Sr | CuPb |
| BiCu SrCa | BiCu Ca | BiPbCu SrCa | BiPb CuCa |
| BiCu Sr | BiCu | BiPb CuSr | BiPb Cu |

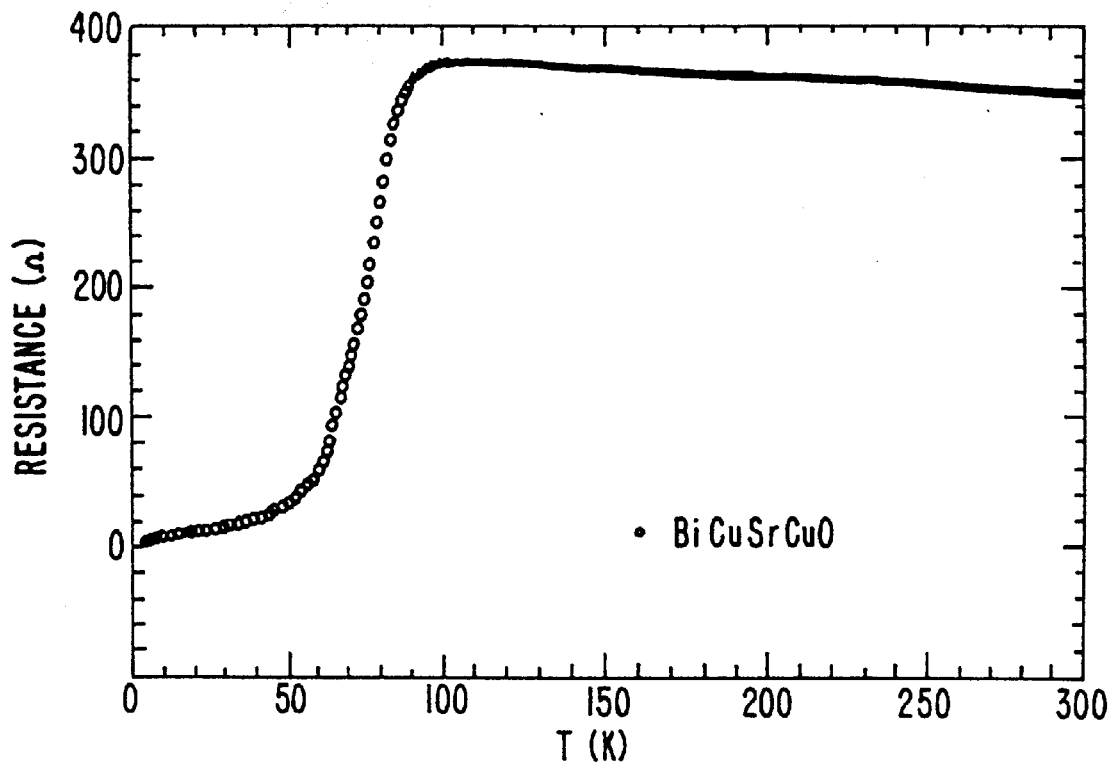
FIG. IIA.
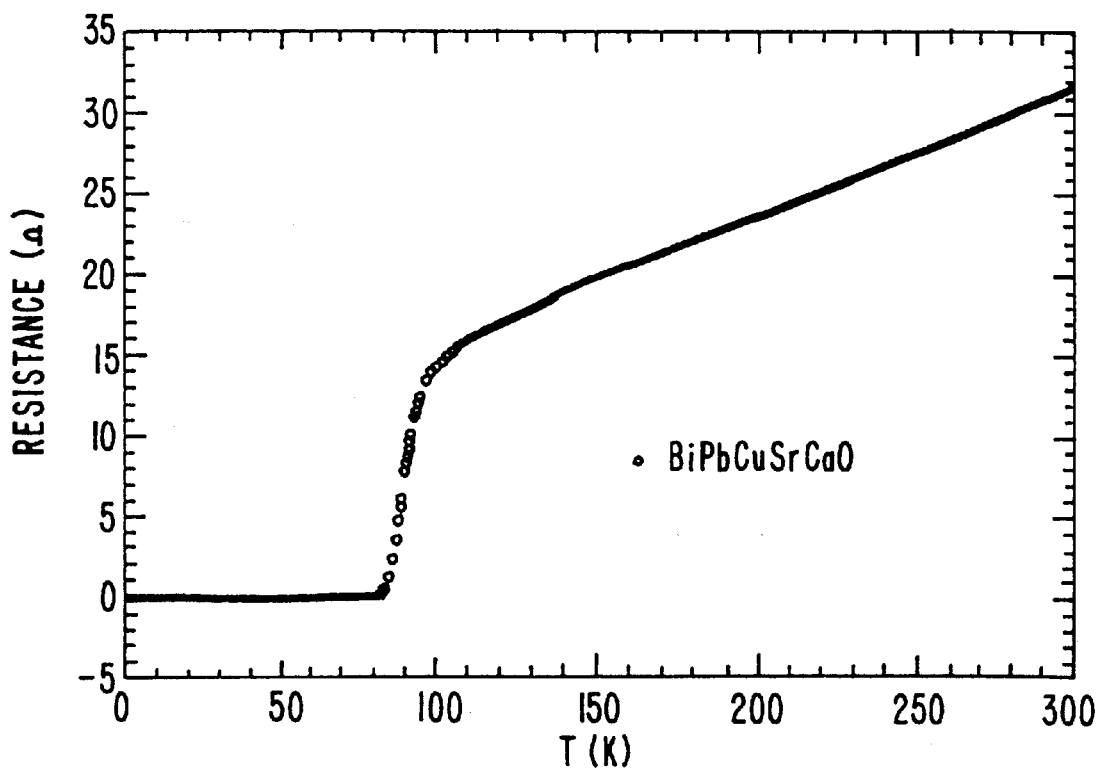
FIG. IIB.

Bi₂O₃ 1000Å
1

CuO 716Å
2

La₂O₃ 956Å
3

Y₂O₃ 432Å
4

BaCO₃ 1702Å
5

SrCO₃ 1524Å
6

CuO 635Å
7

Y₂O₃ 245Å
1

La₂O₃ 350Å
2

Co 145Å
3

BaCO₃ 600Å
4

SrCO₃ 538Å
5

CaO 245Å
6

PbO 316Å
7

Co 128Å
8

Co 55Å
9

La₂O₃ 245Å
10

La₂O₃ 245Å
11

Y₂O₃ 122Å
12

Y₂O₃ 245Å

|  | La | | | | Y | | | |
|---|---|---|---|---|---|---|---|---|
| Ba | 1.38 / 0.62 | 1.14 / 0.62 • | 0.89 / 0.62 | 0.64 / 0.62 | 0.5 / 0.62 | 1.0 / 0.62 | 0.74 / 0.62 | 1.24 / 0.62 |
|  | 1.0 / 0.45 • | 0.83 / 0.45 • | 0.65 / 0.45 • | 0.47 / 0.45 | 0.36 / 0.45 | 0.72 / 0.45 | 0.54 / 0.45 | 0.9 / 0.45 |
|  | 0.73 / 0.33 • | 0.6 / 0.33 • | 0.47 / 0.33 • | 0.34 / 0.33 | 0.26 / 0.33 | 0.52 / 0.33 | 0.4 / 0.33 | 0.66 / 0.33 |
|  | 0.61 / 0.27 • | 0.5 / 0.27 • | 0.39 / 0.27 • | 0.28 / 0.27 • | 0.22 / 0.27 | 0.45 / 0.27 | 0.33 / 0.27 | 0.55 / 0.27 |
| Sr | 1.38 / 0.62 | 1.14 / 0.62 • | 0.89 / 0.62 • | 0.64 / 0.62 • | 0.5 / 0.62 | 1.0 / 0.62 | 0.74 / 0.62 | 1.24 / 0.62 |
|  | 1.0 / 0.45 | 0.83 / 0.45 • | 0.65 / 0.45 • | 0.47 / 0.45 • | 0.36 / 0.45 | 0.72 / 0.45 | 0.54 / 0.45 | 0.9 / 0.45 |
|  | 0.73 / 0.33 | 0.6 / 0.33 • | 0.47 / 0.33 • | 0.34 / 0.33 • | 0.26 / 0.33 | 0.52 / 0.33 | 0.4 / 0.33 | 0.66 / 0.33 |
|  | 0.61 / 0.27 | 0.5 / 0.27 • | 0.39 / 0.27 • | 0.28 / 0.27 • | 0.22 / 0.27 | 0.45 / 0.27 | 0.33 / 0.27 | 0.55 / 0.27 |
| Ca | 1.38 / 0.62 | 1.14 / 0.62 | 0.89 / 0.62 • | 0.64 / 0.62 • | 0.5 / 0.62 | 1.0 / 0.62 | 0.74 / 0.62 | 1.24 / 0.62 |
|  | 1.0 / 0.45 | 0.83 / 0.45 | 0.65 / 0.45 | 0.47 / 0.45 • | 0.36 / 0.45 | 0.72 / 0.45 | 0.54 / 0.45 | 0.9 / 0.45 |
|  | 0.73 / 0.33 | 0.6 / 0.33 | 0.47 / 0.33 | 0.34 / 0.33 | 0.26 / 0.33 | 0.52 / 0.33 | 0.4 / 0.33 | 0.66 / 0.33 |
|  | 0.61 / 0.27 | 0.5 / 0.27 | 0.39 / 0.27 | 0.28 / 0.27 | 0.22 / 0.27 | 0.45 / 0.27 | 0.33 / 0.27 | 0.55 / 0.27 |
| Pb | 1.38 / 0.62 | 1.14 / 0.62 | 0.89 / 0.62 | 0.64 / 0.62 | 0.5 / 0.62 | 1.0 / 0.62 | 0.74 / 0.62 | 1.24 / 0.62 |
|  | 1.0 / 0.45 | 0.83 / 0.45 | 0.65 / 0.45 | 0.47 / 0.45 | 0.36 / 0.45 | 0.72 / 0.45 | 0.54 / 0.45 | 0.9 / 0.45 |
|  | 0.73 / 0.33 | 0.6 / 0.33 | 0.47 / 0.33 | 0.34 / 0.33 | 0.26 / 0.33 | 0.52 / 0.33 | 0.4 / 0.33 | 0.66 / 0.33 |
|  | 0.61 / 0.27 | 0.5 / 0.27 | 0.39 / 0.27 | 0.28 / 0.27 | 0.22 / 0.27 | 0.45 / 0.27 | 0.33 / 0.27 | 0.55 / 0.27 |

FIG. 18.

COMBINATORIAL SYNTHESIS OF NOVEL MATERIALS

This application is a divisional of application Ser. No. 08/438,043 filed May 8, 1995, now U.S. Pat. No. 5,776,359, which was a continuation-in-part of Ser. No. 08/327,513, filed Oct. 18, 1994, now allowed.

STATEMENT OF GOVERNMENT INTEREST

This invention was made with Government support pursuant to Contract No. DE-AC03-76SF00098 awarded by the Department of Energy. The Government has certain rights in this invention.

FIELD OF THE INVENTION

The present invention generally relates to methods and apparatus for the parallel deposition, synthesis and screening of an array of diverse materials at known locations on a single substrate surface. The invention can be applied, for example, to prepare covalent network solids, ionic solids and molecular solids. More specifically, the invention can be applied to prepare inorganic materials, intermetallic materials, metal alloys, ceramic materials, organic materials, organometallic materials, non-biological organic polymers, composite materials (e.g., inorganic composites, organic composites, or combinations thereof), etc. Once prepared, these materials can be screened in parallel for useful properties including, for example, electrical, thermal, mechanical, morphological, optical, magnetic, chemical, and other properties.

BACKGROUND OF THE INVENTION

The discovery of new materials with novel chemical and physical properties often leads to the development of new and useful technologies. Currently, there is a tremendous amount of activity in the discovery and optimization of materials, such as superconductors, zeolites, magnetic materials, phosphors, nonlinear optical materials, thermoelectric materials and high and low dielectric materials. Unfortunately, even though the chemistry of extended solids has been extensively explored, few general principles have emerged that allow one to predict with certainty the composition, structure and reaction pathways for the synthesis of such solid state compounds. Moreover, it is difficult to predict a priori the physical properties a particular three dimensional structure will possess. Consider, for example, the synthesis of the $YBa_2Cu_3O_{7-\delta}$ superconductor in 1987. Soon after the discovery of the $La_{2-x}Sr_xCuO_4$ superconductor, which adopts the $K_2NiF_4$ structure (Bodnorz, J. G. and K. A. Müller, Z. Phy. B 64:189 (1986), it was observed that the application of pressure increased the transition temperature (Chu, et al., Phys. Rev. Lett. 58:405 (1987)). As such, Chu, et al. attempted to synthesize a Y—Ba—Cu—O compound of the same stoichiometry in the hope that substitution of the smaller element, i.e., yttrium, for lanthanum would have the same effect. Although they found superconductivity above 93K, no phase with $K_{NiF_4}$ structure was observed (Wu, et al., Phys. Rev. Lett. 58:908 (1987)). Even for the relatively simple intermetallic compounds, such as the binary compounds of nickel and zirconium ($Ni_5Zr$, $Ni_7Zr_2$, $Ni_3Zr$, $Ni_2Zr_8$, $Ni_{10}Zr_7$, $Ni_{11}Zr_9$, NiZr and $NiZr_2$), it is not yet understood why only certain stoichiometries occur.

Clearly, the preparation of new materials with novel chemical and physical properties is at best happenstance with our current level of understanding. Consequently, the discovery of new materials depends largely on the ability to synthesize and analyze new compounds. Given approximately 100 elements in the periodic table which can be used to make compositions consisting of three, four, five, six or more elements, the universe of possible new compounds remains largely unexplored. As such, there exists a need in the art for a more efficient, economical and systematic approach for the synthesis of novel materials and for the screening of such materials for useful properties.

One of the processes whereby nature produces molecules having novel functions involves the generation of large collections (libraries) of molecules and the systematic screening of those collections for molecules having a desired property. An example of such a process is the humoral immune system which in a matter of weeks sorts through some $10^{12}$ antibody molecules to find one which specifically binds a foreign pathogen (Nisonoff, et al., The Antibody Molecule (Academic Press, New York, 1975)). This notion of generating and screening large libraries of molecules has recently been applied to the drug discovery process. The discovery of new drugs can be likened to the process of finding a key which fits a lock of unknown structure. One solution to the problem is to simply produce and test a large number of different keys in the hope that one will fit the lock.

Using this logic, methods have been developed for the synthesis and screening of large libraries (up to $10^{14}$ molecules) of peptides, oligonucleotides and other small molecules. Geysen, et al., for example, have developed a method wherein peptide syntheses are carried out in parallel on several rods or pins (see., J. Immun. Meth. 102:259–274 (1987), incorporated herein by reference for all purposes). Generally, the Geysen, et al. method involves functionalizing the termini of polymeric rods and sequentially immersing the termini in solutions of individual amino acids. In addition to the Geysen, et al. method, techniques have recently been introduced for synthesizing large arrays of different peptides and other polymers on solid surfaces. Pirrung, et al., have developed a technique for generating arrays of peptides and other molecules using, for example, light-directed, spatially-addressable synthesis techniques (see, U.S. Pat. No. 5,143,854 and PCT Publication No. WO 90/15070, incorporated herein by reference for all purposes). In addition, Fodor, et al. have developed, among other things, a method of gathering fluorescence intensity data, various photosensitive protecting groups, masking techniques, and automated techniques for performing light-directed, spatially-addresable synthesis techniques (see, Fodor, et al., PCT Publication No. WO 92/10092, the teachings of which are incorporated herein by reference for all purposes).

Using these various methods, arrays containing thousands or millions of different elements can be formed (see, U.S. patent application Ser. No. 805,727, filed Dec. 6, 1991, which issued as U.S. Pat. No. 5,424,186 on Jun. 13, 1995, the teachings of which are incorporated herein by reference for all purposes). As a result of their relationship to semiconductor fabrication techniques, these methods have come to be referred to as "Very Large Scale Immobilized Polymer Synthesis," or "VLSIPS™" technology. Such techniques have met with substantial success in, for example, screening various ligands such as peptide and oligonucleotides to determine their relative binding affinity to a receptor such as an antibody.

The solid phase synthesis techniques currently being used to prepare such libraries involve the stepwise, i.e., sequential, coupling of building blocks to form the compounds of interest. In the Pirrung, et al. method, for example, polypeptide arrays are synthesized on a substrate by attaching photoremovable groups to the surface of the substrate, exposing selected regions of the substrate to light to activate those regions, attaching an amino acid monomer with a photoremovable group to the activated region, and repeating the steps of activation and attachment until polypeptides of the desired length and sequences are synthesized. These solid phase synthesis techniques, which involve the sequential coupling of building blocks (e.g., amino acids) to form the compounds of interest, cannot readily be used to prepare many inorganic and organic compounds.

From the above, it is seen that a method and apparatus for synthesizing and screening libraries of materials, such as inorganic materials, at known locations on a substrate are desired.

SUMMARY OF THE INVENTION

The present invention provides methods and apparatus for the preparation and use of a substrate having an array of diverse materials in predefined regions thereon. A substrate having an array of diverse materials thereon is prepared by delivering components of materials to predefined regions on the substrate, and simultaneously reacting the components to form at least two materials. Materials which can be prepared using the methods and apparatus of the present invention include, for example, covalent network solids, ionic solids and molecular solids. More particularly, materials which can be prepared include inorganic materials, intermetallic material, metal alloys, ceramic materials, organic materials, organometallic materials, non-biological organic polymers, composite materials (e.g., inorganic composites, organic composites, or combinations thereof), etc. Once prepared, these materials can be screened in parallel for useful properties including, for example, electrical, thermal, mechanical, morphological, optical, magnetic, chemical and other properties. As such, the present invention provides methods and apparatus for the parallel synthesis and analysis of novel materials having new and useful properties. Any material found to possess a useful property can be subsequently prepared on a large-scale.

In one embodiment of the present invention, a first component of a first material is delivered to a first region on a substrate, and a first component of a second material is delivered to a second region on the same substrate. Thereafter, a second component of the first material is delivered to the first region on the substrate, and a second component of the second material is delivered to the second region on the substrate. The process is optionally repeated, with additional components, to form a vast array of components at predefined, i.e., known, locations on the substrate. Thereafter, the components are simultaneously reacted to form at least two materials. The components can be sequentially or simultaneously delivered to predefined regions on the substrate in any stoichiometry, including a gradient of stoichiometries, using any of a number of different delivery techniques.

In another embodiment of the present invention, a method is provided for forming at least two different arrays of materials by delivering substantially the same reaction components at substantially identical concentrations to reaction regions on both first and second substrates and, thereafter, subjecting the components on the first substrate to a first set of reaction conditions and the components on the second substrate to a second set of reaction conditions. Using this method, the effects of the various reaction parameters can be studied on many materials simultaneously and, in turn, such reaction parameters can be optimized. Reaction parameters which can be varied include, for example, reactant amounts, reactant solvents, reaction temperatures, reaction times, the pressures at which the reactions are carried out, the atmospheres in which the reactions are conducted, the rates at which the reactions are quenched, the order in which the reactants are deposited, etc.

In the delivery systems of the present invention, a small, precisely metered amount of each reactant component is delivered into each reaction region. This may be accomplished using a variety of delivery techniques, either alone or in combination with a variety of masking techniques. For example, thin-film deposition techniques in combination with physical masking or photolithographic techniques can be used to deliver various reactants to selected regions on the substrate. Reactants can be delivered as amorphous films, epitaxial films, or lattice and superlattice structures. Moreover, using such techniques, reactants can be delivered to each site in a uniform distribution, or in a gradient of stoichiometries. Alternatively, the various reactant components can be deposited into the reaction regions of interest from a dispenser in the form of droplets or powder. Suitable dispensers include, for example, micropipettes, mechanisms adapted from ink-jet printing technology and electrophoretic pumps.

Once the components of interest have been delivered to predefined regions on the substrate, they can be reacted using a number of different synthetic routes to form an array of materials. The components can be reacted using, for example, solution based synthesis techniques, photochemical techniques, polymerization techniques, template directed synthesis techniques, epitaxial growth techniques, by the sol-gel process, by thermal, infrared or microwave heating, by calcination, sintering or annealing, by hydrothermal methods, by flux methods, by crystallization through vaporization of solvent, etc. Thereafter, the array can be screened for materials having useful properties.

In another embodiment of the present invention, an array of inorganic materials on a single substrate at predefined regions thereon is provided. Such an array can consists of more than 10, $10^2$, $10^3$, $10^4$, $10^5$ or $10^6$ different inorganic compounds. In some embodiments, the density of regions per unit area will be greater than 0.04 regions/cm$^2$, more preferably greater than 0.1 regions/cm$^2$, even more preferably greater than 1 region/cm$^2$, even more preferably greater than 10 regions/cm$^2$, and still more preferably greater than 100 regions/cm$^2$. In most preferred embodiments, the density of regions per unit area will be greater than 1,000 regions/cm$^2$, more preferably 10,000 regions/cm$^2$, even more preferably greater than 100,000 regions/cm$^2$, and still more preferably 10,000,000 regions/cm$^2$.

In yet another aspect, the present invention provides a material having a useful property prepared by: forming an array of materials on a single substrate; screening the array for a material having a useful property; and making additional amounts of the material having the useful property. As such, the present invention provides methods and apparatus for the parallel synthesis analysis of novel materials having new and useful properties.

Using the foregoing method, a new family of giant magnetorestive (GMR) cobalt oxides has been discovered. Arrays of materials containing different compositions and stoichiometries of $La_{1-x}M_xCoO_z$, wherein Ln is, for example, Y and La, M is, for example, Pb, Ca, Sr and Ba, x has a value ranging from about 0.1 to about 0.9 and z has a value ranging from about 2 to about 4, were formed using thin film deposition techniques in combination with masking techniques. Once formed, the arrays of materials were screened for those materials among them having useful properties. More particularly, the arrays of materials were screened for specific materials having giant magnetoresistive (GMR) properties, among others. In doing so, large magnetoresistance (MR) was found in $La_{1-x}$-$(Ba, Sr, Ca)_x$-$CoO_z$ samples, wherein x has a value ranging from about 0.1 to about 0.9, and z has a value ranging from about 2 to about 4. Once the materials having useful properties were identified, additional amounts of such materials were prepared.

In doing so, it has been determined that the compounds in this new family of GMR cobalt oxides have the following general formula $A_{y-(1-x)}M_{y-x}CoO_z$, wherein A is a metal selected from the group consisting of lanthanum (La), yttrium (Y), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yp) and lutecium (Lu); M is a metal selected from the group consisting of calcium (Ca), strontium (Sr), barium (Ba), lead (Pb), thallium (Tl) and bismuth (Bi); y has a value ranging from about 1 to about 2; x has a value ranging from about 0.1 to about 0.9; and z has a value ranging from about 2 to about 4. Moreover, it has been determined that the compounds in this new family of GMR cobalt oxides generally have a layered, perovskite-related structure.

A further understanding of the nature and advantages of the inventions herein may be realized by reference to the remaining portions of the specification and the attached drawings.

BRIEF DESCRIPTION OF THE DRAWINGS

FIGS. 4A–4I illustrate the use of physical masking techniques to generate an array of reactants on a single substrate;

FIGS. 5A–5M illustrate the use of physical masking techniques to generate an array of reactants on a single substrate;

FIG. 11A–11B illustrate resistance of the two conducting materials as a function of temperature;

FIG. 18 illustrates a map of compositions and stoichiometries ($Ln_xM_yCoO_{3-\delta}$, where Ln=La and Y, and M=Ba, Sr, Ca and Pb) of thin film samples in libraries L2 and L3. Samples are labeled by index (row number, column number) in the text and figure legend. The first number in each box indicates x and the second y. Black, solid circles indicate the samples that show significant MR effect (>5%);

DETAILED DESCRIPTION OF THE INVENTION AND PREFERRED EMBODIMENTS

CONTENTS

Figure 1:
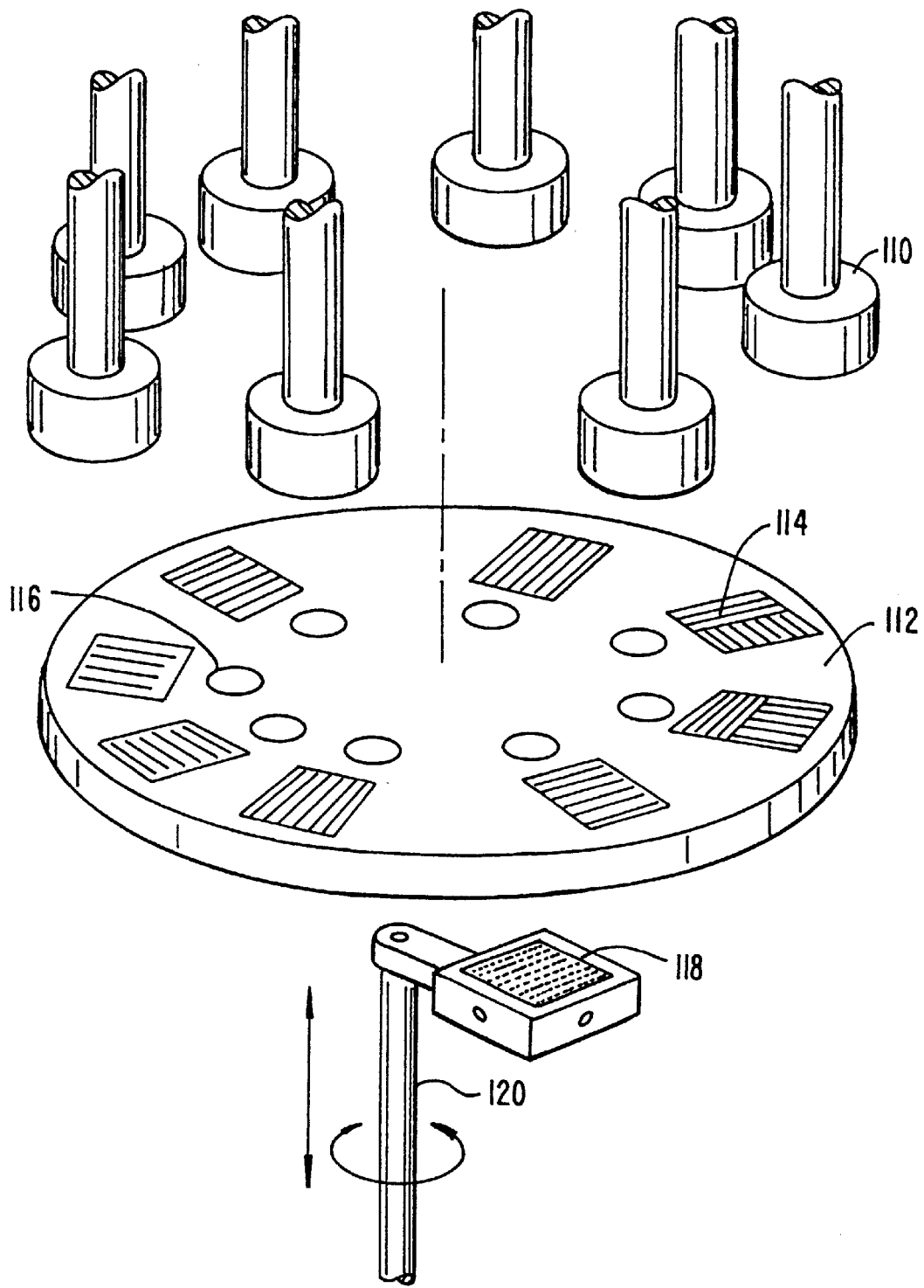
FIG. 1 illustrates an example of a reaction system employing an eight RF magnetron sputtering gun.

I. Glossary
II. General Overview
III. Isolation of Reaction Regions on The Substrate
IV. Methods For Delivery Of Reactant Components
  A. Delivery Using Thin-Film Deposition Techniques
  B. Delivery Using A Dispenser
V. Moving The Dispenser With Respect To The Substrate
VI. Synthetic Routes For Reacting The Array Of Components
VII. Methods For Screening An Array Of Materials
VIII. Alternative Embodiments
IX. Examples
  A. Synthesis of An Array of 16 Copper Oxide Thin-Film Materials
  B. Synthesis of An Array of 128 Copper Oxide Thin-Film Materials
  C. Synthesis of An Array of 128 Copper Oxide Thin-Film Materials Containing BiSrCaCuO and YBaCuO Superconducting Materials
  D. Synthesis of Arrays of Cobalt Oxide Thin-film Materials
  E. Synthesis of An Array of 16 Different Organic Polymers F. Synthesis of An Array of Different Zeolites
G. Synthesis of An Array of Copper Oxide Compounds Using Spraying Deposition Techniques
H. Synthesis of An Array of 16 Different Zinc Silicate Phosphors
I. Synthesis of An Array of Copper Oxide Thin-Film Materials Using Sputtering Techniques In Combination With Photolithography Masking Techniques
X. Conclusion I. Glossary The following terms are intended to have the following general meanings as they are used herein.

1. Substrate: A material having a rigid or semi-rigid surface. In many embodiments, at least one surface of the substrate will be substantially flat, although in some embodiments it may be desirable to physically separate synthesis regions for different materials with, for example, dimples, wells, raised regions, etched trenches, or the like. In some embodiments, the substrate itself contains wells, raised regions, etched trenches, etc. which form all or part of the synthesis regions. According to other embodiments, small beads or pellets may be provided on the surface within dimples or on other regions of the surface or, alternatively, the small beads or pellets may themselves be the substrate.

2. Predefined Region: A predefined region is a localized area on a substrate which is, was, or is intended to be used for formation of a selected material and is otherwise referred to herein in the alternative as "known" region, "reaction" region, a "selected" region, or simply a "region." The predefined region may have any convenient shape, e.g., linear, circular, rectangular, elliptical, wedge-shaped, etc. Additionally, the predefined region, i.e., the reaction site, can be a bead or pellet which is coated with a reactant component(s) of interest. In this embodiment, the bead or pellet can be identified with a tag, such as an etched binary bar code that can be used to indicate the history of the bead or pellet, i.e., to identify which components were deposited thereon. In some embodiments, a predefined region and, therefore, the area upon which each distinct material is synthesized is smaller than about 25 cm$^2$, preferably less than 10 cm$^2$, more preferably less than 5 cm$^2$, even more preferably less than 1 cm$^2$, still more preferably less than 1 mm$^2$, and even more preferably less than 0.5 mm$^2$. In most preferred embodiments, the regions have an area less than about 10,000 $\mu$m$^2$, preferably less than 1,000 $\mu$m$^2$, more preferably less than 100 $\mu$m$^2$, and even more preferably less than 10 $\mu$m$^2$.

3. Radiation: Energy which may be selectively applied including energy having a wavelength between $10^{-14}$ and $10^4$ meters including, for example, electron beam radiation, gamma radiation, x-ray radiation, ultraviolet radiation, visible light, infrared radiation, microwave radiation and radio waves. "Irradiation" refers to the application of radiation to a surface.

4. Component: "Component" is used herein to refer to each of the individual chemical substances that act upon one another to produce a particular material and is otherwise referred to herein in the alternative as "reactant" or "reactant component." That is to say, the components or, alternatively, reactants are the molecules that act upon one another to produce a new molecule(s), i.e., product(s); for example, in the reaction HCl+NaOH→NaCl+H$_2$O, the HCl and the NaOH are the components or reactants.

5. Material: The term "material" is used herein to refer to solid-state compounds, extended solids, extended solutions, clusters of molecules or atoms, crystals, etc.

6. Covalent Network Solids: Solids that consist of atoms held together in a large network of chains by covalent bonds. Such covalent network solids include, but are not limited to, diamond, silicon nitride, graphite, bunkmisterfullerene and organic polymers which cannot be synthesized in a stepwise fashion.

7. Ionic Solids: Solids which can be modeled as cations and anions held together by electrical attraction of opposite charge. Such ionic solids include, but are not restricted to, CaF$_2$, CdCl$_2$, ZnCl$_2$, NaCl$_2$, AgF, AgCl, AgBr and spinels (e.g., ZnAl$_2$O$_4$, MgAl$_2$O$_4$, FrCr$_2$O$_4$, etc.).

8. Molecular Solids: Solids consisting of atoms or molecules held together by intermolecular forces. Molecular solids include, but are not limited to, extended solids, solid neon, organic compounds, synthetic or organic metals (e.g., tetrathiafulvalene-tetracyanoquinonedimethane (TTF-TCNQ)), liquid crystals (e.g., cyclic siloxanes) and protein crystals.

9. Inorganic Materials: Materials which do not contain carbon as a principal element. The oxides and sulphides of carbon and the metallic carbides are considered inorganic materials. Examples of inorganic compounds which can be synthesized using the methods of the present invention include, but are not restricted to, the following:

(a) Intermetallics (or Intermediate Constituents): Intermetallic compounds constitute a unique class of metallic materials that form long-range ordered crystal structures below a critical temperature. Such materials form when atoms of two metals combine in certain proportions to form crystals with a different structure from that of either of the two metals (e.g., NiAl, CrBe$_2$, CuZn, etc.).

(b) Metal Alloys: A substance having metallic properties and which is composed of a mixture of two or more chemical elements of which at least one is a metal.

(c) Magnetic Alloys: An alloy exhibiting ferromagnetism such as silicon iron, but also iron-nickel alloys, which may contain small amounts of any of a number of other elements (e.g., copper, aluminum, chromium, molybdenum, vanadium, etc.), and iron-cobalt alloys.

(d) Ceramics: Typically, a ceramic is a metal oxide, boride, carbide, nitride, or a mixture of such materials. Ceramics are inorganic, nonmetallic, nonmolecular solids, including both amorphous and crystalline materials. Ceramics are illustrative of materials that can be formed and screened for a particular property using the present invention. Such materials include, for example, alumina, zirconium, silicon carbide, aluminum nitride, silicon nitride, the YBa$_2$Cu$_3$O$_{7-\delta}$ superconductor, the La$_{2-x}$Sr$_x$CuO$_4$ superconductors, the Bi$_2$CaSr$_2$Cu$_2$O$_{8+x}$ superconductors, the Ba$_{1-x}$K$_x$BiO$_3$ superconductors, the ReBaCu superconductors, ferrite (BaFe$_{12}$O$_{19}$), Zeolite A (Na$_{12}$[(SiO$_2$)$_{12}$(AlO$_2$)]•27H$_2$O), soft and permanent magnets, high dielectric constant materials (BaTiO$_3$), piezoelectric materials (e.g., lead zirconate titanate (PZT), NaNbO$_3$, and NaTaO$_3$), electro-optic materials (e.g., lithium niobate (LiNbO$_3$)), giant magnetoresistant materials (GMR), etc. A "giant magnetoresistant" material, as used herein, refers to a material having a change in resistance when exposed to a magnetic field that is greater than 5 percent relative to the resistance it had when no field was applied. That is to say, the absolute value of the percentage change in resistance is greater than 5 percent, i.e., $|\Delta R/R|>5\%$. The change in resistance is determined by:

$$\frac{\Delta R}{R} = \frac{\text{[Resistance When A Field Is Applied]} - \text{[Resistance When No Field Is Applied]}}{\text{[Resistance When No Field Is Applied]}}$$

10. Organic Materials: Compounds, which generally consist of carbon and hydrogen, with or without oxygen, nitrogen or other elements, except those in which carbon does not play a critical role (e.g., carbonate salts). Examples of organic materials which can be synthesized using the methods of the present invention include, but are not restricted to, the following: (a) Non-biological, organic polymers: Nonmetallic materials consisting of large macromolecules composed of many repeating units. Such materials can be either natural or synthetic, cross-linked or non-crosslinked, and they may be homopolymers, copolymers, or higher-ordered polymers (e.g., terpolymers, etc.). By "non-biological," α-amino acids and nucleotides are excluded. More particularly, "non-biological, organic polymers" exclude those polymers which are synthesized by a linear, stepwise coupling of building blocks. Examples of polymers which can be prepared using the methods of the present invention include, but are not limited to, the following: polyurethanes, polyesters, polycarbonates, polyethyleneimines, polyacetates, polystyrenes, polyamides, polyanilines, polyacetylenes, polypyrroles, etc.

11. Organometallic Materials: A class of compounds of the type R-M, wherein carbon atoms are linked directly with metal atoms (e.g., lead tetraethyl ($Pb(C_2H_5)_4$), sodium phenyl ($C_6H_5 \bullet Na$), zinc dimethyl ($Zn(CH_3)_2$), etc.).

12. Composite Materials: Any combination of two materials differing in form or composition on a macroscale. The constituents of composite materials retain their identities, i.e., they do not dissolve or merge completely into one another although they act in concert. Such composite materials may be inorganic, organic or a combination thereof. Included with this definition are, for example, doped materials, dispersed metal catalysts and other heterogeneous solids.

II. General Overview

The present invention provides methods and apparatus for the preparation and use of a substrate having an array of materials in predefined regions thereon. The invention is described herein primarily with regard to the preparation of inorganic materials, but can readily be applied in the preparation of other materials. Materials which can be prepared in accordance with the methods of the present invention include, for example, covalent network solids, ionic solids and molecular solids. More particularly, materials which can be prepared in accordance with the methods of the present invention include, but are not limited to, inorganic materials, intermetallic materials, metal alloys, ceramic materials, organic materials, organometallic materials, non-biological organic polymers, composite materials (e.g., inorganic composites, organic composites, or combinations thereof), or other materials which will be apparent to those of skill in the art upon review of this disclosure.

The resulting substrate having an array of materials thereon will have a variety of uses. For example, once prepared, the substrate can be screened for materials having useful properties. Accordingly, the array of materials is preferably synthesized on a single substrate. By synthesizing the array of materials on a single substrate, screening the array for materials having useful properties is more easily carried out. Properties which can be screened for include, for example, electrical, thermal, mechanical, morphological, optical, magnetic, chemical, etc. More particularly, properties which can be screened for include, for example, conductivity, superconductivity, resistivity, thermal conductivity, anisotropy, hardness, crystallinity, optical transparency, magnetoresistance, permeability, frequency doubling, photoemission, coercivity, dielectric strength, or other useful properties which will be apparent to those of skill in the art upon review of this disclosure. Importantly, the synthesizing and screening of a diverse array of materials enables new compositions with new physical properties to be identified. Any material found to possess a useful property can be subsequently prepared on a large-scale. It will be apparent to those of skill in the art that once useful materials have been identified using the methods of the present invention, a variety of different methods can be used to prepare such useful materials on a large or bulk scale with essentially the same structure and properties.

Generally, the array of materials is prepared by successively delivering components of materials to predefined regions on a substrate, and simultaneously reacting the components to form at least two materials. In one embodiment, for example, a first component of a first material is delivered to a first preferred region on a substrate, and a first component of a second material is delivered to a second preferred region on the same substrate. Thereafter, a second component of the first material is delivered to the first region on the substrate, and a second component of the second material is delivered to the second region on the substrate. Each component can be delivered in either a uniform or gradient fashion to produce either a single stoichiometry or, alternatively, a large number of stoichiometries within a single predefined region. Moreover, reactants can be delivered as amorphous films, epitaxial films, or lattice or superlattice structures. The process is repeated, with additional components, to form a vast array of components at predefined, i.e., known, locations on the substrate. Thereafter, the components are simultaneously repeated to form at least two materials. As explained hereinbelow, the components can be sequentially or simultaneously delivered to predefined regions on the substrate using any of a number of different delivery techniques.

In the methods of the present invention, the components, after being delivered to predefined regions on the substrate, can be reacted using a number of different synthetic routes. For example, the components can be reacted using, for example, solution based synthesis techniques, photochemical techniques, polymerization techniques, template directed synthesis techniques, epitaxial growth techniques, by the sol-gel process, by thermal, infrared or microwave heating, by calcination, sintering or annealing, by hydrothermal methods, by flux methods, by crystallization through vaporization of solvent, etc. Other useful synthesis techniques that can be used to simultaneously react the components of interest will be readily apparent to those of skill in the art.

Since the reactions are conducted in parallel, the number of reaction steps can be minimized. Moreover, the reaction conditions at different reaction regions can be controlled independently. As such, reactant amounts, reactant solvents, reaction temperature, reaction times, the rates at which the reactions are quenched, deposition order of reactants, etc. can be varied from reaction region to reaction region on the substrate. Thus, for example, the first component of the first material and the first component of the second material can be the same or different. If the first component of the first material is the same as the first component of the second materials, this component can be offered to the first and second regions on the substrate in ether the same or different amounts. This is true as well for the second component of the first material and the second component of the second material, etc. As with the first component of the first and second materials, the second component of the first material and the second component of the second material can be the same or different and, if the same, this component can be offered to the first and second regions on the substrate in either the same or different amounts. Moreover, within a given predefined region on the substrate, the component can be delivered in either a uniform or gradient fashion. In addition, if the same components are delivered to the first and second regions on the substrate at identical concentrations, then the reaction conditions (e.g., reaction temperatures, reaction times, etc.) under which the reactions are carried out can be varied from reaction region to reaction region.

Moreover, in one embodiment of the present invention, a method is provided for forming at least two different arrays of materials by delivering substantially the same reactant components at substantially identical concentrations to reaction regions on both first and second substrates and, thereafter, subjecting the components on the first substrate to a first set of reaction conditions and the components on the second substrate to a second set of reaction conditions in a wide array of compositions. Using this method, the effects of the various reaction parameters can be studied and, in turn, optimized. Reaction parameters which can be varied include, for example, reactant amounts, reactant solvents, reaction temperatures, reaction times, the pressures at which the reactions are carried out, the atmospheres in which the reactions are conducted, the rates at which the reactions are quenched, the order in which the reactants are deposited, etc. Other reaction parameters which can be varied will be apparent to those of skill in the art.

The reactant components in the individual reaction regions must often be prevented from moving to adjacent reaction regions. Most simply, this can be ensured by leaving a sufficient amount of space between the reaction regions on the substrate so that the various components cannot inter-diffuse between reaction regions. Moreover, this can be ensured by providing an appropriate barrier between the various reaction regions on the substrate. In one approach, a mechanical device or physical structure defines the various reaction regions on the substrate. A wall or other physical barrier, for example, can be used to prevent the reactant components in the individual reaction regions from moving to adjacent reaction regions. This wall or physical barrier can be removed after the synthesis is carried out. One of skill in the art will appreciate that, at times, it may be beneficial to remove the wall or physical barrier before screening the array of materials.

In another approach, a hydrophobic material, for example, can be used to coat the region surrounding the individual reaction regions. Such materials prevent aqueous (and certain other polar) solutions from moving to adjacent reaction regions on the substrate. Of course, when non-aqueous or nonpolar solvents are employed, different surface coatings will be required. Moreover, by choosing appropriate materials (e.g., substrate material, hydrophobic coatings, reactant solvents, etc.), one can control the contact angle of the droplet with respect to the substrate surface. Large contact angles are desired because the area surrounding the reaction region remains unwetted by the solution within the reaction region.

In the delivery systems of the present invention, a small, precisely metered amount of each reactant component is delivered into each reaction region. This may be accomplished using a variety of delivery techniques, either alone or in combination with a variety of masking techniques. For example, thin-film deposition techniques in combination with physical masking or photolithographic techniques can be used to deliver the various reactant components to selected regions on the substrate. More particularly, sputtering systems, spraying techniques, laser ablation techniques, electron beam or thermal evaporation, ion implantation or doping techniques, chemical vapor deposition (CVD), as well as other techniques used in the fabrication of integrated circuits and epitaxially grown materials can be applied to deposit highly uniform layers of the various reactant components on selected regions on the substrate. Alternatively, by varying the reactive geometries of the mask, target and/or substrate, a gradient of reactant components can be deposited within each predefined regions on the substrate or, alternatively, over all of the predefined regions on the substrate. Such thin-film deposition techniques are generally used in combination with masking techniques to ensure that the reactant components are being delivered only to the reaction regions of interest.

Moreover, in addition to the foregoing, the various reactant components can be deposited on the reaction regions of interest from a dispenser in the form of droplets or powder. Conventional micropipetting apparatuses can, for example, be adapted to dispense droplet volumes of 5 nanoliters or smaller from a capillary. Such droplets can fit within a reaction region having a diameter of 300 $\mu$m or less when a mask is employed. The dispenser can also be of the type employed in conventional ink-jet printers. Such ink-jet dispenser systems include, for example, the pulse pressure type dispenser system, the bubble jet type dispenser system and the slit jet type dispenser system. These ink-et dispenser systems are able to deliver droplet volumes as small as 5 picoliters. Moreover, such dispenser systems can be manual or, alternatively, they can be automated using, for example, robotics techniques.

The dispenser of the present invention can be aligned with respect to the appropriate reaction regions by a variety of conventional systems. Such systems, which are widely used in the microelectronic device fabrication and testing arts, can deliver droplets of reactant components to individual reaction regions at rates of up to 5,000 drops per second. The translational (X-Y) accuracy of such systems is well within 1 $\mu$m. The position of the dispenser stage of such systems can be calibrated with respect to the position of the substrate by a variety of methods known in the art. For example, with only one or two reference points on the substrate surface, a "dead reckoning" method can be provided to locate each reaction region on the substrate. The reference marks in any such systems can be accurately identified by using capacitive, resistive or optical sensors. Alternatively, a "vision" system employing a camera can be employed.

In another embodiment of the present invention, the dispenser can be aligned with respect to the reaction region of interest by a system analogous to that employed in magnetic and optical storage media fields. For example, the reaction region in which the reactant component is to be deposited is identified by its track and sector location on the disk substrate. The dispenser is then moved to the appropriate track while the disk substrate rotates. When the appropriate reaction region is positioned below the dispenser, a droplet of reactant solution is released.

In some embodiments, the reaction regions may be further defined by dimples in the substrate surface. This will be especially advantageous when a head or other sensing device must contact or glide along the substrate surface. The dimples can also act as identification marks directing the dispenser to the reaction region of interest.

III. Isolation of Reaction Regions On A Substrate

In a preferred embodiment, the methods of the present invention are used to prepare an array of diverse materials at known locations on a single substrate surface. Essentially, any conceivable substrate can be employed in the invention. The substrate can be organic, inorganic, biological, nonbiological, or a combination of any of these, existing as particles, strands, precipitates, gels, sheets, tubing, spheres, containers, capillaries, pads, slices, films, plates, slides, etc. The substrate can have any convenient shape, such a disc, square, sphere, circle, etc. The substrate is preferably flat, but may take on a variety of alternative surface configurations. For example, the substrate may contain raised or depressed regions on which the synthesis of diverse materials takes place. The substrate and its surface preferably form a rigid support on which to carry out the reactions described herein. The substrate may be any of a wide variety of materials including, for example, polymers, plastics, pyrex, quartz, resins, silicon, silica or silica-based materials, carbon, metals, inorganic glasses, inorganic crystals, membranes, etc. Other substrate materials will be readily apparent to those of skill in the art upon review of this disclosure. Surfaces on the solid substrate can be composed of the same materials as the substrate or, alternatively, they can be different, i.e., the substrates can be coated with a different material. Moreover, the substrate surface can contain thereon an adsorbent (for example, cellulose) to which the components of interest are delivered. The most appropriate substrate and substrate-surface materials will depend on the class of materials to be synthesized and the selection in any given case will be readily apparent to those of skill in the art.

In some embodiments, a predefined region on the substrate and, therefore, the area upon which each distinct material is synthesized is smaller than about 25 cm$^2$, preferably less than 10 cm$^2$, more preferably less than 5 cm$^2$, even more preferably 1 cm$^2$, still more preferably less than 1 mm$^2$, and still more preferably less than 0.5 mm$^2$. In most preferred embodiments, the regions have an area less than about 10,000 $\mu$m$^2$, preferably less than 1,000 $\mu$m$^2$, more preferably less than 100 $\mu$m$^2$, and even more preferably less than 10 $\mu$m$^2$.

In preferred embodiments, a single substrate has at least 10 different materials and, more preferably, at least 100 different materials synthesized thereon. In even more preferred embodiments, a single substrate has more than 10$^3$, 10$^4$, 10$^5$, 10$^6$, or more materials synthesized thereon. In some embodiments, the delivery process is repeated to provide materials with as few as two components, although the process can be readily adapted to form materials having 3, 4, 5, 6, 7, 8 or more components therein. The density of regions per unit area will be great than 0.04 regions/cm$^2$, more preferably greater than 0.1 regions/cm$^2$, even more preferably greater than 1 region/cm$^2$, even more preferably greater than 10 regions/cm$^2$, and still more preferably greater than 100 regions/cm$^2$. In most preferred embodiments, the density of regions per unit area will be greater than 1,000 regions/cm$^2$, more preferably 10,000 regions/cm$^2$, even more preferably greater than 100,000 regions/cm$^2$, and still more preferably 10,000,000 regions/cm$^2$.

In other embodiments, the substrate can be a series of small beads or pellets hereinafter "beads"). The number of beads used will depend on the number of materials to be synthesized and can range anywhere from 2 to an infinite number of beads. In this embodiment, each of the beads is uniformly coated with the reactant component(s) of interest and, thereafter, reacted. This is readily done, for example, by using a series of vessels each of which contains a solution of a particular reactant component. The beads are equally divided into groups corresponding to the number of components used to generate the array of materials. Each group of beads is then added to one of the vessels wherein a coating of one of the components in solution forms on the surface of each bead. The beads are then pooled together into one group and heated to produce a dry component layer on the surface of each of the beads. The process is repeated several times to generate an array of different reaction components on each of the beads. Once the components of interest have been deposited on the beads, the beads are reacted to form an array of materials. All of the beads may or may not be reacted under the same reaction conditions. To determine the history of the components deposited on a particular bead, mass spectroscopic techniques can be used. Alternatively, each bead can have a tag which indicates the history of components deposited thereon as well as their stoichiometries. The tag can be, for example, a binary tag etched into the surface of the bead so that it can be read using spectroscopic techniques. As with the single substrate having an array of materials thereon, each of the individual beads or pellets can be screened for materials having useful properties.

More particularly, if an array of materials is to be generated based on Bi, Cu, Ca and Sr using a series of beads as the substrate, for example, four vessels containing aqueous solutions of Bi(NO$_3$)$_3$, Cu(NO$_3$)$_3$, Ca(NO$_3$)$_3$ and Sr(NO$_3$)$_3$ would be employed. A portion of the beads are added to the vessel containing the Bi(NO$_3$)$_3$ solution; a portion of the beads are added to the Cu(NO$_3$)$_3$ solution; a portion of the beads are added to the vessel containing the Ca(NO$_3$) solution; and, finally, a portion of the beads are added to the vessel containing the Sr(NO$_3$)$_3$ solution. Once the beads are uniformly coated with the reactant component contained in the vessel, the beads are removed from the vessel, dried, etched, pooled together into one group and, thereafter, subsequently divided and added to the vessels containing the foregoing reactant components of interest. The process is optionally repeated, with additional reactant components, to form a vast array of components on each of the beads. It will be readily apparent to those of skill in the art that a number of variations can be made to this technique to generate a vast array of beads containing a vast array of components thereon. For example, some of the beads can be coated with only two components, others with more than two components. Additionally, some of the beads can be coated two or more times with the same component, whereas other beads are coated a single time with a given component.

As previously explained, the substrate is preferably flat, but may take on a variety of alternative surface configurations. Regardless of the configuration of the substrate surface, it is imperative that the reactant components in the individual reaction regions be prevented from moving to adjacent reaction regions. Most simply, this can be ensured by leaving a sufficient amount of space between the regions on the substrate so that the various components cannot interdiffuse between reaction regions. Moreover, this can be ensured by providing an appropriate barrier between the various reaction regions on the substrate. A mechanical device or physical structure can be used to define the various regions on the substrate. For example, a wall or other physical barrier can be used to prevent the reactant components in the individual reaction regions from moving to adjacent reaction regions. Alternatively, a dimple or other recess can be used to prevent the reactant components in the individual reaction regions from moving to adjacent reaction regions.

If the substrate used in the present invention is to contain dimples or other recesses, the dimples must be sufficiently small to allow close packing on the substrate. Preferably, the dimples will be less than 1 mm in diameter, preferably less than 0.5 mm in diameter, more preferably less than 10,000 $\mu$m in diameter, even more preferably less than 100 $\mu$m in diameter, and still more preferably less than 25 $\mu$m in diameter.

Dimples having these characteristics can be produced by a variety of techniques including laser, pressing, or etching techniques. A suitable dimpled substrate surface can, for example, be provided by pressing the substrate with an imprinted "master" such as those commonly used to prepare compact optical disks. In addition, an isotopic or anisotropic etching technique employing photolithography can be employed. In such techniques, a mask is used to define the reaction regions on the substrate. After the substrate is irradiated through the mask, selected regions of the photoresist are removed to define the arrangement of reaction regions on the substrate. The dimples may be cut into the substrate with standard plasma or wet etching techniques. If the substrate is a glass or silicon material, suitable wet etch materials can include hydrogen fluoride, or other common wet etchants used in the field of semiconductor device fabrication. Suitable plasma etchants commonly used in the semiconductor device fabrication field can also be employed. Such plasma etchants include, for example, mixtures of halogen containing gases and inert gases. Typically, a plasma etch will produce dimples having a depth of less than 10 $\mu$m, although depths of up to 50 $\mu$m may be obtained under some conditions.

Another method for preparing a suitably dimpled surface employs photochemically etchable glass or polymer sheets. For example, a photochemically etchable glass known as "FOTOFORM" is available from Corning Glass Company (New York). Upon exposure to radiation through a mask, the glass becomes soluble in aqueous solutions. Thereafter, the exposed glass is simply washed with the appropriate solution to form the dimpled surface. With this material, well-defined dimples can be made having aspect ratios of 10 to 1 (depth to diameter) or greater, and depths of up to 0.1 inches. Dimple diameters can be made as small as 25 $\mu$m in a 250 $\mu$m thick glass layer. Moreover, the dimpled surface can contain thereon an adsorbent (for example, cellulose) to which the components of interest are delivered.

Even when a dimpled surface is employed, it is often important to ensure that the substrate material is not wetted beyond the reaction region parameters. Most simply, this can be ensured by leaving a sufficient amount of space between the regions on the substrate so that the various components cannot interdiffuse between reaction regions. In addition, other techniques can be applied to control the physical interactions that affect wetting, thereby ensuring that the solutions in the individual reaction regions do not wet the surrounding surface and contaminate other reaction regions. Whether or not a liquid droplet will wet a solid surface is governed by three tensions: the surface tension at the liquid-air interface, the interfacial tension at the solid-liquid interface and the surface tension at the solid-air interface. If the sum of the liquid-air and liquid-solid tensions is greater than the solid-air tension, the liquid drop will form a bead (a phenomenon known as "lensing"). If, on the other hand, the sum of the liquid-air and liquid-solid tensions is less than the solid-air tension, the drop will not be confined to a given location, but will instead spread over the surface. Even if the surface tensions are such that the drop will not spread over the surface, the contact or wetting angle (i.e., the angle between the edge of the drop and the solid substrate) may be sufficiently small such that the drop will cover a relatively large area (possibly extending beyond the confines of a given reaction region). Further, small wetting angles can lead to formation of a thin (approximately 10 to 20 Å) "precursor film" which spreads away from the liquid bead. Larger wetting angles provide "taller" beads that take up less surface area on the substrate and do not form precursor films. Specifically, if the wetting angle is greater than about 90°, a precursor film will not form.

Methods for controlling chemical compositions and, in turn, the local surface free energy of a substrate surface include a variety of techniques apparent to those in the art. Chemical vapor deposition techniques as well as other techniques applied in the fabrication of integrated circuits can be applied to deposit highly uniform layers on selected regions of the substrate surface. If, for example, an aqueous reactant solution is used, the area surface inside the reaction regions may be hydrophilic, while the surface surrounding the reaction regions may be hydrophobic. As such, the surface chemistry can be varied from position to position on the substrate to control the surface free energy and, in turn, the contact angle of the drops of reactant solution. In this manner, an array of reaction regions can be defined on the substrate surface.

Moreover, as previously explained, the reactant components in the individual reaction regions can be prevented from moving to adjacent reaction regions by leaving a sufficient amount of space between the regions on the substrate so that the various components cannot interdiffuse between reaction regions.

IV. Methods For Delivery Of Reactant Components

In the delivery system of the present invention, a small, precisely metered amount of each reactant component is delivered to each reaction region. This may be accomplished using a variety of delivery techniques, either alone or in combination with a variety of physical masking or photolithographic techniques. Delivery techniques which are suitable for use in the methods of the present invention can generally be broken down into those involving the use of thin-film deposition techniques and those involving the use of dispensers.

A. Delivery Using Thin-Film Deposition Techniques

Thin-film deposition techniques in combination with physical masking techniques or photolithographic techniques can be used to deposit thin-films of the various reactants on predefined regions on the substrate. Such thin-film deposition techniques can generally be broken down into the following four categories: evaporative methods, glow discharge processes, gas-phase chemical processes, and liquid-phase chemical techniques. Included within these categories are, for example, sputtering techniques, spraying techniques, laser ablation techniques, electron beam or thermal evaporation techniques, ion implantation or doping techniques, chemical vapor deposition techniques, as well as other techniques used in the fabrication of integrated circuits. All of these techniques can be applied to deposit highly uniform layers, i.e., thin-films, of the various reactants on selected regions on the substrate. Moreover, by adjusting the relative geometries of the masks, the delivery source and/or the substrate, such thin-film deposition techniques can be used to generate uniform gradients at each reaction region on the substrate or, alternatively, over all of the reaction regions on the substrate. For an overview of the various thin-film deposition techniques which can be used in the methods of the present invention, see, for example, *Handbook of Thin-Film Deposition Processes and Techniques,* Noyes Publication (1988), which is incorporated herein by reference for all purposes.

Thin-films of the various reactants can be deposited on the substrate using evaporative methods in combination with physical masking techniques. Generally, in thermal evaporation or vacuum evaporation methods, the following sequential steps take place: (1) a vapor is generated by boiling or subliming a target material; (2) the vapor is transported from the source to a substrate; and (3) the vapor is condensed to a solid film on the substrate surface. Evaporants, i.e., target materials, which can be used in the evaporative methods cover an extraordinary range of chemical reactivities and vapor pressures and, thus, a wide vary of sources can be used to vaporize the target materials. Such sources include, for example, resistance-heated filaments, electron beams; crucible heated by conduction, radiation or rf-inductions; and arcs, exploding wires and lasers. In preferred embodiments of the present invention, thin-film deposition using evaporative methods is carried out using lasers, filaments, electron beams or ion beams as the source. Successive rounds of deposition, through different physical masks, using evaporative methods can be used to generate an array of reactants on a substrate for parallel synthesis.

Molecular Beam Epitaxy (MBE) is an evaporative method that can be used to grow epitaxial thin-films. In this method, the films are formed on single-crystal substrates by slowly evaporating the elemental or molecular constituents of the film from separate Knudsen effusion source cells (deep crucibles in furnaces with cooled shrouds) onto substrates held at temperatures appropriate for chemical reaction, epitaxy and re-evaporation of excess reactants. The Knudsen effusion source cells produce atomic or molecular beams of relatively small diameter which are directed at the heated substrate, usually silicon or gallium arsenide. Fast shutters are interposed between the source cells and the substrates. By controlling these shutters, one can grow superlattices with precisely controlled uniformity, lattice match, composition, dopant concentrations, thickness and interfaces down to the level of atomic layers.

In addition to evaporative methods, thin-films of the various reactants can be deposited on the substrate using glow-discharge processes in combination with physical masking techniques. The most basic and well known of these processes is sputtering, i.e., the ejection of surface atoms from an electrode surface by momentum transfer from bombarding ions to surface atoms. Sputtering or sputter-deposition is a term used by those of skill in the art to cover a variety of processes, all of which can be used in the methods of the present invention. One such process is RF/DC Glow Discharge Plasma Sputtering. In this process, a plasma of energized ions is created by applying a high RF or DC voltage between a cathode and an anode. The energy ions from the plasma bombard the target and eject atoms which are then deposited on a substrate. Ion-Beam Sputtering is another example of a sputtering process which can be used to deposit thin-films of the various reactant components on a substrate. Ion-Beam Sputtering is similar to the foregoing process except the ions are supplied by an ion source and not a plasma. It will be apparent to one of skill in the art that other sputtering techniques (e.g., diode sputtering, reactive sputtering, etc.) and other glow-discharge processes can be used in the methods of the present invention to deposit thin-films on a substrate. Successive rounds of deposition, through different physical masks, using sputtering or other glow-discharge techniques can be used to generate an array of reactants on a substrate for parallel synthesis.

An example of an eight RF magnetron sputtering gun system which can be employed in the methods of the present invention is illustrated in FIG. 1. This system comprises eight RF magnetron sputtering guns 110, each of which contains a reactant component of interest. The eight RF magnetron sputtering guns are located about 2 to about 5 inches above a disk 112 containing thereon eight masking patterns 114 as well as eight film-thickness monitors 116. In this system, the eight RF magnetron sputtering guns as well as the disk are fixed. The substrate 118, however, is coupled to a substrate manipulator 120 which is capable of linear and rotational motion and which engages the substrate with the particular mask of interest so that the substrate is in contact with the mask when the sputtering begins. Combinations of the eight components are generated on the substrate by the sequential deposition of each component through its respective mask. This entire system is used in vacuo.

In addition to evaporative methods and sputtering techniques, thin-films of the various reactants can be deposited on a substrate using Chemical Vapor Deposition (CVD) techniques in combination with physical masking techniques. CVD involves the formation of stable solids by decomposition of gaseous chemicals using heat, plasma, ultraviolet, or other energy source, or a combination of energy sources. Photo-Enhanced CVD, based on activation of the reactants in the gas or vapor phase by electromagnetic radiation, usually short-wave ultraviolet radiation, and Plasma-Assisted CVD, based on activation of the reactants in the gas or vapor phase using a plasma, are two particularly useful chemical vapor deposition techniques. Successive rounds of deposition, through different physical masks, using CVD technique can be used to generate an array of reactants on a substrate for parallel synthesis.

In addition to evaporative methods, sputtering and CVD, thin-films of the various reactants can be deposited on a substrate using a number of different mechanical techniques in combination with physical masking techniques. Such mechanical techniques include, for example, spraying, spinning, dipping, draining, flow coating, roller coating, pressure-curtain coating, brushing, etc. Of these, the spray-on and spin-on techniques are particularly useful. Sprayers which can be used to deposit thin-films include, for example, ultrasonic nozzle sprayers, air atomizing nozzle sprayers and atomizing nozzle sprayer. In ultrasonic sprayers, disc-shaped ceramic piezoelecric transducers covert electrical energy into mechanical energy. The transducers receive electrical input in the form of a high-frequency signal from a power supply that acts as a combination oscillator/amplifier. In air atomizing sprayers, the nozzles intermix air and liquid streams to produce a completely atomized spray. In atomizing sprayers, the nozzles use the energy from a pressurized liquid to atomize the liquid and, in turn, produce a spray. Successive rounds of deposition, through different physical masks, using mechanical techniques, such as spraying, can be used to generate an array of reactants on a substrate for parallel synthesis.

In addition to the foregoing techniques, photolithographic techniques of the type known in the semiconductor industry can be used. For an overview of such techniques, see, for example, Sze, *VLSI Technology,* McGraw-Hill (1983) and Mead, et al., *Introduction to VLSI Systems,* Addison-Wesley (1980), which are incorporated herein by reference for all purposes. A number of different photolithographic techniques known to those of skill in the art can be used. In one embodiment, for example, a photoresist is deposited on the substrate surface; the photoresist is selectively exposed, i.e., photolyzed; the photolyzed or exposed photoresist is removed; a reactant is deposited on the exposed region(s) on the substrate; and the remaining unphotolyzed photoresist is removed. Alternatively, when a negative photoresist is used, the photoresist is deposited on the substrate surface; the photoresist is selectively exposed, i.e., photolyzed; the unphotolyzed photoresist is removed; a reactant is deposited on the exposed region(s) on the substrate; and the remaining photoresist is removed. In another embodiment, a reactant is deposited on the substrate using, for example, spin-on or spin-coating techniques; a photoresist is deposited on top of the reactant; the photoresist is selectively exposed, i.e., photolyzed; the photoresist is removed from the exposed region(s); the exposed region(s) are etched to remove the reactant from that region(s); and the remaining unphotolyzed photoresist is removed. As with the previous embodiment, a negative photoresist can be used in place of the positive photoresist. Such photolithographic techniques can be repeated to produce an array of reactants on a substrate for parallel synthesis.

It will be readily apparent to those of skill in the art that the foregoing deposition techniques are intended to illustrate, and not restrict, the ways in which the reactants can be deposited on the substrate in the form of thin-films. Other deposition techniques known to and used by those of skill in the art can also be used.

Figure 2:
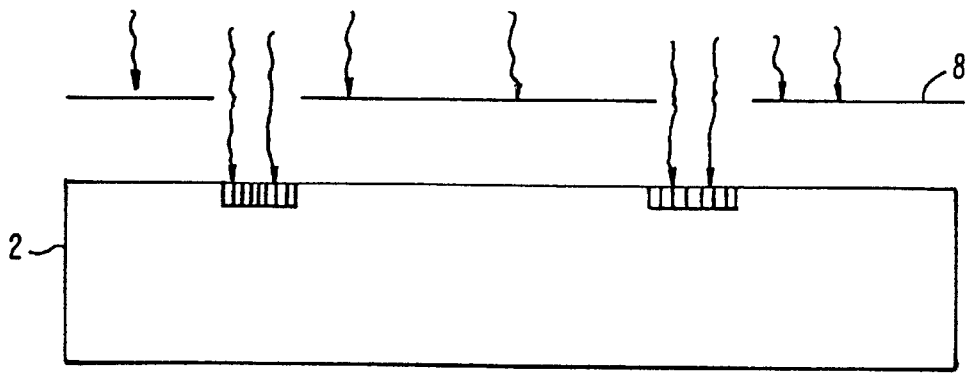
FIG. 2 illustrates masking of a substrate at a first location; the substrate is shown in cross-section.

FIG. 2 and FIG. 3 illustrate the use of the physical masking techniques which can be used in conjunctions with the aforementioned thin-film deposition techniques. More particularly, FIG. 2 illustrates one embodiment of the invention disclosed herein in which a substrate 2 is shown in cross-section. The mask 8 can be any of a wide variety of different materials including, for example, polymers, plastics, resins, silicon, metals, inorganic glasses, etc. Other suitable mask materials will be readily apparent to those of skill in the art. The mask is brought into close proximity with, imaged on, or brought directly into contact with the substrate surface as shown in FIG. 2. "Openings" in the mask correspond to regions on the substrate where it is desired to deliver a reactant. The openings in the mask can take on a variety of different sizes and shapes. Typically, the openings are circular, rectangular or square. Alternatively, however, they can be linear such that the components are delivered in a linear fashion from one end of the substrate to the other. This "linear" arrangement facilitates screening or detection in certain instances, such as when thermoelectric materials are being discovered and optimized. Conventional binary masking techniques in which one-half of the mask is exposed at a given time are illustrated hereinbelow. It will be readily apparent to those of skill in the art, however, that masking techniques other than conventional binary masking techniques can be used in the methods of the present invention.

Figure 3A:
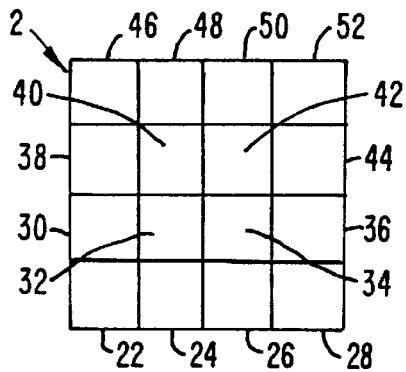
FIGS. 3A–3I illustrate the use of binary masking techniques to generate an array of reactants on a single substrate.
Figure 3B:
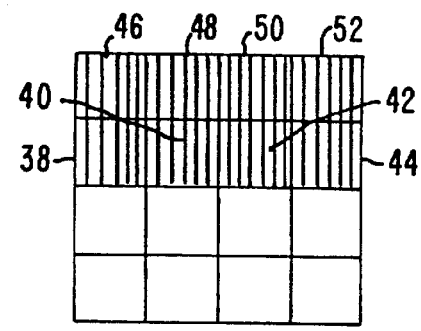
Figure 3C:
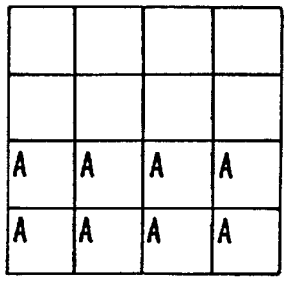
Figure 3D:
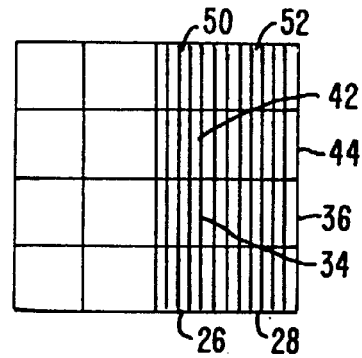
Figure 3E:
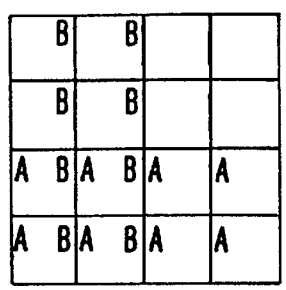

As shown in FIG. 3A, the substrate 2 is provided with regions 22, 24, 26, 28, 30, 32, 34, 36, 38, 40, 42, 44, 46, 48, 50 and 52. Regions 38, 40, 42, 44, 46, 48, 50 and 52 are masked, as shown in FIG. 3B, and component A is delivered to the exposed regions in the form of a thin-film using, for example, spraying or sputtering techniques, with the resulting structure shown in FIG. 3C. Thereafter, the mask is repositioned so that regions 26, 28, 34, 36, 42, 44, 50 and 52 are masked, as shown in FIG. 3D, and component B is delivered to the exposed regions in the form of a thin-film, with the resulting structure shown in FIG. 3E.

As an alterative to repositioning the first mask, a second mask can be used and, in fact, multiple masks are frequently required to generate the desired array of reactants. If multiple masking steps are used, alignment of the masks may be performed using conventional alignment techniques in which alignment marks (not shown) are used to accurately overly successive masks with previous patterning steps, or more sophisticated techniques can be used. Moreover, it may be desirable to provide separation between exposed areas to account for alignment tolerances and to ensure separation of reaction sites so as to prevent cross-contamination. In addition, it will be understood by those of skill in the art that the delivery techniques used to deliver the various reactants to the regions of interest can be varied from reactant to reactant, but, in most instances, it will be most practical to use the same deposition technique for each of the reactants.

Figure 3F:
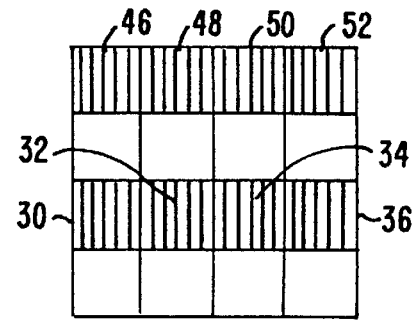
Figures 3G, 3H, 3I:
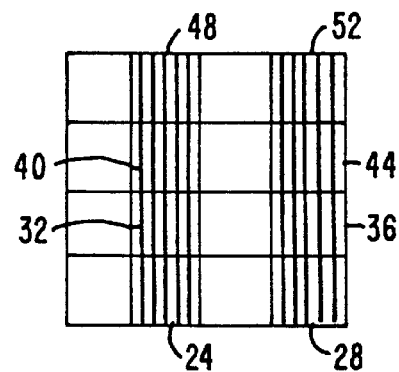

After component B has been delivered to the substrate, regions 30, 32, 34, 36, 46, 48, 50 and 52 are masked, as shown in FIG. 3F, using a mask different from that used in the delivery of components A and B. Component C is delivered to the exposed regions in the form of a thin-film, with the resulting structure shown in FIG. 3G. Thereafter, regions 24, 28, 32, 36, 40, 44, 48 and 52 are masked, as shown in FIG. 3H, and component D is delivered to the exposed regions in the form of a thin-film, with the resulting structure shown in FIG. 3I. Once the components of interest have been delivered to appropriate predefined regions on the substrate, they are simultaneously reacted using any of a number of different synthetic routes to form an array of at least two materials.

Figure 4A:
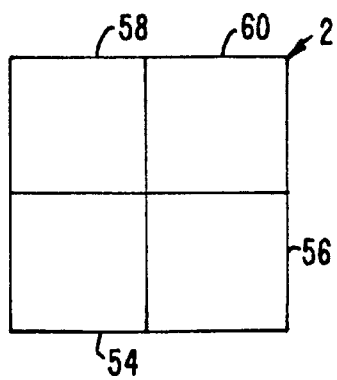
Figure 4B:
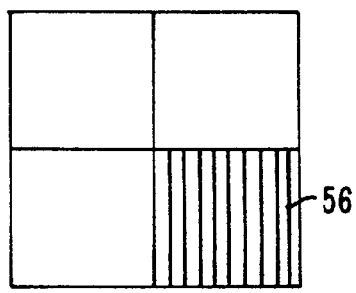
Figure 4C:
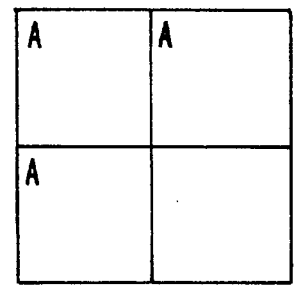
Figure 4D:
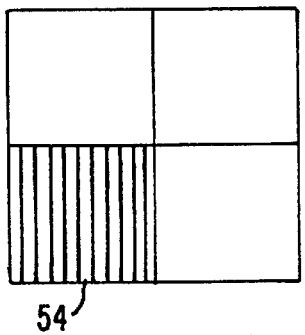
Figure 4E:
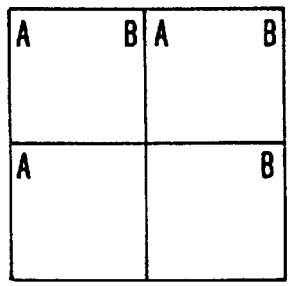
Figure 4F:
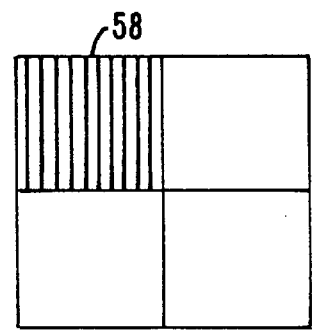
Figures 5E, 5F:
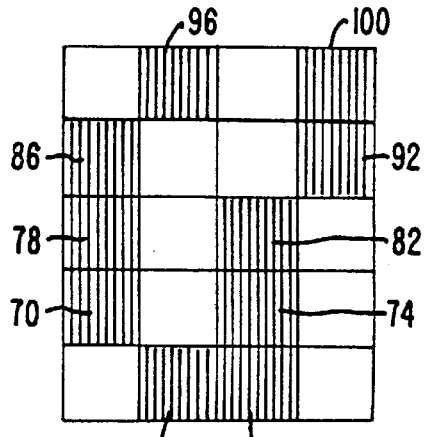
Figures 5G, 5H:
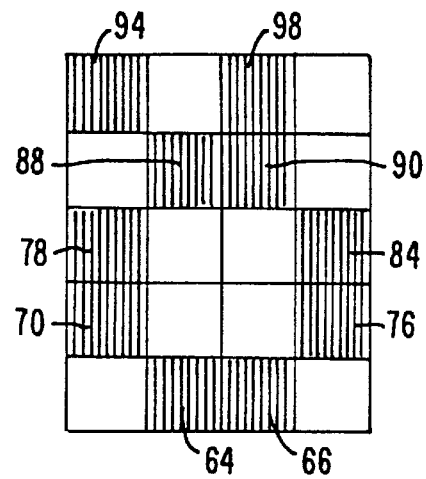
Figures 5I, 5J:
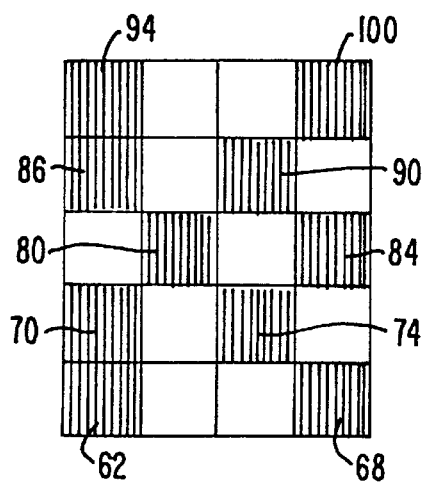
Figures 5K, 5L, 5M:
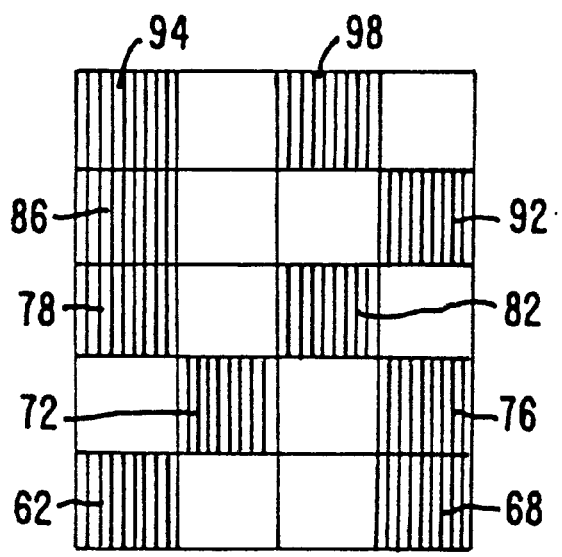

As previously mentioned, masking techniques other than conventional binary masking techniques can be employed with hew aforementioned thin-film deposition techniques in the methods of the present invention. For example, FIG. 4 illustrates a masking technique which can be employed to generate an array of materials, each consisting of a combination of three different components, formed from a base group of four different components. In non-binary techniques, a separate mask is employed for each of the different components. Thus, in this example, four different masks are employed. As shown in FIG. 4A, the substrate 2 is provided with regions 54, 56, 58 and 60. Region 56 is masked, as shown in FIG. 4B, and component A is delivered to the exposed regions in the form of a thin-film using, for example, spraying or sputtering techniques, with the resulting structure shown in FIG. 4C. Thereafter, a second mask is employed to mask region 54, as shown in FIG. 4D, and component B is delivered to the exposed regions in the form of a thin-film, with the resulting structure shown in FIG. 4E. Thereafter, region 58 is masked using a third mask, as shown in FIG. 4F, and component C is delivered to the exposed regions in the form of a thin-film, with the resulting structure shown in FIG. 4G. Finally, a fourth mask is employed to mask region 60, as shown in FIG. 4H, and component D is delivered to the exposed regions in the form of a thin-film, with the resulting structure shown in FIG. 4I. Once the components of interest have been delivered to appropriate predefined regions on the substrate, they are simultaneously reacted using any of a number of different synthetic routes to form an array of four different materials.

FIG. 5 illustrates another masking technique which can be employed to generate an array of materials, each consisting of a combination of three different components, formed from a base group of six different components. As shown in FIG. 5A, the substrate 2 is provided with regions 62, 64, 66, 68, 70, 72, 74, 76, 78, 80, 82, 84, 86, 88, 90, 92, 94, 96, 98 and 100. Regions 64, 68, 72, 76, 80, 84, 88, 92, 96 and 100 are masked, as shown in FIG. 5B, and component A is delivered to the exposed regions in the form of a thin-film using, for example, spraying or sputtering techniques, with the resulting structure shown in FIG. 5C. Thereafter, a second mask is employed to mask regions 62, 66, 72, 74, 80, 82, 88, 90, 96 and 98, as shown in FIG. 5D, and component B is delivered to the exposed regions in the form of a thin-film, with the resulting structure shown in FIG. 5E. Thereafter, regions 64, 66, 70, 74, 78, 82, 86, 92, 96, and 100 are masked using a third mask, as shown in FIG. 5F, and component C is delivered to the exposed regions in the form of a thin-film, with the resulting structure shown in FIG. 5G. Therefore, a fourth mask is employed to mask regions 64, 66, 70, 76, 78, 84, 88, 90, 94 and 98, as shown in FIG. 5H, and component D is delivered to the exposed regions in the form of a thin-film, with the resulting structure shown in FIG. 5I. Thereafter, regions 62, 68, 70, 74, 80, 84, 86, 90, 94 and 100 are masked with a fifth mask, as shown in FIG. 5J, and component E is delivered to the exposed regions in the form of a thin-film, with the resulting structure shown in FIG. 5K. Finally, a sixth mask is employed to mask regions 62, 68, 72, 76, 78, 82, 86, 92, 94 and 98, as shown in FIG. 5L, and component F is delivered to the exposed regions in the form of a thin-film, with the resulting structure shown in FIG. 5M. Once the components of interest have been delivered to appropriate predefined regions on the substrate, they are simultaneously reacted using any of a number of different synthetic routes to form an array of 20 different materials.

It will be readily apparent to those of skill in the art that prior to reacting the foregoing components, an additional reactant component can be delivered to the predefined regions on the substrate in a gradient of stoichiometries. For example, once the six components have been delivered to appropriate predefined regions on the substrate, a seventh component can be delivered in a gradient fashion across the entire substrate or across portions of the substrate. The seventh component can, for example, be deposited through an appropriate mask from left to right as a gradient layer ranging from about 100 Å to 1,000 Å in thickness. Thereafter, the reactant components can be simultaneously reacted using any of a number of different synthetic routes to form an array of different materials.

In addition, it will be readily apparent to those of skill in the art that alternative masking techniques can be employed to generate an array of materials, each consisting of a combination of 3 or more components, formed from a base group of four or more components.

B. Delivery Using A Dispenser

In addition to the foregoing delivery techniques, dispensers can be utilized to generate diverse combinations of reactant components in the form of droplets or powder on a single substrate. As explained above, commercially available micropipetting apparatus can be adapted to dispense droplet volumes of 5 nanoliters or smaller from a capillary. Such droplets can fit within a reaction region having a diameter of 300 μm or less when a non-wetting mask is employed. In some embodiments, the micropipette is accurately and precisely positioned above the reaction, as described below, before the reactant solution is deposited.

In a different preferred embodiment, the present invention employs a solution depositing apparatus that resembles devices commonly employed in the ink-jet printing field. Such ink-jet dispensers include, for example, the pulse pressure type, the bubble jet type and the slit jet type. In an ink-jet dispenser of the pulse pressure type, the printing ink is jetted from a nozzle according to a change in pressure applied by a piezoelectric device. In an ink-jet dispenser of the bubble jet type, bubbles are generated with heat generated with a resistance device embedded in a nozzle, and printing ink is jetted by using the force due to the expansion of a bubble. In an ink-jet dispenser of the slit jet type, printing ink is filled within a slit-like orifice wherein recording electrodes are aligned in correspondence to pixels, and a DC voltage pulse is applied between a recording electrode and a counter electrode arranged behind a recording paper. In this system, the printing ink around the top of the record electrode is charged electrically so that the ink is ejected towards the recording paper with an electrostatic force to record a dot on the paper.

Such ink-jet printers can be used with minor modification by simply substituting a reactant containing solution or reactant containing powder for the ink. For example, Wong, et al., European Patent Application 260 965, incorporated herein by reference for all purposes, describes the use of a pulse pressure type ink-jet printer to apply an antibody to a solid matrix. In the process, a solution containing the antibody is forced through a small bore nozzle that is vibrating in a manner that fragments the solution into discrete droplets. The droplets are subsequently charged by passing through an electric field and then deflected onto the matrix material.

For illustrative purposes, a conventional ink drop printer of the pulse pressure type includes a reservoir in which ink is held under pressure. The ink reservoir feeds a pipe which is connected to a nozzle. An electromechanical transducer is employed to vibrate the nozzle at some suitably high frequency. The actual structure of the nozzle may have a number of different constructions, including a drawn glass tube which is vibrated by an external transducer, or a metal tube vibrated by an external transducer (e.g., a piezoelectric crystal), or a magnetostrictive metal tube which is magnetostrictively vibrated. The ink accordingly is ejected from the nozzle in a stream which shortly thereafter breaks into individual drops. An electrode may be present near the nozzle to impart a charge to the droplets.

Figure 6:
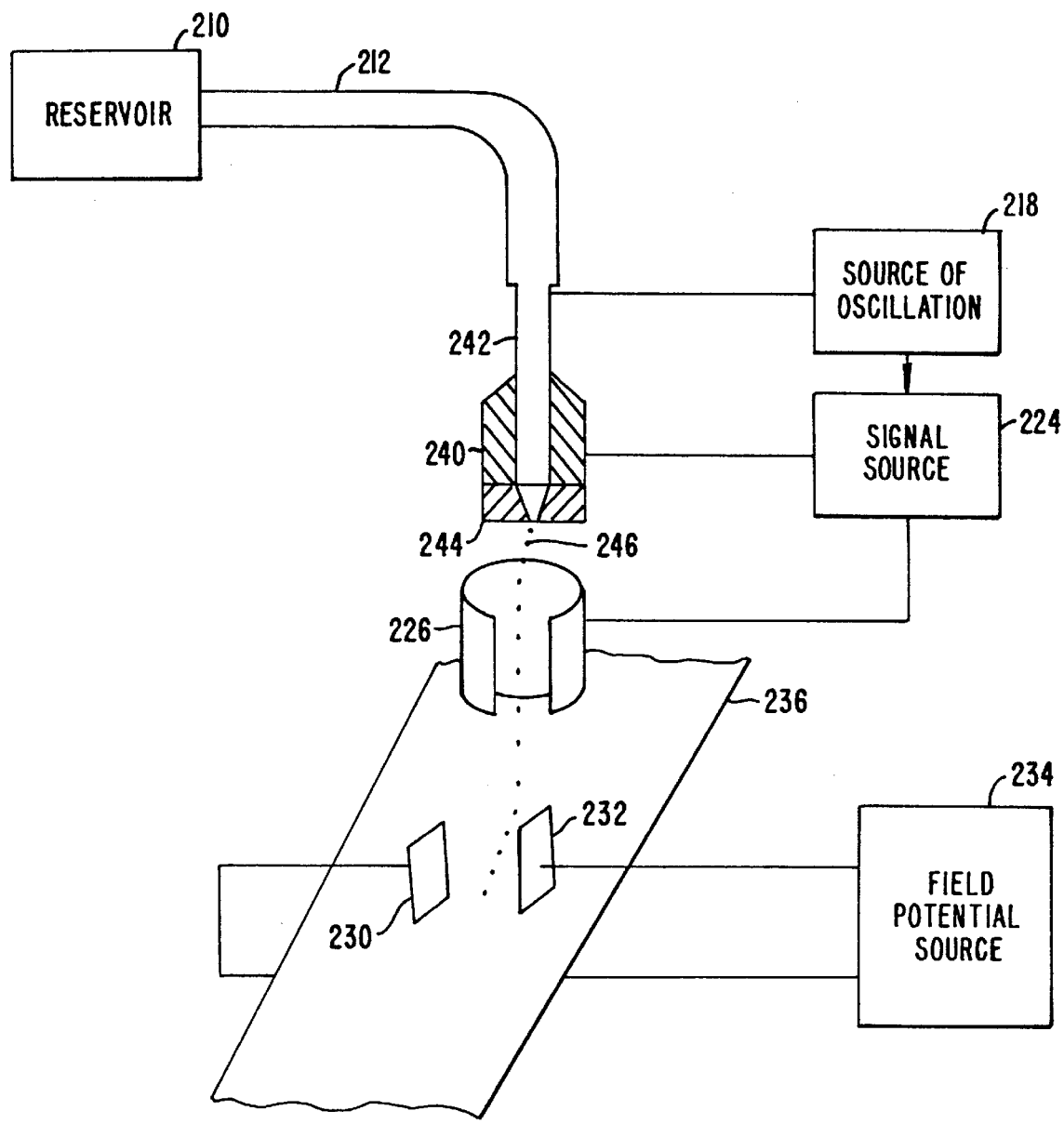
FIG. 6 displays the elements of a typical guided droplet dispenser that may be used to deliver the reactant solution(s) of the present invention.

A schematic drawing of an ink drop dispenser of the pulse pressure type (such as is described in U.S. Pat. Nos. 3,281,860 and 4,121,222, which are incorporated by reference herein for all purposes) which may be employed in the present invention is shown in FIG. 6. This apparatus comprises a reservoir 210 which contains a solution under pressure. Tubing 212 is connected to the reservoir 210 and terminates in a metal nozzle 242. Nozzle 242 is disposed within a hole provided in piezoelectric crystal 240. The end of the metal tube and of the piezoelectric crystal are made to coincide. The tubing and the piezoelectric crystal are soldered together to form a permanent waterproof attachment. The coincident ends of the crystal and the tubing are covered with a washer 244 which is termed an orifice washer. This washer has an opening 246 drilled therethrough through which the solution is emitted under pressure. A source of oscillations 218 is connected between the outside of the metal tubing 242 and the outside of the piezoelectric crystal 240. The construction is such that hermetic sealing can be employed which protects against electrochemical and atmospheric attack of the components.

The piezoelectric crystal 240 is vibrated substantially at the frequency of the source of oscillations causing the tubing and nozzle to vibrate whereby the solution stream breaks down into droplets 246. A signal source 224 which is synchronized by the source of oscillations is connected between the nozzle and the charging cylinder 226. As a result, each of the drops, which should be substantially the same mass, receives a charge, the amplitude of which is determined by the amplitude of the signal applied from the source 224 and the charging cylinder 226.

The charged drops, after passing through the charging cylinder, pass into an electric field which is established between two plates respectively 230 and 232 which are connected to a field potential source 234. As a result of the action between the field and the charge of each drop, the drops are deflected from their center line path between the plates in accordance with the charge which they carry. Thus, when they fall on an optionally moving writing medium 236, a deposition pattern occurs on the writing medium representative of the information in the signals.

Although the ink-jet printer of the pulse pressure type has been described in greater detail herein for purposes of illustration, it will be readily apparent to those of skill in the art that ink-jet printers of the bubble jet type and the slit jet type can also be used, with only minor modifications, to deliver reactant components to predefined regions on the substrate. Moreover, although the foregoing discussion refers to a single nozzle, in a preferred embodiment, ink-jet printers having multiple nozzles are used to deliver multiple reactant components to a single predefined region on the substrate or, alternatively, to multiple predefined regions on the substrate. In addition, as improvements are made in field of ink-jet printers, such improvements can be used in the methods of the present invention.

In other embodiments, the reactant solutions can be delivered from a reservoir to the substrate by an electrophoretic pump. In such a device, a thin capillary connects a reservoir of the reactant with the nozzle of the dispenser. At both ends of the capillary, electrodes are present to provide a potential difference. As is known in the art, the speed at which a chemical species travels in a potential gradient of an electrophoretic medium is governed by a variety of physical properties, including the charge density, size, and shape of the species being transported, as well as the physical and chemical properties of the transport medium itself. Under the proper conditions of potential gradient, capillary dimensions, and transport medium rheology, a hydrodynamic flow will be set up within the capillary. Thus, bulk fluid containing the reactant of interest can be pumped from a reservoir to the substrate. By adjusting the appropriate position of the substrate with respect to the electrophoretic pump nozzle, the reactant solution can be precisely delivered to predefined reaction regions on the substrate.

Using the aforementioned dispenser systems, the reactants can be delivered to predefined regions on the substrate either sequentially or simultaneously. In a presently preferred embodiment, the reactants are simultaneously delivered to either a single predefined region on the substrate or, alternatively, to multiple predefined regions on the substrate. For example, using an ink-jet dispenser having two nozzles, two different reactants can be simultaneously delivered to a single predefined region on the substrate. Alternatively, using this same ink-jet dispenser, a reactant can be simultaneously delivered to two different predefined regions on the substrate. In this instance, the same reactant or, alternatively, two different reactants can be delivered. If the same reactant is delivered to both of the predefined regions, it can be delivered in either the same or different amounts. Similarly, using an ink-jet dispenser having eight nozzles, for example, eight different reactants can be simultaneously delivered to a single predefined region on the substrate or, alternatively, eight reactants (either the same or different) can be simultaneously delivered to eight different predefined regions on the substrate.

V. Moving The Dispenser With Respect To The Substrate

To deposit reactant droplets consistently at precisely specified regions using a dispenser, a frame of reference common to the delivery instrument and the substrate is required. In other words, the reference coordinates of the instrument must be accurately mapped onto the reference coordinates of the substrate. Ideally, only two reference points on the substrate are required to completely map the array of reaction regions. The dispenser instrument locates these reference points and then adjust its internal reference coordinates to provide the necessary mapping. After this, the dispenser can move a particular distance in a particular direction and be positioned directly over a known region. Of course, the dispenser instrument must provide precisely repeatable movements. Further, the individual regions of the array must not move with respect to the reference marks on the substrate after the reference marks have been formed. Unfortunately, pressing or other mechanical operations commonly encountered during fabrication and use of a substrate may warp the substrate such that the correspondence between the reference marks and the reaction regions is altered.

To allow for this possibility, a substrate containing both "global" and "local" reference marks is preferably employed. In preferred embodiments, only two global reference marks are conveniently located on the substrate to define the initial frame of reference. When these points are located, the dispenser instrument has an approximate map of the substrate and the predefined regions therein. To assist in locating the exact position of the regions, the substrate is further subdivided into local frames of reference. Thus, in an initial, "course" adjustment, the dispenser is positioned within one of the local frames of reference. Once in the local region, the dispensing instrument looks for local reference marks to define further a local frame of reference. From these, the dispenser moves exactly to the reaction region where the reactant is to be deposited. In this manner, the effects of warpage or other deformation can be minimized. The number of local reference marks is determined by the amount of deformation expected in the substrate. If the substrate is sufficiently rigid so that little or no deformation will occur, very few local reference marks are required. If substantial deformation is expected, however, more local reference marks are required.

Starting at a single reference point, the micropipette or other dispenser is translated from one reaction region to another reaction region on the substrate by a correct distance in the correct direction (this is the "dead reckoning" navigational technique). Thus, the dispenser can move from region to region, dispensing correctly metered amounts of reactants. In order to initially locate the reference point and align the dispenser directly over it, a vision or blind system can be employed. In a vision system, a camera is rigidly mounted to the dispenser nozzle. When the camera locates the reference point(s), the dispenser is known to be a fixed distance and direction away from the point, and a frame of reference is established. Blind systems locate the reference point(s) by capacitive, resistive, or optical techniques, for example. In one example of an optical technique, a laser beam is transmitted through or reflected from the substrate. When the beam encounters a reference mark, a change in light intensity is detected by a sensor. Capacitive and resistive techniques are similarly applied. A sensor registers a change in capacitance or resistivity when a reference point is encountered.

For purposes of this invention, the spacing between the individual regions will vary in accordance with the size of the regions used. For example, if a 1 mm² region is used, the spacing between the individual regions will preferably be on the order of 1 mm or less. If, for example, a 10 $\mu$m² region is used, the spacing between the individual regions will preferably be on the order of 10 $\mu$m or less. Further, the angular relation between the cells is preferably consistent, to within 0.1 degrees. Of course, the photolithographic or other process used to define the arrangement of cells will accurately define the angle and spacing. However, in subsequent processes (e.g., pressing processes), the angle can be distorted. Thus, in some embodiments, it may be necessary to employ "local" reference points throughout the array.

Translational mechanisms capable of moving with the desired precision are preferably equipped with position feedback mechanisms (i.e., encoders) of the type used in devices for semiconductor device manufacturing and testing. Such mechanisms will preferably be closed loop systems with insignificant backlash and hysteresis. In preferred embodiments, the translation mechanism will have a high resolution, i.e., greater than five motor ticks per encoder count. Further, the electro-mechanical mechanism will preferably have a high repeatability relative to the region diameter travel distance (preferably, ±1–5 $\mu$m).

To deposit a drop of reactant solution on the substrate accurately, the dispenser nozzle must be placed a correct distance above the surface. The dispenser tip preferably should be located about 0.1 cm to about 6 cm above the substrate surface when the drop is released. The degree of control necessary to achieve such accuracy can be attained with a repeatable high-resolution translation mechanism of the type described above. In one embodiment, the height above the substrate is determined by moving the dispenser toward the substrate in small increments, until the dispenser tip touches the substrate. At this point, the dispenser is moved away from the surface a fixed number of increments which corresponds to a specific distance. From there, the drop is released to the cell below. Preferably, the increments in which the dispenser moves will vary in accordance with the size of the regions used.

In an alternative embodiment, the dispenser nozzle is encircled by a sheath that rigidly extends a fixed distance beyond the dispenser tip. Preferably, this distance corresponds to the distance at which the solution drop will fall when delivered to the selected reaction region. Thus, when the sheath contacts the substrate surface, the movement of the dispenser is halted and the drop is released. It is not necessary in this embodiment to move the dispenser back, away from the substrate, after contact is made. In this embodiment, as well as the previous embodiment, the point of contact with the sure can be determined by a variety of techniques such as by monitoring the capacitance or resistance between the tip of the dispenser (or sheath) and the substrate below. A rapid change in either of these properties is observed upon contact with the surface.

To this point, the dispenser delivery system has been described only in teams of translational movements. However, other systems may also be employed. In one embodiment, the dispenser is aligned with respect to the region of interest by a system analogous to that employed in magnetic and optical storage media fields. For example, the region in which reactant is to be deposited is identified by a track and sector location on a disk substrate. The dispenser is then moved to the appropriate track while the disk substrate rotates. When the appropriate cell is positioned below the dispenser (as referenced by the appropriate sector on the track), a droplet of reactant solution is released.

Control of the droplet size may be accomplished by various techniques known to those of skill in the art. For example, in one embodiment, a conventional micropipetting instrument is adapted to dispense droplets of five nanoliters or smaller from a capillary. Such droplets fit within regions having diameters of 300 $\mu$m or less when a non-wetting mask is employed.

Although the above embodiments have been directed to systems employing liquid droplets, minuscule aliquots of each test substance can also be delivered to the reaction region as powders or miniature pellets. Pellets can be formed, for example, from the compound or component of interest and one or more kinds of inert binding material. The composition of such binders and methods for the preparation of such "pellets" will be apparent to those of skill in the art. Such "mini-pellets" will be compatible with a wide variety of test substances, stable for long periods of time and suitable for easy withdrawal from the storage vessel and dispensing.

VI. Synthetic Routes For Reacting The Array of Components

Once the array of components has been delivered to predefined regions on the substrate, the components can be simultaneously reacted using a number of different synthetic routes. The components can be reacted using, for example, solution based synthesis techniques, photochemical techniques, polymerization techniques, template directed synthesis techniques, epitaxial growth techniques, or by the sol-gel process, by thermal, infrared or microwave heating, by calcination, sintering or annealing, by hydrothermal methods, by flux methods, by crystallization through vaporization of solvent, etc. Other useful synthesis techniques will be apparent to those of skill in the art upon review of this disclosure. Moreover, the most appropriate synthetic route will depend on the class of materials to be synthesized, and the selection in any given case will be readily apparent to those of skill in the art. In addition, it will be readily apparent to those of skill in the art that, if necessary, the reactant components can be mixed prior to being reacted using, for example, ultrasonic techniques, mechanical techniques, etc. Such techniques can be applied directly to a given predefined region on the substrate or, alternatively, to all of the predefined regions on the substrate in a simultaneous fashion (e.g., the substrate can be mechanically moved in a manner such that the components are effectively mixed).

Traditional routes to solid-state synthesis involve the sintering of solid reactants. The standard method used to synthesize superconductors, for example, is to grind several metal-oxide powders together, compress the mixture and, thereafter, bake at a temperature ranging from 800° C. to about 1000° C. The elements in the powder mixture sinter, i.e., they react chemically to form new compounds and fuse into a solid, without passing through the liquid or gaseous phase. Gaseous elements, such as oxygen, can be taken up during sintering or, alternatively, in a subsequent step, and the pressure of the system can be varied during the synthesis process. Unfortunately, using traditional sintering techniques, reaction rates are limited by the slow diffusion of atoms or ions through solid reactants, intermediates and products. Moreover, high temperatures are frequently required to accelerate diffusion and to thermodynamically drive the formation of a stable phase.

In contrast to such traditional routes, in the present invention, new routes to solid-synthesis focus on the synthesis of compounds at lower temperatures. It has been found that reaction rates can be increased at lower temperatures by drastically shortening the distance required for diffusion of the reactants and by increasing the surface to volume ratio. This can be achieved by depositing the reactants on the substrate in the form of very thin-films or, alternatively, by using solution based synthesis techniques wherein the reactants are delivered to the substrate in the form of a solution. Moreover, when the synthesis reaction is to be carried out at a temperature ranging from about 200° C. to about 600° C., a molten salt can be employed to dissolve the reactant components. This technique is generally referred to as the flux method. Similarly, in a hydrothermal method, water or other polar solvent containing a soluble inorganic salt is employed to dissolve the reactant components. The hydrothermal method is usually carried out under pressure and at a temperature ranging from about 100° C. to about 400° C. Moreover, using the various synthetic routes of the present invention, the array of reactant components can be pressurized or depressurized under an inert atmosphere, oxygen or other gas. In addition, in the synthetic routes of the present invention, various regions on the substrate can be exposed to different heat histories using, for example, laser thermolysis, wherein bursts of energy of a predetermined duration and intensity are delivered to target regions on the substrate.

In fact, in another embodiment of the present invention, the predefined regions on a substrate can be subjected to different reaction temperatures by independently heating the predefined regions using a thin-film resistive element. In this embodiment, a resistive element, such as tungsten, is deposited on a clean substrate using any one of the previously described thin-film deposition techniques. The resistive element is deposited, for example, in strips along the rows or columns of predefined regions. Each strip is connected to an electrical lead which is attached to a power supply. The temperature of the predefined regions can be regulated by varying the power input to a given strip. In general, any conductive material having a melting point higher than the temperature at which the reaction is to be carried out can be used as the resistive element. Suitable materials include, but are not limited to, metals, alloys, and ceramics. Examples of such materials include, but are not limited to, indium doped tin oxide (ITO), tungsten, molybdenum, tantalum, platinum, copper-nickel alloys, platinum and rhodium alloys, aluminum-nickel alloys, etc.

In some instances, it may be necessary to coat the resistive element with a protective coating so as to prevent interdiffusion between the resistive element and the array of components. The protective coating is applied in the form of a thin-film material using the previously described thin-film deposition techniques. The protective coating is made from a material which effectively conducts heat and which is inert at the temperature at which the reaction is to be carried out. Examples of suitable materials include, but are not limited to, MgO, $SrTiO_3$, $BaTiO_3$, $Al_2O_3$ and other semiconductor and ceramic materials which are good conductors and inert.

Figure 7:
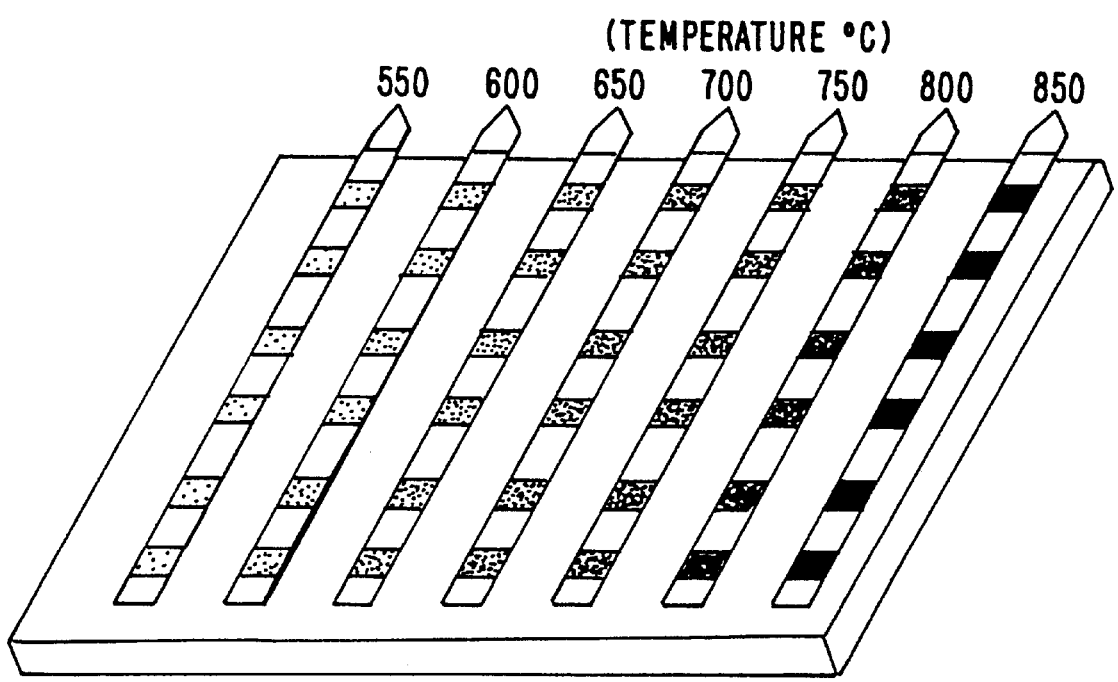
FIG. 7 illustrates an example of temperature control in a library through resistive heating.

Once the resistive element has been deposited, an array of components is generated using thin-film deposition techniques in combination with masking techniques. An example of this approach is illustrated in FIG. 7. In this example, a library of compounds was generated subsequent to the deposition of thin-film resistive strips. As illustrated in FIG. 7, a resistive element occupies an entire column of predefined regions on the substrate. It will be readily apparent to those of skill in the art, however, that the resistive element can be deposited in any pattern and, thus, deposition strategies can be designed so that the resistive element covers different predefined regions on the substrate.

Furthermore, using the synthetic routes of the present invention, the array of components can be processed between the various delivery steps. For example, component A can be delivered to a first region on a substrate and, thereafter, exposed to oxygen at an elevated temperature, for example. Subsequently, component B can be delivered to the first region on the substrate and, thereafter, components A and B can be reacted under a set of reaction conditions. Other manipulations and processing steps which can be carried out between the various delivery steps will be apparent to those of skill in the art upon reading this disclosure.

As such, using the methods of the present invention, the following materials can be prepared: covalent network solids, ionic solids and molecular solids. More particularly, the methods of the present invention can be used to prepare, for example, inorganic materials, intermetallic materials, metal alloys, ceramic materials, organic materials, organometallic materials, non-biological organic polymers, composite materials (e.g., inorganic composites, organic composites, or combinations thereof), etc. Ceramic can be prepared, for instance, by delivering reactant components to predefined regions on the substrate using, for example, solution based delivery techniques. Once the reactant components of interest have been delivered to the substrate, the substrate is heated to the boiling point of the solvent to evaporate off the solvent. Alternatively, the solvent can be removed by delivering the reactant components to a heated substrate. The substrate is then oxidized to remove unwanted components (e.g., carbon, nitrogen, etc.) from the array. The substrate is then flash heated at a temperature of about 800° C. to about 875° C. for about two minutes. Thereafter, the reaction is rapidly quenched and the array is scanned for materials having a particular property, such as luminescence, superconductivity, dielectric strength, etc. Magnetic materials can be prepared using a similar process except that in the case of magnetic materials, the components are delivered to the substrate and simultaneously reacted thereon in the presence of a magnetic field.

Moreover, an array of zeolites, i.e., hydrated silicates of aluminum and either sodium, calcium or both, can be prepared using the methods of the present invention. To prepare an array of such materials, the reactant components are delivered to predefined regions on a substrate in the form of a slurry. Using a low temperature (e.g., 60° C. to about 70° C.) hydrothermal method, for example, the zeolites will crystallize out of solution. In addition, organic polymers can be prepared by delivering a monomer (or monomers) of interest to predefined regions on the substrate usually in the form of a solution. Once the monomer of interest has been delivered, an initiator is added to each region on the substrate. The polymerization reaction is allowed to proceed until the initiator is used up, or until the reaction is terminated in some other manner. Upon completion of the polymerization reaction, the solvent can be removed by, for example, evaporation in vacuo.

It will be readily apparent to those of skill in the art that the foregoing synthetic routes are intended to illustrate, and not restrict, the ways in which the reactants can be simultaneously reacted to form at least two materials on a single substrate. Other synthetic routes and other modifications known to and used by those of skill in the art can also be used.

VII. Methods For Screening the Array of Materials

Once prepared, the array of materials can be screened in parallel for materials having useful properties. Either the entire array or, alternatively, a section thereof (e.g., a row of predefined regions) can be screened in parallel for materials having useful properties. Scanning detection systems are preferably utilized to screen an array of materials wherein the density of regions per unit area will be greater than 0.04 regions/cm$^2$, more preferably greater than 0.1 regions/cm$^2$, even more preferably greater than 1 region/cm$^2$, even more preferably greater than 10 regions/cm$^2$, and still more preferably greater than 100 regions/cm$^2$. In most preferred embodiments, scanning detection systems are preferably utilized to screen an array of materials wherein the density of regions per unit area will be greater than 1,000 regions/cm$^2$, more preferably 10,000 regions/cm$^2$, even more preferably greater than 100,000 regions/cm$^2$, and still more preferably 10,000,000 regions/cm$^2$.

Accordingly, in a preferred embodiment, the array of materials is synthesized on a single substrate. By synthesizing the array of materials on a single substrate, screening the array for materials having useful properties is more easily carried out. Properties which can be screened for include, for example, electrical, thermal mechanical, morphological, optical, magnetic, chemical, etc. More particularly, useful properties which can be screened for are set forth in Table I, infra. Any material found to possess a useful property can subsequently be prepared on a large-scale.

The properties listed in Table I can be screened for using conventional methods and devices known to and used by those of skill in the art. Scanning systems which can be used to screen for the properties set forth in Table I include, but are not limited to, the following: scanning Raman spectroscopy; scanning NMR spectroscopy; scanning probe spectroscopy including, for example, surface potentialometry, tunnelling current, atomic force, acoustic microscopy, shearing-stress microscopy, ultra fast photo excitation, electrostatic force microscope, tunneling induced photo emission microscope, magnetic force microscope, microwave field-induced surface harmonic generation microscope, nonlinear alternating-current tunneling microscopy, near-field scanning optical microscopy, inelastic electron tunneling spectrometer, etc.; optical microscopy in different wavelengths; scanning optical ellipsometry (for measuring dielectric constant and multilayer film thickness); scanning Eddy-current microscope; electron (diffraction) microscope, etc.

More particularly, to screen for conductivity and/or superconductivity, one of the following devices can be used: a Scanning RF Susceptibility Probe, a Scanning RF/Microwave Split-Ring Resonator Detector, or a Scanning Superconductors Quantum Interference Device (SQUID) Detection System. To screen for hardness, a nanoindentor (diamond tip) can, for example, be used. To screen for magnetoresistance, a Scanning RF/Microwave Split-Ring Resonator Detector or a SQUID Detection System can be used. To screen for crystallinity, infrared or Raman spectroscopy can be used. To screen for magnetic strength and coercivity, a Scanning RF Susceptibility Probe, a Scanning RF/Microwave Split-Ring Resonator Detector, a SQUID Detection System or a Hall probe can be used. To screen for fluorescence, a photodetector or a charged-coupled device camera can be used. Other scanning systems known to those of skill in the art can also be used.

TABLE I

EXAMPLES OF PROPERTIES WHICH CAN BE SCREENED FOR

| | |
|---|---|
| ELECTRICAL: | SUPERCONDUCTIVITY |
| | CRITICAL CURRENT |
| | CRITICAL MAGNETIC FIELD |
| | CONDUCTIVITY |
| | RESISTIVITY FOR RESISTIVE FILMS |
| | DIELECTRIC CONSTANT |
| | DIELECTRIC STRENGTH |
| | DIELECTRIC LOSS |
| | STABILITY UNDER BIAS |
| | POLARIZATION |
| | PERMITTIVITY |
| | PIEZOELECTRICITY |
| | ELECTROMIGRATION |
| THERMAL: | COEFFICIENT OF EXPANSION |
| | THERMAL CONDUCTIVITY |
| | TEMPERATURE VARIATION |
| | VOLATILITY & VAPOR PRESSURE |
| MECHANICAL: | STRESS |
| | ANISOTROPY |
| | ADHESION |
| | HARDNESS |
| | DENSITY |
| | DUCTILITY |
| | ELASTICITY |
| | POROSITY |
| MORPHOLOGY: | CRYSTALLINE OR AMORPHOUS |
| | MICROSTRUCTURE |
| | SURFACE TOPOGRAPHY |
| | CRYSTALLITE ORIENTATION |
| OPTICAL: | REFRACTIVE INDEX |
| | ABSORPTION |
| | BIREFRINGENCE |
| | SPECTRAL CHARACTERISTICS |
| | DISPERSION |
| | FREQUENCY MODULATION |
| | EMISSION |
| MAGNETIC: | SATURATION FLUX DENSITY |
| | MAGNETORESTSTANCE |
| | MAGNETORESTRICTION |
| | COERCIVE FORCE |
| MAGNETIC: | PERMEABILITY |
| CHEMICAL: | COMPOSITION |
| | COMPLEXATION |
| | ACIDITY-BASICITY |
| | CATALYSIS |
| | IMPURITIES |
| | REACTIVITY WITH SUBSTRATE |
| | CORROSION & EROSION RESISTANCE |

The arrays of the present invention can be screened sequentially or, alternatively, they can be screened in parallel using a scanning system. For instance, the array of materials can be sequentially screened for superconductivity using, for example, magnetic decoration (Bitter pattern) and electron holography. Alternatively, the array of materials can be scanned for superconductivity using, for example, a Hall-probe, magnetic force microscopy, SQUID microscopy, a AC susceptibility microscope, a microwave absorption microscope, an Eddy current microscope, etc.

In a presently preferred embodiment, a scanning detection system is employed. In one embodiment, the substrate having an array of materials thereon is fixed and the detector has X-Y motion. In this embodiment, the substrate is placed inside a sealed chamber, close to the detector. The detector (e.g., an RF Resonator, a SQUID detector, etc.) is attached to a rigid rod with low thermal conductivity coupled to an X-Y positioning table at room temperature with a scanning range of up to 1 inch and a 2 μm spatial resolution. The position of the detector is controlled using stepping motors (or servomotors) connected to a computer-controlled positioner. The temperature of the detector and the substrate can be lowered via helium exchange gas by liquid helium reservoir located around the chamber. This scanning system can be operated at temperatures ranging from 600° K. down to 4.2° K. (when immersed in liquid helium).

In another embodiment, the detector is fixed and the substrate having an array of materials thereon has R-θ motion. In this embodiment, the substrate is placed on a rotating stage (e.g., a spur gear) driven by a gear rack which is coupled to a micrometer and a stepping motor. This rotating stage is located on a cryogenic sliding table which is driven by a separate micrometer and stepping motor system. This system is capable of scanning an area having a 1 inch radius with a 1 μm spatial resolution. The scanning and probing are controlled through the use of a computer. As with the other embodiment, the temperature of the detector and the substrate can be lowered via helium exchange gas using a liquid helium reservoir located around the chamber. This scanning system can be operated at temperatures ranging from 600° K. down to 4.2° K. (when immersed in liquid helium).

Figures 8, 9:
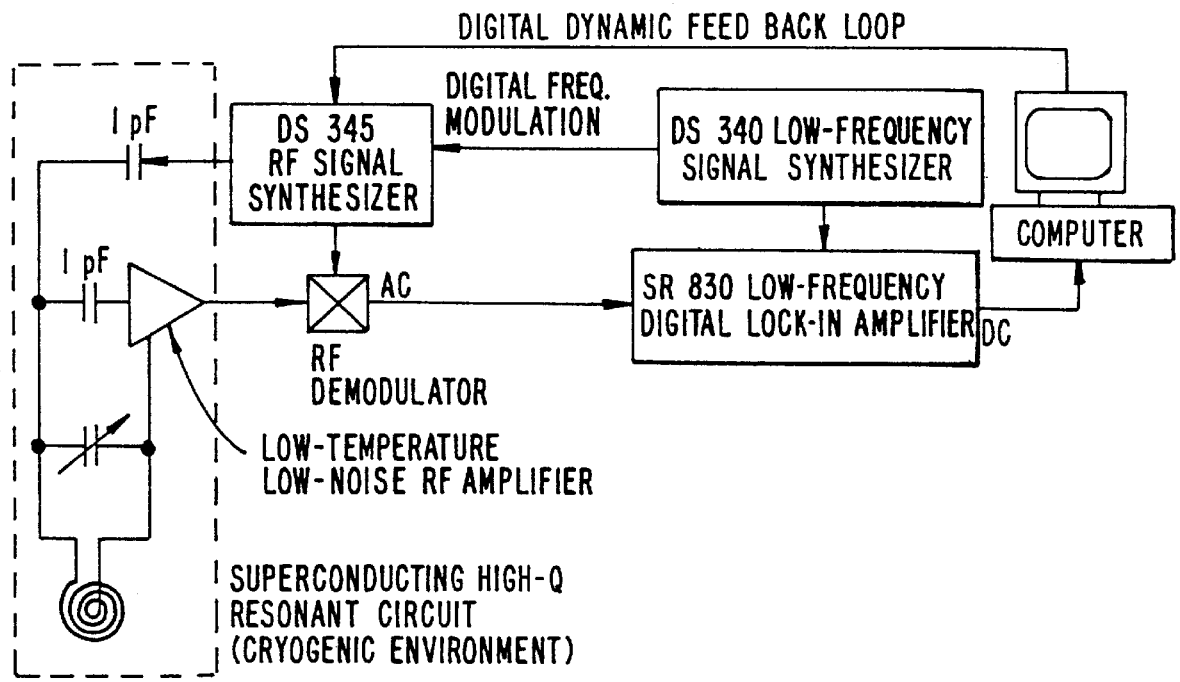
FIG. 8 illustrates an example of a Scanning RF Susceptibility Detection System which can be used to detect the superconductivity of an array of materials.
FIG. 9 is a map of the reactant components delivered to the 16 predefined regions on the MgO substrate.

Using either of the foregoing embodiments, a Scanning RF Susceptibility Detection System can, for example, be used to detect the superconductivity of a large array of materials (see, e.g., FIG. 8). Using photolithographic techniques, a micro (about 1×1 mm$^2$) spiral coil can be fabricated to probe the conductivity of a sample adjacent to the coil. The signals are picked up by a phase-sensitive detection electronic circuit. Thereafter, the data is analyzed by a computer to obtain a correlation between the properties and stoichiometry of a given sample. If desired, analytical results can be fed back to the delivery system so that the system can "zoom in" on the most promising stoichiometry in the next synthesis cycle.

Moreover, a superconducting microcircuit implementation of a parallel LC resonance circuit can be used to scan the array of materials for those that are superconducting. A parallel LC circuit is simply an inductor in parallel with a capacitor. The electrical properties of both circuit elements give the circuit a resonance frequency where a maximum amount of input voltage is transmitted through to the output. The sharpness of the peak, conventionally measured by its Q value, is determined by the materials used in the circuit, whereas the frequency of the resonance is set by the capacitance and the inductance. It has been determined that manufacturing the circuit out of a superconducting material, such as niobium, gives a very high Q value, i.e., a Q value on the order of 10,000 or more. This is in contrast to commercially available, non-superconducting capacitors and inductors which generally give Q values on the order of hundreds. The steep peak of the niobium circuit gives rise to high sensitive detection.

In this system, actual detection is done by the induction coil. The inductance of an inductor is a function of the magnetic field geometry through its coils. In the presence of a nearby superconducting sample, the magnetic field through the inductor is distorted by the expulsion of field by the material (i.e., the Meissner effect). This, in turn, changes the inductance and shifts the resonance. By following the resonance, one can readily determine when a material is superconducting.

In this scanning device, the total circuit is approximately 5 mm×2.5 mm, with an active area equal to approximately one-fourth of that. The coil is a spiral coil having dimensions of about 1.5 mm per side, and the capacitor is a two-plate niobium capacitor with a SiO$_2$ dielectric (i.e., insulating) layer. SQUID magnetometers have achieved spatial resolutions of 10 μm, but their sensitivities have been limited by noise present in the Josephson junction. In the scanning device of the present invention, however, the device is unencumbered by noise from the Josephson junction and, thus, a sensitivity for samples of 1 μm or less can be achieved. In this embodiment, sensitivity, rather than spatial resolution, is a more critical criterion.

It will be readily apparent to those of skill in the art that the foregoing detection systems are intended to illustrate, and not restrict, the ways in which the array of material can be screened for those materials having useful properties. Other detection systems known to and used by those of skill in the art can similarly be used.

VIII. Alternative Embodiments

In another embodiment of the present invention, at least two different arrays of materials are prepared by delivering substantially the same reaction components at substantially identical concentrations to predefined regions on both first and second substrates and, thereafter, subjecting the components on the first substrate to a first set of reaction conditions and the components on the second substrate to a second set of reaction conditions in a wide array of compositions. If a first substrate has, for example, components A and B on a first region on the substrate and, in addition, components X and Y on a second region on the substrate, the second substrate is prepared in a manner such that it has substantially the same components in predefined regions thereon. That is to say, the second substrate is substantially identical to the first substrate in terms of the components contained thereon. As such, in this example, the second substrate would also have components A and B on the first region on the substrate and, in addition, components X and Y on the second region on the substrate.

Once the components have been delivered to their appropriate predefined regions on the substrate, the components on the first substrate are reacted using a first set of reaction conditions, whereas the components on the second substrate are reacted using a second set of reaction conditions. It will be understood by those of skill in the art that the components on the first substrate can be reacted under a first set of reaction conditions at the same time as the components on the second substrate are reacted under a second set of reaction conditions or, alternatively, the components on the first substrate can be reacted under a first set of reaction conditions either before or after the components on the second substrate are reacted under a second set of reaction conditions.

In this embodiment, the effects of various reaction parameters can be studied and, in turn, optimized. Reaction parameters which can be varied include, for example, reactant amounts, reactant solvents, reaction temperatures, reaction times, the pressures at which the reactions are carried out, the atmospheres in which the reactions are conducted, the rates at which the reactions are quenched, etc. Other reaction parameters which can be varied will be apparent to those of skill in the art. Alteratively, the first set of reaction conditions can be the same as the second set of reaction conditions, but, in this embodiment, the processing steps after the components on the first and second substrates have been reacted would differ from the first substrate to the second substrate. For example, the first substrate can be exposed to oxygen at elevated temperatures, while the second substrate is not processed at all.

Alternatively, in another aspect of this embodiment, the first substrate having component A on the first region of the substrate and component X on the second region of the substrate is exposed to a particular set of reaction conditions (e.g., exposed to oxygen at elevated temperatures), while the second substrate also having component A on the first region of the substrate and component X on the second region of the substrate is not exposed to such reaction conditions. Thereafter, component B is delivered to the first region on both the first and second substrates, and component Y is delivered to the second region on both the first and second substrates. Once the desired components have been delivered to the first and second regions on the first and second substrates, the components are simultaneously reacted under substantially identical reaction conditions. This particular embodiment allows one to determine the effects intermediate processing steps have on a particular array of materials. As set forth above, any of a number of different reaction parameters can be varied.

In still another embodiment of the present invention, a method is provided for producing an array of materials varying from one another in terms of chemical composition and component stoichiometries. In this method, a reactant component can be delivered to a particular predefined region (s) in a gradient of stoichiometries. Moreover, multiple reactant components can be delivered to a particular predefined region(s) in a gradient of stoichiometries. For example, a first component of a first material and a first component of a second material are deposited on first and second reaction regions, respectively. Thereafter, a second component of the first material and a second component of the second material are deposited in a gradient of stoichiometries from top to bottom (or left to right) on the first and second reaction regions, respectively. Once the components have been delivered to the substrate, the components are simultaneously reacted to form materials varying from one another in terms of chemical composition and chemical stoichiometries.

In yet another embodiment of the present invention, a material having a useful property is provided. The material is prepared by a process comprising the steps of: (a) forming an array of different materials on a single substrate; (b) screening the array for a material having a useful property; and (c) making additional amounts of the material having the useful property. Such materials include, for example, intermetallic materials, metal alloys, ceramic materials, organometallic materials, organic polymers, composite materials (e.g., inorganic composites, organic composites, or combinations thereof), etc. In addition, useful properties include, for example, electrical, thermal, mechanical, morphological, optical, magnetic, chemical, etc.

Using the foregoing method, a new family of giant magnetorestive (GMR) cobalt oxides has been discovered. Arrays of materials containing different compositions and stoichiometries of $Ln_xM_yCoO_\delta$, wherein Ln is, for example, Y and La, and M is, for example, Pb, Ca, Sr and Ba, were formed using thin film deposition techniques in combination with masking techniques (See, Example D, infra, for the protocol used to generate the arrays of cobalt oxide thin-film materials). Once formed, the arrays of materials were screened for those materials among them having useful properties. More particularly, the arrays of materials were screened for specific materials having giant magnetoresistive (GMR) properties, among others. In doing so, materials having large magnetoresistance (MR) were discovered. Once the materials having useful properties were identified, additional amounts of such materials were prepared for further analysis.

The compounds in this new family of GMR cobalt oxides have the following general formula: $A_{y-(1-x)}M_{y-x}CoO_z$, wherein A is a metal selected from the group consisting of lanthanum (La), yttrium (Y), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yp) and lutecium (Lu); M is a metal selected from the group consisting of calcium (Ca), strontium (Sr), barium (Ba), lead (Pb), thallium (Tl) and bismuth (Bi); y has a value ranging from about 1 to about 2; x has a value ranging from about 0.1 to about 0.9; and z has a value ranging from about 2 to about 4. The compounds in this new family of GMR cobalt oxides generally have a layered, perovskite-related structure, i.e., a cubic perovskite structure with some slight distortion.

In a presently preferred embodiment, the compounds in this new family of GMR cobalt oxides have the following general formula: $Al_{1-x}M_xCoO_z$, wherein A is a metal selected from the group consisting of lanthanum (La), yttrium (Y), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yp) and lutecium (Lu); M is a metal selected from the group consisting of calcium (Ca), strontium (Sr), barium (Ba), lead (Pb) and cadmiun (Cd); x has a value ranging from about 0.1 to about 0.9; and z has a value ranging from about 2 to about 4. Within the scope of this formula, certain embodiments are preferred, namely those in which x has a value ranging from about 0.2 to about 0.7 and, even more preferred, are those in which x has a value ranging from 0.3 to about 0.5.

In a further preferred embodiment, the compounds in this new family of GMR cobalt oxides have the following general formula: $La_{1-x}M_xCoO_z$, wherein M is a metal selected from the group consisting of barium, calcium and strontium; x has a value ranging from about 0.1 to about 0.9; and z has a value ranging from about 2 to about 4. Within the scope of this formula, certain embodiments are preferred, namely those in which x has a value ranging from about 0.2 to about 0.7 and, even more preferred, are those in which x has a value ranging from 0.3 to about 0.5. As mentioned, the compounds in this new family of GMR cobalt oxides generally have a layered, perovskite-related structure.

In yet another embodiment of the present invention, libraries of microdevices, such as thin-film capacitors or thin-film electroluminescent modules, can be generated using the methods previously described for generating arrays of materials. For example, a thin-film capacitor consists of two electrode materials separated by an insulating or dielectric material. An array of thin-film capacitors can be formed by first depositing an electrode material on each of the predefined regions on the substrate. An array of dielectric materials can then be generated on top of the electrode surface using the methods previously described. On top of this layer, another electrode layer can be deposited, resulting in an array of thin-film capacitors, each capacitor containing a different dielectric material. By measuring the capacitance at each of the predefined regions on the substrate, the performance of the various dielectric materials for thin-film capacitors can be tested and optimized. It will be readily apparent to those skilled in the art that this approach is fully applicable to other thin-film devices, such as thin-film electroluminescent displays. In addition, it will be readily apparent to those skilled in the art that any one of the various layers in a thin-film device can be an array of different materials at the same or different stoichiometries, or an array of the same material at different stoichiometries. Moreover, the order of the various layers can be varied (e.g., the electrode material in the thin-film capacitors can be deposited on either the top or bottom of the other layers. Thus, using the methods of the present invention, each of the layers in a given thin-film device can be optimized.

It will be understood by those of skill in the art that the foregoing discussions directed to the various delivery techniques, synthetic routes, screening methods, etc. are fully applicable to the above embodiments of the present invention.

IX. Examples

The following examples are provided to illustrate the efficacy of the inventions herein.

A. Synthesis of An Array of 16 Copper Oxide Thin-Film Materials

This example illustrates the synthesis and screening of an array of copper oxide thin-film materials. The reactants were delivered to a 1.25 cm×1.25 cm MgO substrate with a (100) polished surface. The substrate having 16 predefined regions thereon was contained in a reaction chamber in vacuo. The reactants were delivered to the substrate in the form of thin-films using a sputtering system in combination with binary masking techniques. The binary mask was made of stainless steel. A RF magnetron gun sputtering system was used to deliver the reactant components to the predefined regions on the substrate. The RF magnetron sputtering gun (Mini-mak manufactured by US, Inc., Campbell, Calif.) used was about 1.3 inches in diameter. With RF input power (supplied by a Plasmtherm-2000 with a matching network) of 50 to about 200 W, deposition rates ranged from about 0.3 Å/s to about 2 Å/s for the five different reactant components. The RF magnetron sprayer was positioned about 3 to 4 inches above the substrate and the uniformity of deposited film was about 5% over a 1 to 2 inch diameter area. The sputtering gas flow (Ar or Ar and $O_2$) was controlled by metering valves and differential pumping through a manual gate valve. To achieve a high deposition rate, it was determined that the best gas pressure range was about 5 to 15 mTorr. The partial pressure of each gas component in the chamber was monitored using a residual gas analyzer (Micropole Sensor by Ferran Scientific, San Diego, Calif.) directly up to 15 mTorr without differential pumping.

The reactant components used to generate the array of copper oxide materials were as follows: CuO, $Bi_2O_3$, CaO, PbO and $SrCO_3$. CuO was used as the base element in an effort to discover new copper oxide materials and, thus, this component was delivered to each of the 16 predefined regions on the substrate. Prior to delivering the component of interest to the predefined regions on the substrate, the base air pressure of the reaction chamber was lowered, within 10 to 15 minutes, to about $10^{-5}$ to $10^{-6}$ Torr by a 250 1/s turbo pump and, if necessary, it was furthered lowered to $10^{-8}$ Torr using extended pumping time in combination with heating the reaction chamber to about 100° C. to about 150° C. Since only a single RF magnetron gun sputtering system was employed, the vacuum was broken and re-established each time the component was changed. The film deposition thickness was monitored using a crystal micro-balance (STM-100 by Sycon Instruments, Syracuse, N.Y.). Since the position of crystal micro-balance was not located at exactly the same position as the substrate, it was necessary to calibrate the thickness monitor reading for each component with a profilometer.

The reactant components were delivered to the MgO substrate in the following order: $Bi_2O_3$, PbO, CuO, CaO and $SrCO_3$. The stoichiometry was designed so that each of the five components was present in equal molar amounts, i.e., 1Bi:1Pb:1Cu:1Sr:1Ca as deposited film. The total thickness of the film was about 0.5 μm for a five layered site. The thickness of each of the individual films as well as the sputtering rates at which each of the components were deposited are set forth in Table II, supra.

TABLE II

DEPOSITION THICKNESS AND SPUTTERING RATE FOR THE COMPONENTS USED TO GENERATE AN ARRAY OF COPPER OXIDES

| Component | Deposition Thickness | Sputtering Rate |
| --- | --- | --- |
| $Bi_2O_3$ | 1200 Å | 2 Å/Sec |
| PbO | 970 Å | 1.6 Å/Sec |
| CuO | 540 Å | 1 Å/Sec |
| $SrCO_3$ | 1650 Å | 3 Å/Sec |
| CaO | 720 Å | 3 Å/Sec |

Figure 10:
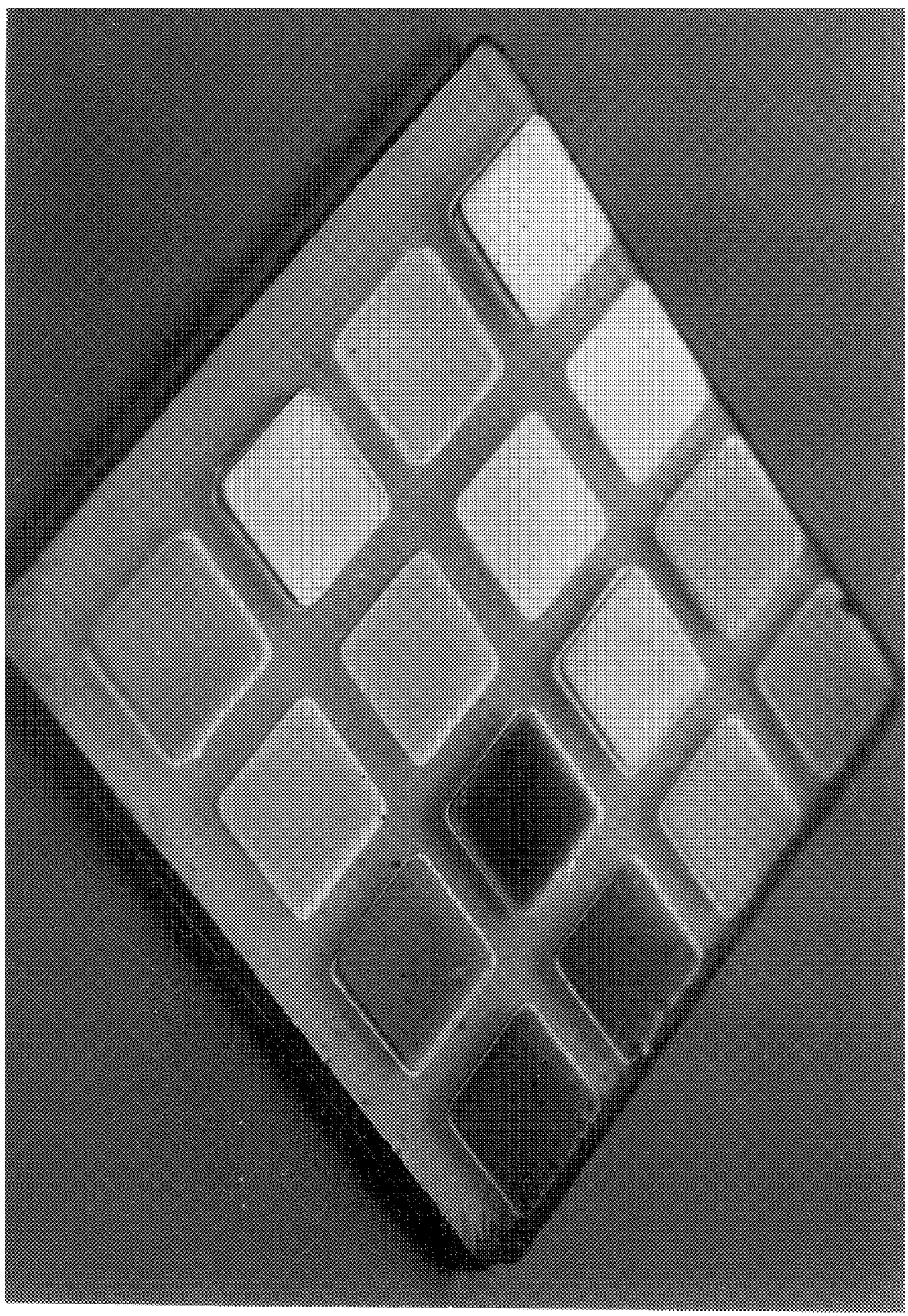
FIG. 10 is a photograph of an array of 16 different compounds on the 1.25 cm×1.25 cm MgO substrate.

Once the components of interest were delivered to the 16 predefined regions on the substrate as illustrated in FIG. 9, the substrate was placed in a furnace, and the components were subsequently reacted. FIG. 10 is a photograph of the array of 16 different compounds on the 1.25 cm×1.25 cm MgO substrate. The color of each site is the natural color of reflected light from a white light source at an angle. The components were simultaneously reacted using the following heating and cooling procedure: 50° C. to 725° C. in 2 hr., 725° C. to 820° C. in 1 hr., 820° C. to 840° C. in 0.5 hr. and 840° C. to 750° C in 0.5 hr. Once the substrate cooled to a temperature of about 750° C., the power was turned off. The heating and cooling procedure was performed in ambient atmosphere. No apparent evaporation or melting was observed.

Once reacted, each of the 16 predefined reaction regions was screened for resistance. In doing so, it was found that two of the predefined regions contained materials which are conducting. Contacts were put on these two sites in in-line 4-probe configuration, and it was determined that the contact resistances are less than hundred ohms (Ω). Thereafter, the samples were cooled down to 4.2° K. in a liquid helium cryostat to measure resistivity as a function of temperature. Factory calibrated Cernox™ resistance temperature sensor (LakeShore) was used to measure temperature. FIGS. 11A and 11B shows the resistance of the two conducting materials as a function of temperature. The BiPbCuSrCa material has a metallic conductivity (resistance decrease with temperature) from room temperature down to about 100° K., whereas the BiCuSrCa material has a rather flat and slightly upward temperature dependence resistance. Superconducting critical temperatures ($T_c$) for both samples are about 100° K. Evidence of two superconducting phase in the resistivity measurement was not observed.

B. Synthesis of An Array of 128 Copper Oxide Thin-Film Material

Figures 12A, 12B, 12C:
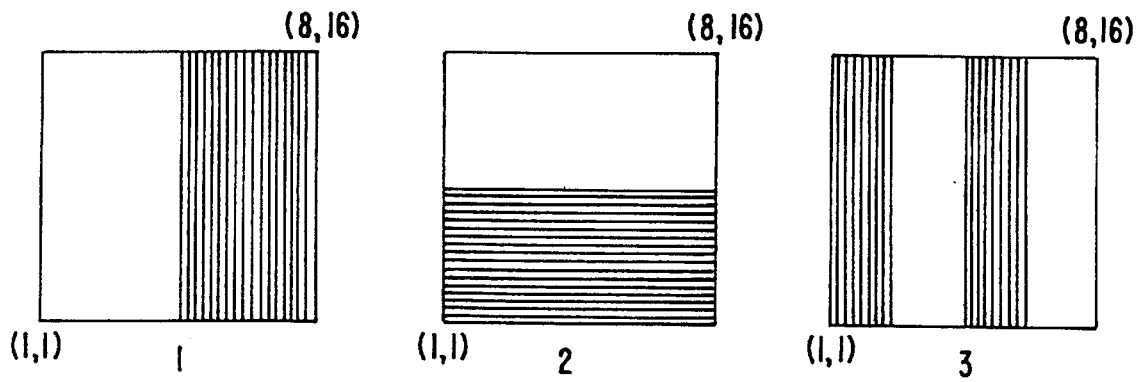
FIG. 12 illustrate the binary masks used to generate the library of materials; numbers in lower left hand and upper righthand corners indicate position of each member in the library; M0 corresponds to no secondary mask.
Figures 12D, 12E:
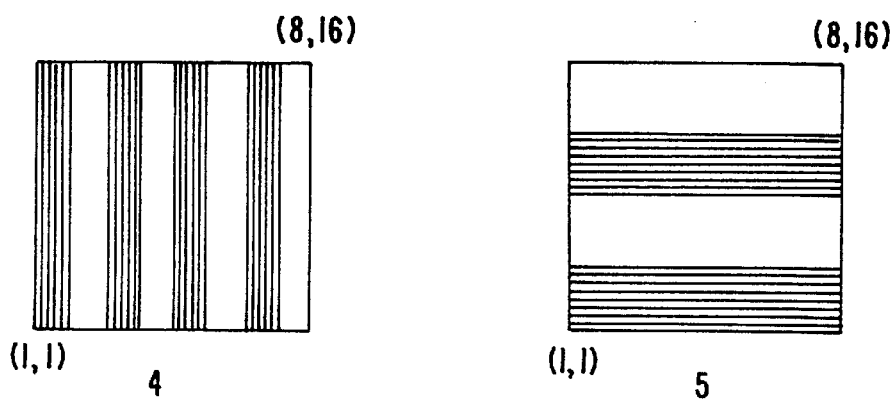
Figures 12F, 12G:
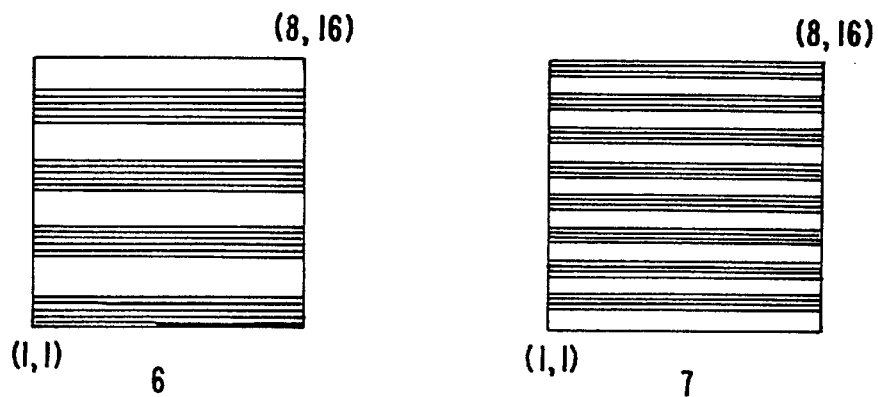

This example illustrates the synthesis and screening of a 128 member library consisting of different combinations, stoichiometries and deposition sequences of Bi, Ca, Cu, Pb and Sr. The library was generated by sputtering target materials through physical masks using an RF magnetron sputtering gun. Sputtering was carried out at $10^{-5}$ to $10^{-6}$ torr with Ar as the sputtering gas; deposition rates were 0.1 to 1 Å s$^{-1}$. Film deposition thickness was monitored with a crystal microbalance and calibrated independently with a profilometer. The uniformity of the deposited films varied approximately 5% over a 2-inch diameter area. MgO single crystals with a (100) polished surface were used as substrates and CuO, $Bi_2O_3$, CaO, PbO and $SrCO_3$, were used as sputtering targets. The library was generated using a binary masking strategy by overlaying a primary physical mask containing 128 (1×2 mm) holes with a series of secondary masks (FIG. 12). (See, Fodor, S. P. A., et al., Science 251, 767 (1991)). Precursors were sputtered through the appropriate binary mask in a stepwise fashion. Up to six identical 128 member libraries could be synthesized simultaneously and processed under different conditions. In a binary synthesis, $2^m$ compounds are formed for a given number of masking steps (m). The array contains all combinations that can be formed by deleting one or more steps from the entire deposition/masking sequence. Additional masking schemes can be used to generate other libraries, e.g., a library consisting of all quaternary compounds derived from a group of ten precursors.

Figure 13:
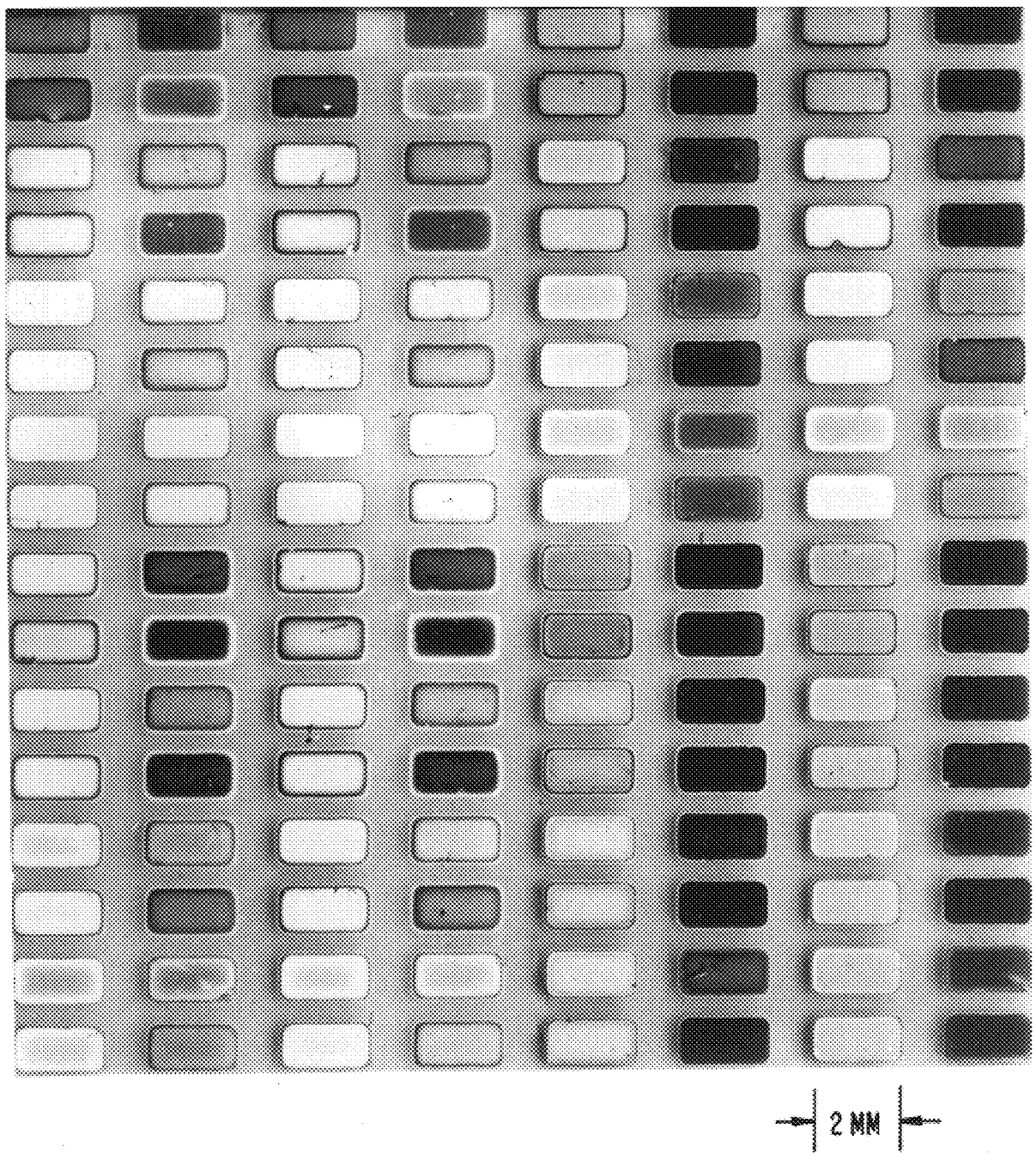
FIG. 13 is a photograph of the 128 member binary library prior to sintering; the color of each site is the natural color of reflected light from a white light source.

As mentioned, a 128-member library was generated to examine the effects of stoichiometry and deposition sequence on the properties of the BiSrCaCuO films. The library was generated as follows: 1, Bi, M0; 2, Bi, M1; 3, Cu, M0; 4, Cu, M2; 5, Cu, M3; 6, Sr, M0; 7, Sr, M5; 8, Ca, M6; 9, Cu, M4; 10, Ca, M7, where the first entry designates the deposition step, the second designates the element and the third designates the mask (see, FIG. 13). The molar stoichiometry for each layer was 1:1 relative to Bi (which was deposited as a 300 Å layer), with the exception of steps 3 and 5 in which the Cu:Bi ratio was 0.5:1. The library was then sintered at 840° C. in air. The heating and cooling procedures were: 50° C. to 725° C. in 2 hr., 725° C. to 820° C. in 1 hr., 820° C. to 840° C. in 0.5 hr., 840° C. to 750° C. in 0.5 hr. The entire heating procedure was performed in air. No apparent evaporation or melting was observed. The resistance of each site was measured using a 4-point contact probe.

Figure 14A:
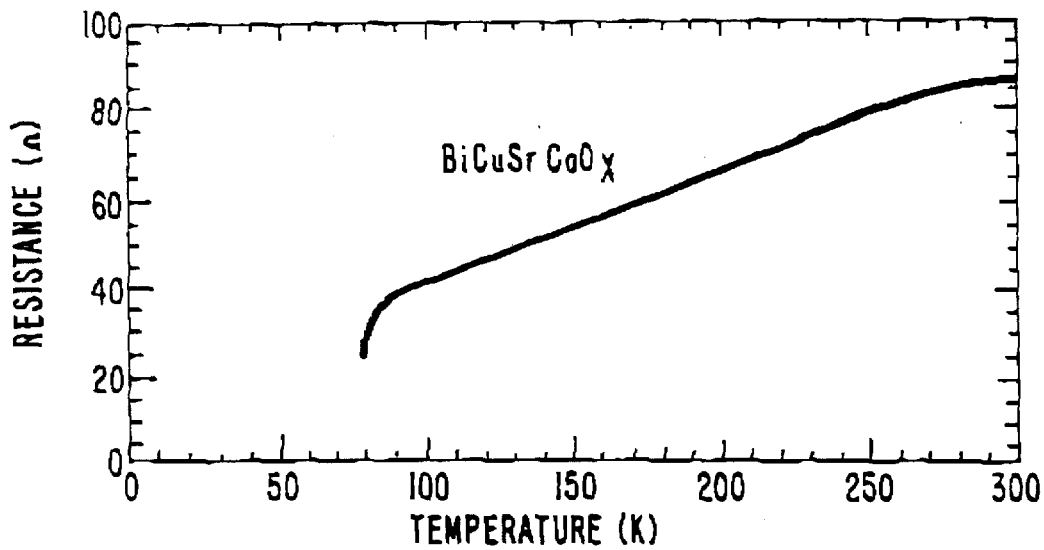
FIGS. 14A–14B illustrate resistivity vs. temperature plots: (A) ●BiCuSrCaO; and (B) ●BiCuSrCaCuCaO and ○BiCuCuSraCaO.
Figure 14B:
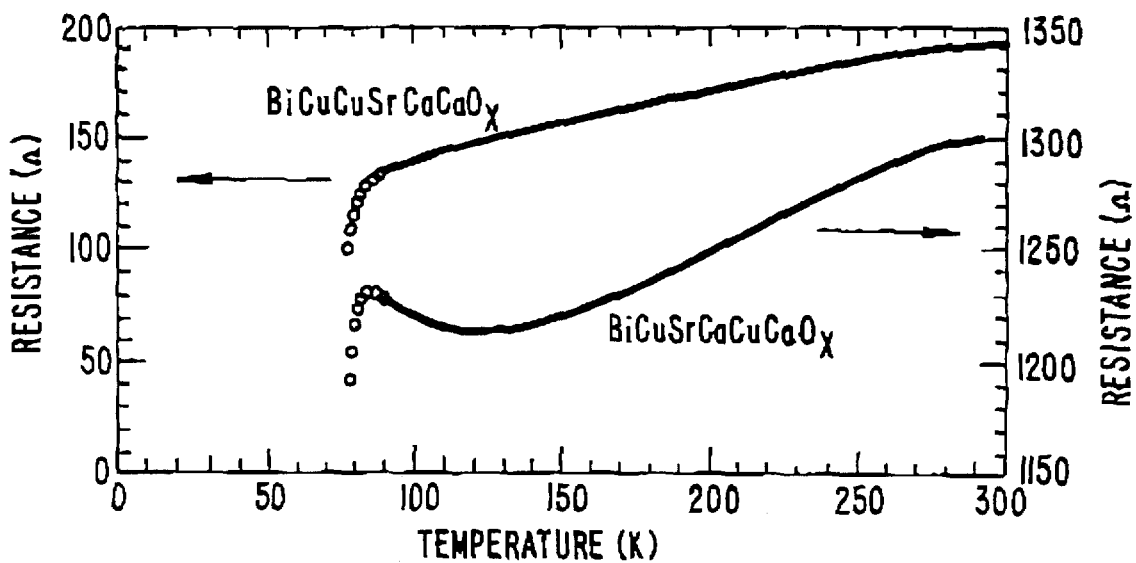
Figure 15A:
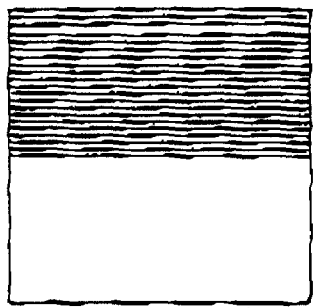
FIG. 15 illustrates the masks used to generate the YBCO-BSCCO library.
Figure 15B:
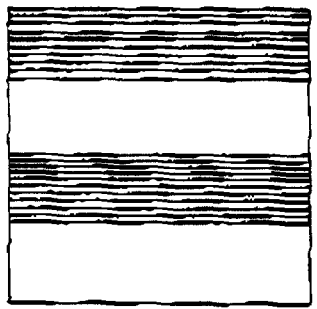
Figure 15C:
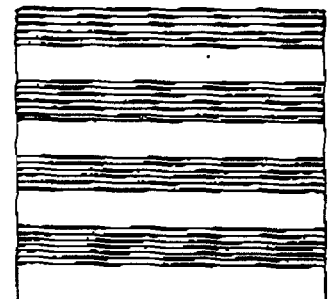
Figure 15D:
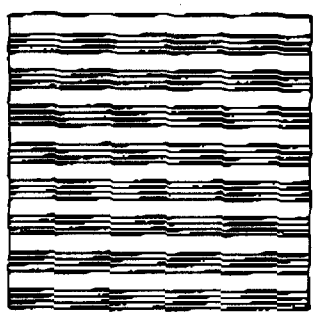
Figure 15E:
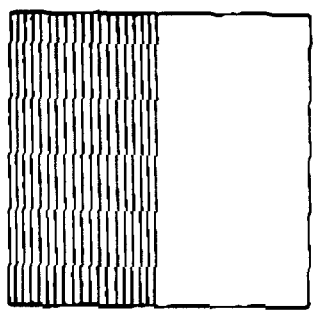
Figure 15F:
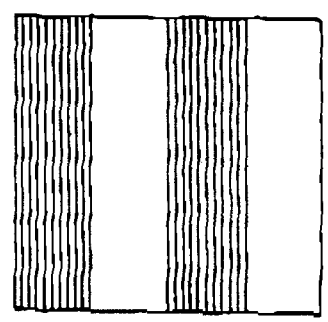
Figure 15G:
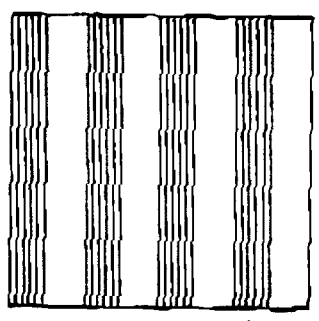

Films with low resistivities such as the BiCuSrCaO film shown in FIG. 14A showed metallic behavior with onset Tc's of 80° K. and 90° K. This is in contrast to the behavior of the BiCuCaSrO film found in the sixteen member library. Other films were also found in the 128 member library, having identical stoichiometries and different deposition sequences, that had distinct resistivity versus temperature profiles, e.g., BiCuSrCaCuCaO and BiCuCuSrCaCaO (FIG. 14B). This result suggests that different phases may be accessible by controlling the deposition sequence. Films with excess Ca and Cu, e.g., BiSrCaCuO ratios of 2,2,4,4 and 2,2,4,5, showed a 110° K. phase, consistent with the formation of $Bi_2Sr_2Ca_2Cu_3O_{10}$.

C. Synthesis of an Array of 128 Copper Oxide Thin-Film Materials Containing BiSrCaCuO and YBaCuO Superconducting Materials This example illustrates the synthesis and screening of a 128 member library consisting of different combinations, stoichiometries and deposition sequences of Ba, Y, Bi, Ca, Sr and Cu. The library was generated by sputtering target materials through physical masks using an RF magnetron sputtering gun. Sputtering was carried out at $10^{-5}$ to $10^{-6}$ torr with Ar as the sputtering gas; deposition rates were 0.1 to 1 Å$s^{-1}$. Film deposition thickness was monitored with a crystal microbalance (STM-100 by Sycon Instruments, Syracuse, N.Y.) and calibrated independently with a profilometer. The uniformity of the deposited films varied approximately 5% over a 1 to 2 inch diameter area. MgO single crystals with a (100) polished surface were used as substrates and $BaCO_3$, $Y_2O_3$, $Bi_2O_3$, CaO, $SrCO_3$ and CuO were used as sputtering targets. The library was generated using a non-binary masking strategy as described below.

The 128-member library was generated to examine the effects of stoichiometry and deposition sequence on the properties of the BiSrCaCuO and YBaCuO thin-film materials. The library was generated as follows: 1, Bi, M1; 2, Cu, M2; 3, La, M3; 4, Y3, M4; 5, Ba, M5; 6, Sr, M6; 7, Ca, M7, where the first entry designates the deposition step, the second designates the element and the third designates the mask employed (see, FIG. 15). The thickness of each of the individual films was as follows: $Bi_2O_3$, 1000 Å; CuO, 716 Å; $La_2O_3$, 956 Å; $Y_2O_3$, 432 Å; $BaCO_3$, 1702 Å; $SrCO_3$, 1524 Å; CaO, 635 Å. Following low temperature diffusion (~200–300° C.), the library was sintered at 840° C. in ambient atmosphere. The heating and cooling procedure used was as follows: 200° C. to 300° C. in 12 hr., 300° C. to 700° C. in 1 hr., 700° C. to 750° C. in 2 hr., 750° C. to 840° C. in 0.4 hr., 840° C. to 840° C. for 1 hr., 840° C. to 560° C. in 1 hr., 560° C. to 250° C. in 6 hr. After 6 hours at 250° C., the power was turned off. The entire heating procedure was performed in air. No apparent evaporation or melting was observed.

Figure 16A:
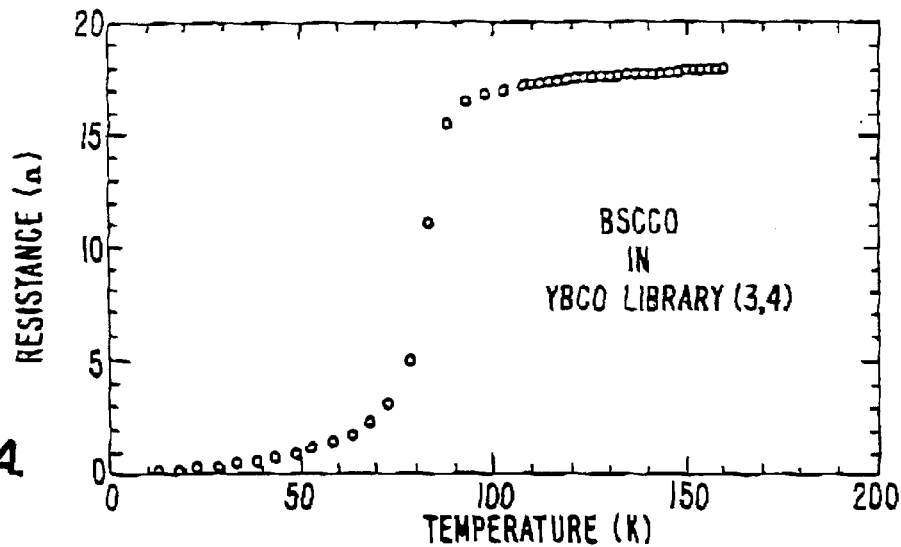
FIGS. 16A–16C illustrates resistivity vs. temperature plots: (A) BiCuSrCaO; (B) YBaCaO; and (C) $YBa_2Cu_3O_x$.
Figure 16B:
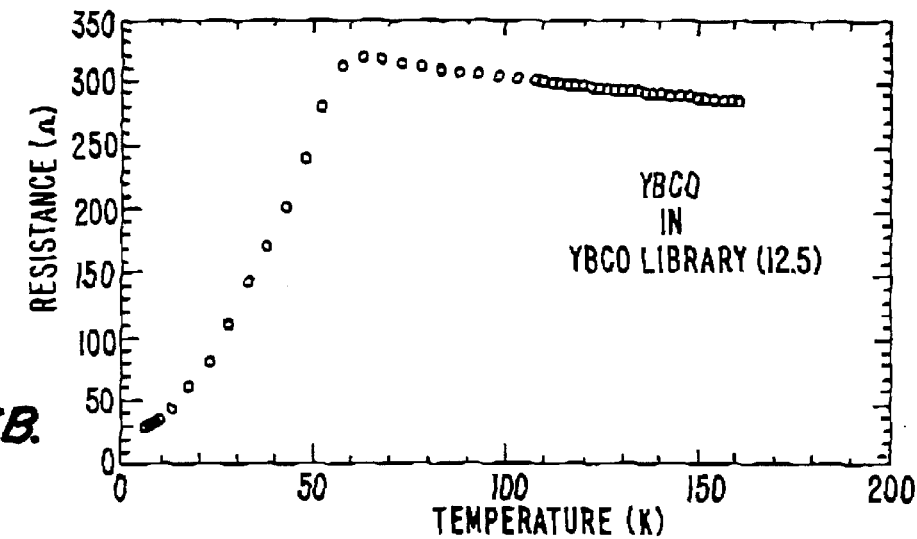
Figure 16C:
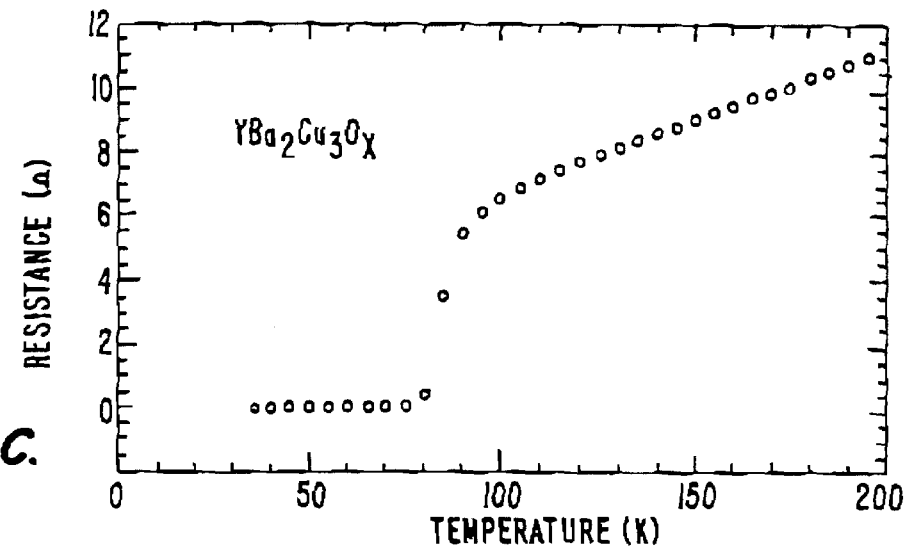
Figure 17A:
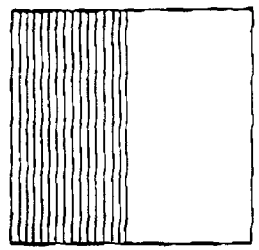
FIG. 17 illustrates the masks used to generate the libraries of cobalt oxide (CoO) thin-film materials.
Figure 17B:
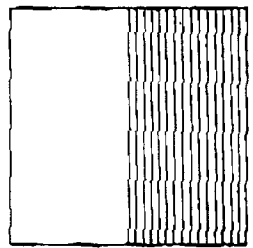
Figure 17C:
Figure 17D:
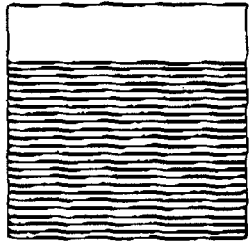
Figure 17E:
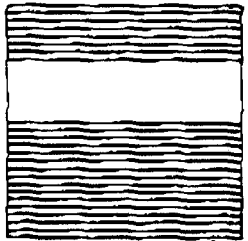
Figure 17F:
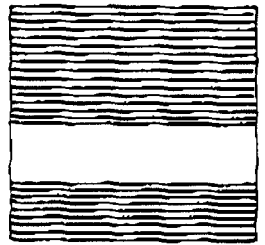
Figure 17G:
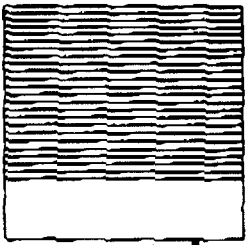
Figure 17H:
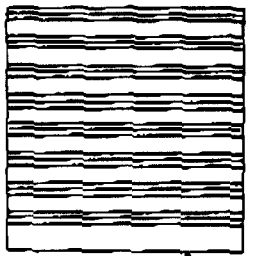
Figure 17I:
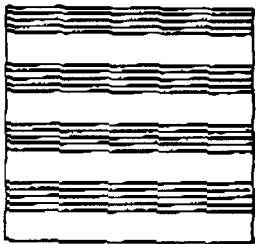
Figure 17J:
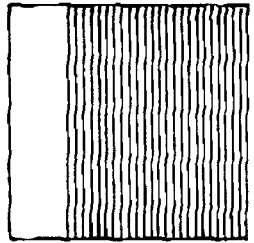
Figure 17K:
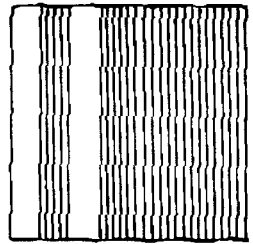
Figure 17L:
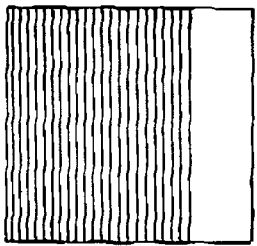
Figure 17M:
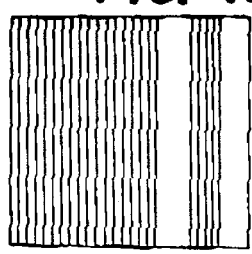

Once reacted, each of the 128 predefined regions was screened for resistance. The resistance of each site was measured using a 4-point contact probe. Films with low resistivities, such as the BiCuSrCaO film and the YBaCuO film shown in FIG. 16, showed metallic behavior with onset Tc's of about 80° K. and 60° K., respectively (see, FIG. 16).

D. Synthesis of Arrays of Cobalt Oxide Thin-film Materials

This example illustrates the synthesis and screening of arrays of cobalt oxide (CoO) thin-film materials. The reactants were delivered to 2.5 cm×2.5 cm $LaAlO_3$ substrates with (100) polished surfaces. The substrates having 128 predefined regions thereon were contained in a reaction chamber in two. The reactants were delivered to the substrates in the form of thin-films using a sputtering system in combination with non-binary masking techniques. The masks employed were made of stainless steel. A RF magnetron gun sputtering system was used to deliver the reactant components to the predefined regions on the substrates. The RF magnetron sputtering gun (Mini-mak manufactured by US, Inc., Campbell, Calif.) used was about 1.3 inches in diameter. With RF input power (supplied by a Plasmtherm-2000 with a matching network) of 50 to about 200 W, deposition rates ranged from about 0.3 Å/s to about 2 Å/s for the various reactant components. The RF magnetron sprayer was positioned about 3 to 4 inches above the substrates and the uniformity of deposited film was about 5% over a 1 to 2 inch diameter area. The sputtering gas flow (Ar or Ar and $O_2$) was controlled by metering valves and differential pumping through a manual gate valve. To achieve a high deposition rate, it was determined that the best pressure range was about 5 to 15 mTorr. The partial pressure of each gas component in the chamber was monitored using a residual gas analyzer (Micropole Sensor by Ferran Scientific, San Diego, Calif.) directly up to 15 mTorr without differential pumping.

The reactant components used to generate the arrays of cobalt oxide materials were as follows: $Y_2O_3$, $La_2O_3$, Co, $BaCO_3$, $SrCO_3$, CaO, PbO, Co, Co, $La_2O_3$, $La_2O_3$, $Y_2O_3$, and $Y_2O_3$. The libraries were generated as follows: 1, Y, M1; 2, La, M2; 3, Co, M3; 4, Ba, M4; 5, Sr, M5; 6, Ca, M6; 7, Pb, M7; 8, Co, M8; 9, Co, M9; 10, La, M10; 11, La, M11; 12, Y, M12; and 13, Y, M13, where the first entry designates the deposition step, the second designates the element and the third designates the mask employed (see, FIG. 17). Co was used as the base element in an effort to discover new cobalt oxide thin-film materials having giant magnetoresistant properties and, thus, this component was delivered to each of the 128 predefined regions on the substrates. Prior to delivering the component of interest to the predefined regions on the substrates, the base air pressure of the reaction chamber was lowered, within 10 to 15 minutes, to about $10^{-5}$ to $10^{-6}$ Torr by a 250 1/s turbo pump and, thereafter, it was furthered lowered to $10^{-8}$ Torr using extended pumping time in combination with heating the reaction chamber to about 100° C. to about 150° C. Since only a single RF magnetron gun sputtering system was employed, the vacuum was broken and re-established each time the component was changed. The film deposition thickness was monitored using a crystal microbalance (STM-100 by Sycon Instruments, Syracuse, N.Y.).

The reactant components were delivered to the $LaAlO_3$ substrates in the following order: $Y_2O_3$, $La_2O_3$, Co, $BaCO_3$, $SrCO_3$, CaO, PbO, Co, Co, $La_2O_3$, $La_2O_3$, $Y_2O_3$, and $Y_2O_3$. The total thickness of the films was about 0.4 $\mu$m for a five layered site. The thickness of each of the individual films is set forth in Table III, supra.

TABLE III

DEPOSITION THICKNESS AND SPUTTERING RATE FOR THE COMPONENTS USED TO GENERATE AN ARRAY OF COBALT OXIDES

| Component | Deposition Thickness |
| --- | --- |
| $Y_2O_3$ | 245 Å |
| $La_2O_3$ | 350 Å |
| Co | 145 Å |
| $BaCO_3$ | 600 Å |
| $SrCO_3$ | 538 Å |
| CaO | 245 Å |
| PbO | 316 Å |
| Co | 128 Å |
| Co | 55 Å |
| $La_2O_3$ | 245 Å |
| $La_2O_3$ | 245 Å |
| $Y_2O_3$ | 122 Å |
| $Y_2O_3$ | 245 Å |

Once the components of interest were delivered to the 128 predefined regions on the substrates, the substrates were placed separately in a furnace, and the components were subsequently reacted. The components in Library 2 (L2) were simultaneously using the following heating and cooling procedure: 200° C. to 300° C. in 12 hr., 300° C. to 650° C. in 1 hr., 650° C. to 850° C. in 3 hr., 850° C. to 900° C. in 3 hr., and 900° C. to 400° C. in 2 hr. Once the substrate cooled to a temperature of about 400° C., the power was turned off. The heating and cooling procedures were performed in ambient atmosphere. No apparent evaporation or melting was observed.

The components in Library 3 (L3) were simultaneously reacted using the following heating and cooling procedure: Room Temperature (RT) to 200° C. in 1 hr., 200° C. to 350° C. in 15 hr., 350° C. to RT (system shut down and the substrate allowed to cool to RT), RT to 650° C. in 2 hr., 650° C. to 740° C. in 13 hr., 740° C. to 850° C. in 1 hr., 850° C. to 900° C. in 3 hr., 900° C. to 650° C. in 0.5° C. hr, and 650° C. to 250° C. in 2 hr. Once the substrate cooled to a temperature of about 400° C., the power was turned off. The heating and cooling procedures were performed in ambient atmosphere. No apparent evaporation or melting was observed.

Once reacted, each of the 128 predefined reaction regions in the L2 and L3 libraries was screened for giant magnetoresistant (GMR) materials. The resistivity of each sample as a function of magnetic field, perpendicular to the probing current, and temperature was measured using the 4-probe contact method with a computer controlled multi-channel switching system. A liquid helium cryogenic system with a superconducting 12 Tesla (T) magnet (manufactured by Janis Research Co., Inc., Willmington, Mass.) was used to perform variable temperature and field measurements. FIG. 18 shows a map of the libraries and the stoichiometry of each sample. In addition, the black, solid circles in FIG. 18 indicates those samples which exhibited a significant GMR (>5%) effect.

From FIG. 18, it is apparent that a new family of GMR materials based on cobalt oxide has been discovered. The compounds in this new family of GMR cobalt oxides have the following general structure: $A_{y-(1-x)}M_{y-x}CoO_z$, wherein A is a metal selected from the group consisting of lanthanum (La), yttrium (Y), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yp) and lutecium (Lu); M is a metal selected from the group consisting of calcium (Ca), strontium (Sr), barium (Ba), lead (Pb), thalium (Tl) and bismuth (Bi); y has a value ranging from about 1 to about 2; x has a value ranging from about 0.1 to about 0.9; and z has a value ranging from about 2 to about 4. The compounds in this new family of GMR cobalt oxides generally have a layered, perovskite-related structure.

In a presently preferred embodiment, the compounds in this new family of GMR cobalt oxides have the following general formula: $A_{1-x}M_xCoO_z$, wherein A is a metal selected from the group consisting of lanthanum (La), yttrium (Y), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yp) and lutecium (Lu); M is a metal selected from the group consisting of calcium (Ca), strontium (Sr), barium (Ba), lead (Pb) and cadmiun (Cd); x has a value ranging from about 0.1 to about 0.9, more preferably, 0.2 to 0.7 and, even more preferably, 0.3 to 0.5; and z has a value ranging from about 2 to about 4.

Figure 19A:
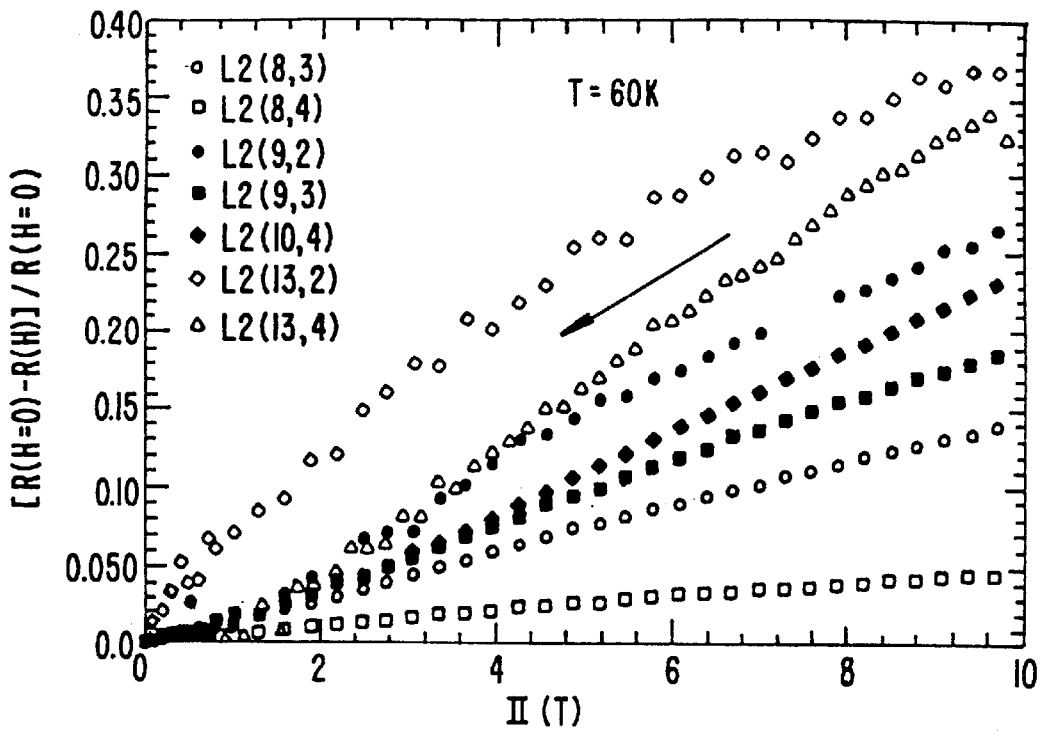
FIGS. 19A and 19B illustrate MR ratios of representative samples in L2 (19A) and L3 (19B) as a function of magnetic field.
Figure 19B:
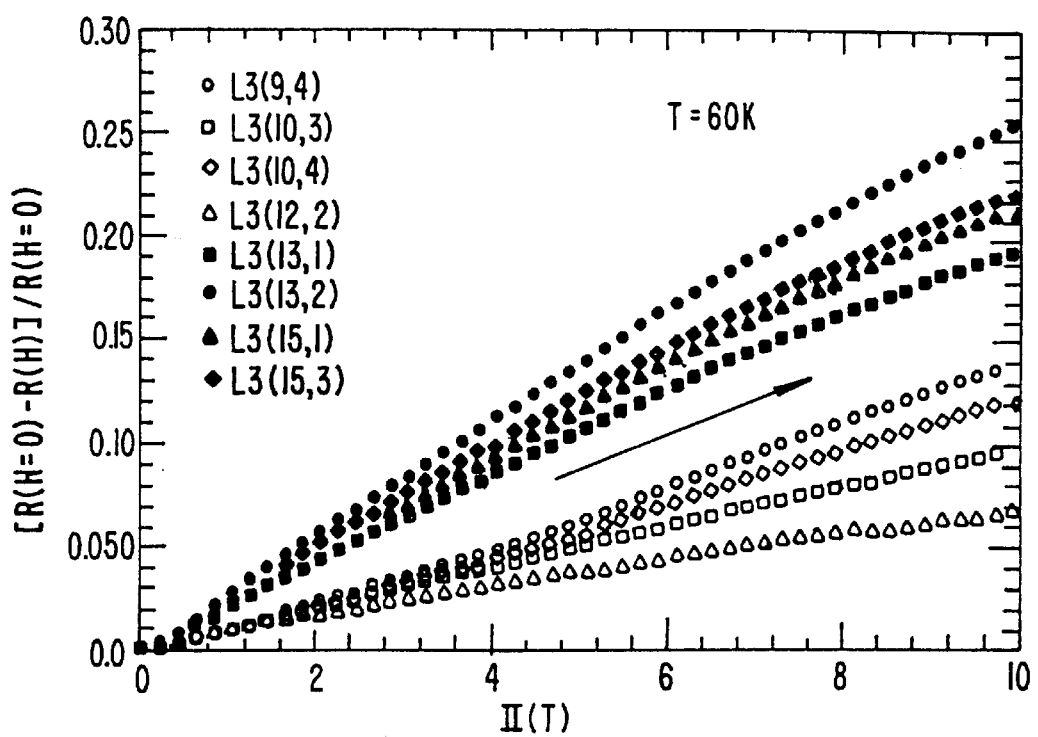
Figure 20A:
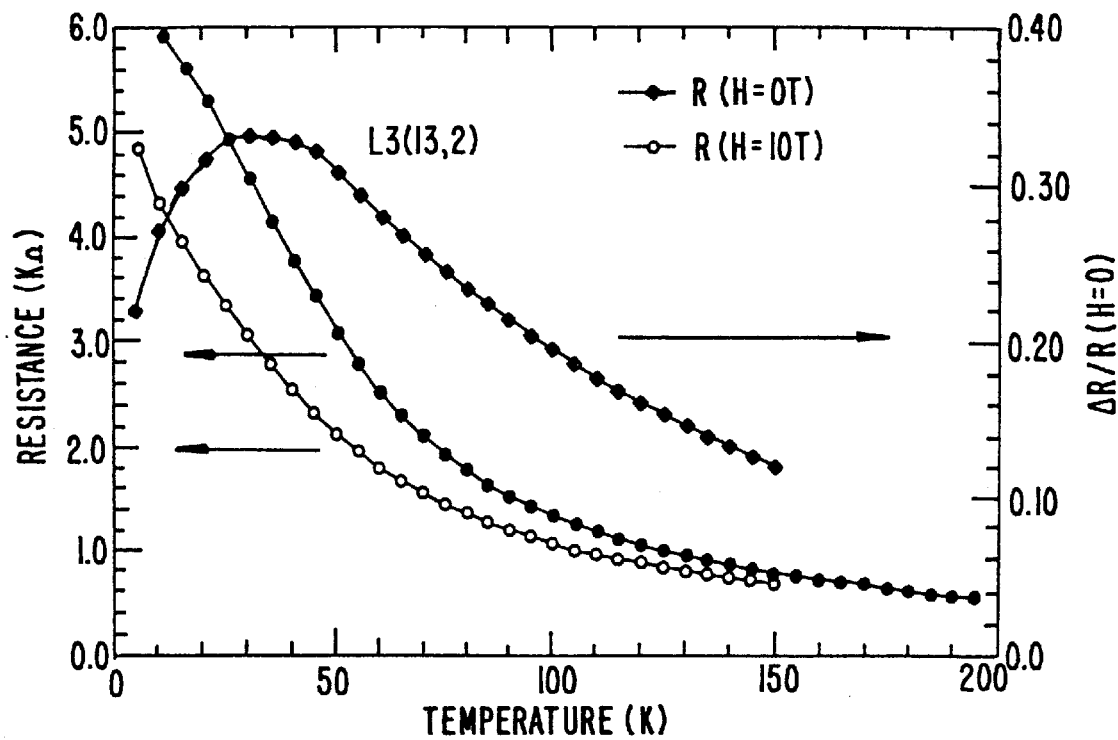
FIGS. 20A and 20B illustrate the resistance of sample L3(13, 2) under 0T and 10T and the MR ratio (H=10T) as a function of temperature (20A), and MR ratios of the sample for different magnetic fields as a function of temperature (20B). The solid lines are guides to the eye.
Figure 20B:
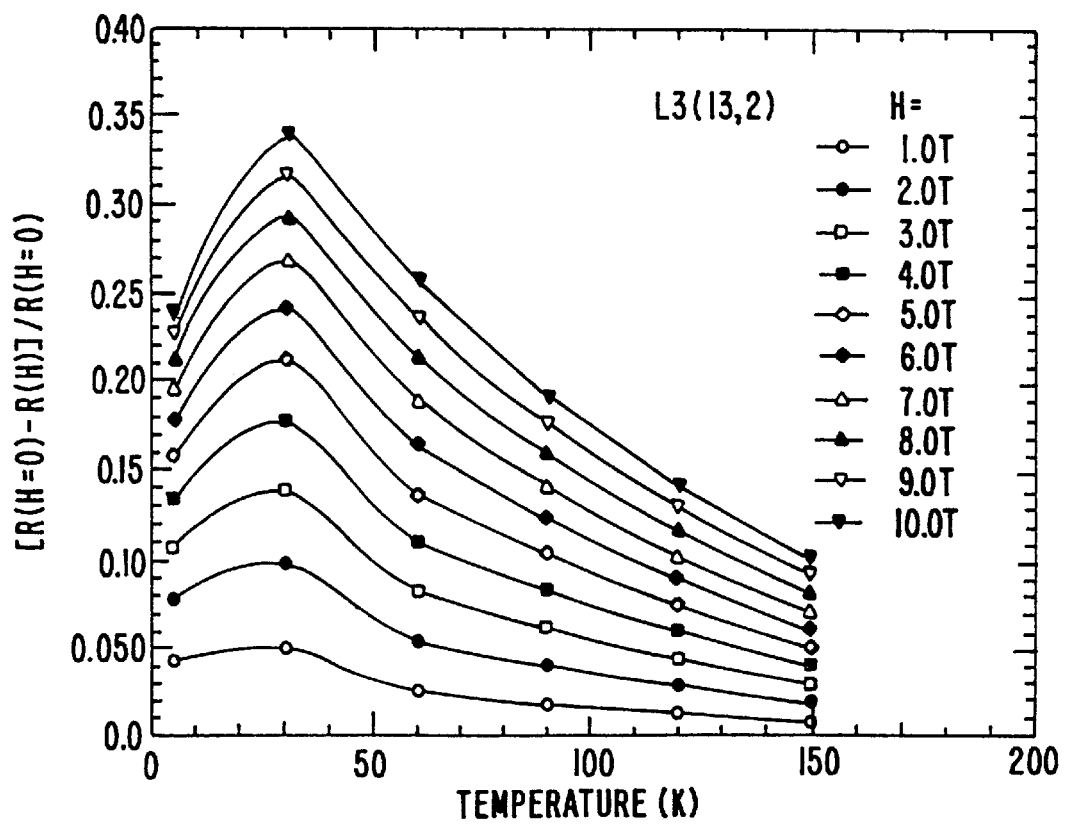

Moreover, from FIG. 18, it is apparent that some of these cobalt oxide compounds have the formula: $La_{1-x}M_xCoO_z$, wherein M is a member selected from the group consisting of Ca, Sr and Ba; x has a value ranging from about 0.1 to about 0.9; and z has a value ranging from about 2 to about 4. With resect to these particular cobalt oxide compounds, it was determined that the preferred molar fraction, i.e., x, is about 0.2 to about 0.7 and, even more preferably, about 0.3 to about 0.5. The normalized magnetoresistances of representative samples as a function of magnetic field at fixed temperature (60° K.) are shown in FIGS. 19A and 19B. The temperature dependence of the resistance and normalized MR of a representative sample L3 (13, 2) under different fields are shown in FIGS. 20A and 20B. In contrast to the behavior of manganese (Mn) oxide magnetoresistant (MR) materials (Jin, S., et al., Appl. Phys. Lett. 66:382 (1995)), it has been found that the MR effect increases as the size of the alkaline earth ion increases (see, FIGS. 19A and 19B).

The MR effects of the samples in L2 are larger than those of L3, presumably due to differences in oxidation resulting from slightly different thermal treatments. The largest MR ratio measured in this library was 72%, obtained for sample L2 (15,2) at T=7K and H=10T. This value is comparable to those measured for films generated in a similar fashion in a Mn based library. As with the manganese containing materials, optimization of composition, stoichiometry, substrate and synthetic conditions may lead to increases in the MR ratio. The corresponding Y(Ba, Sr, Ca)Co compounds show, however, much smaller (<5%) MR effects.

Figure 21A:
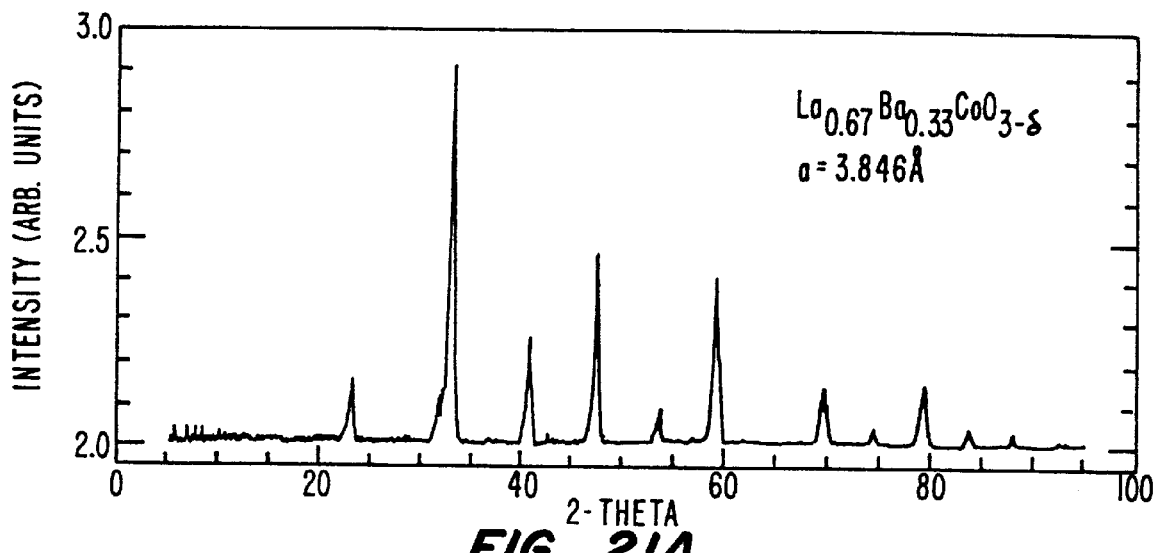
FIGS. 21A, 21B and 21C illustrate the X-ray diffraction patterns (indexed for cubic perovskite structure) for Ba, Sr and Ca doped bulk samples, respectively; the X-ray diffraction patterns indicate that the structure of this new class of cobalt oxides is cubic perovskite with some slight distortion.
Figure 21B:
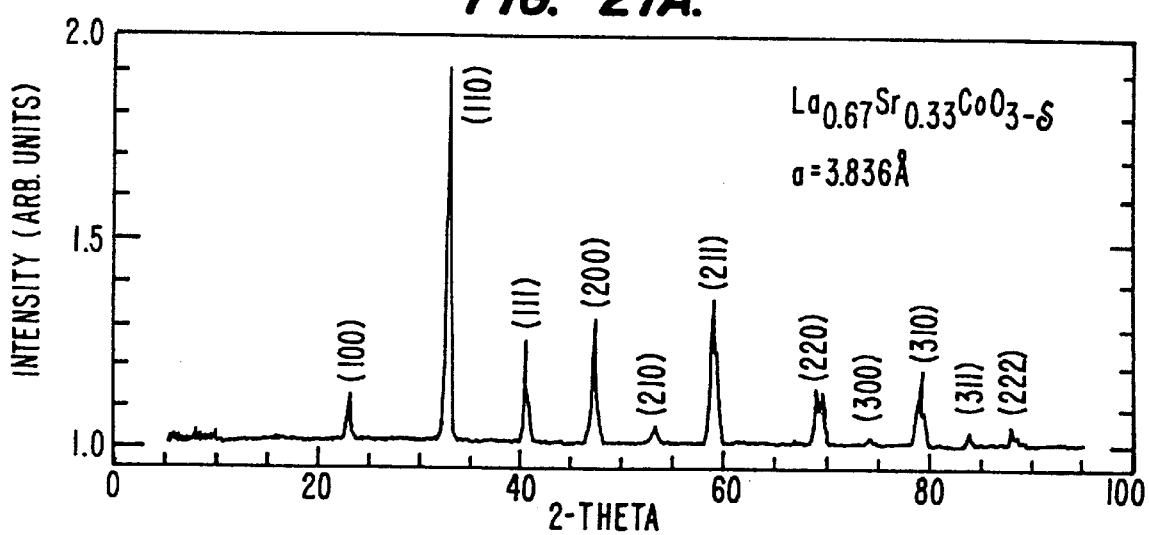
Figure 21C:
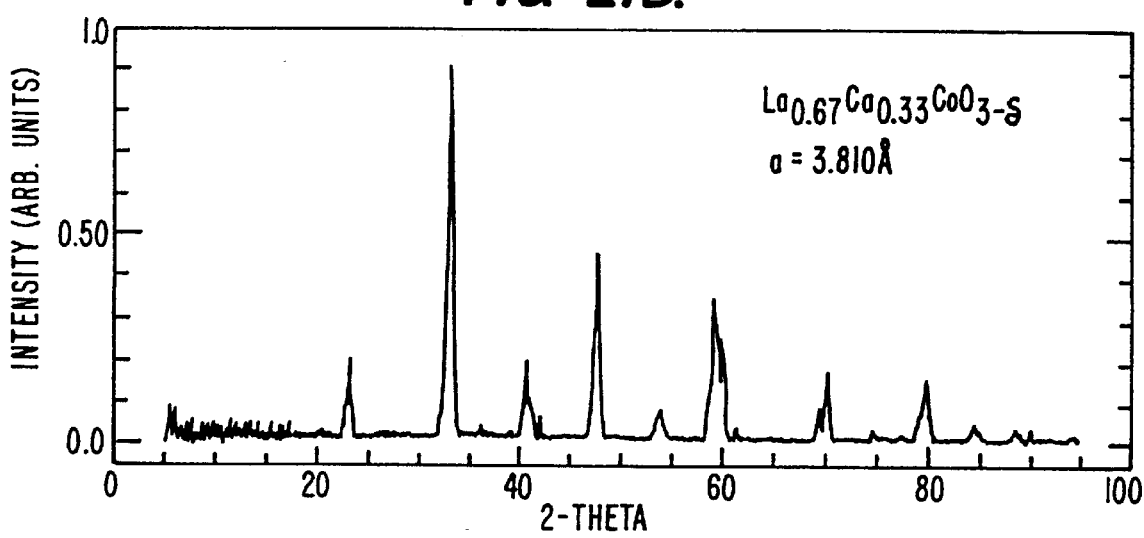

Three bulk samples with the stoichiometry $La_{0.67}(Ba,Sr,Ca)_{0.33}CoO_z$, wherein z has a value of about 2 to about 4, were then synthesized (sintered at 1400° C. in air) for further structural study. X-ray diffraction patterns (FIGS. 21A–C) show that the crystal structure is basically cubic perovskite with lattice constant, a, equal to 3.846 Å, 3.836 Å, and 3.810 Å for the Ba, Sr, and Ca compounds, respectively. The minor splittings of the intensity peaks are attributed to rhombohedral distortion from the perfect cubic perovskite structure (see, Askham, F., et al., *J. Amer. Chem. Soc.* 72:3799 (1950)).

Figure 22:
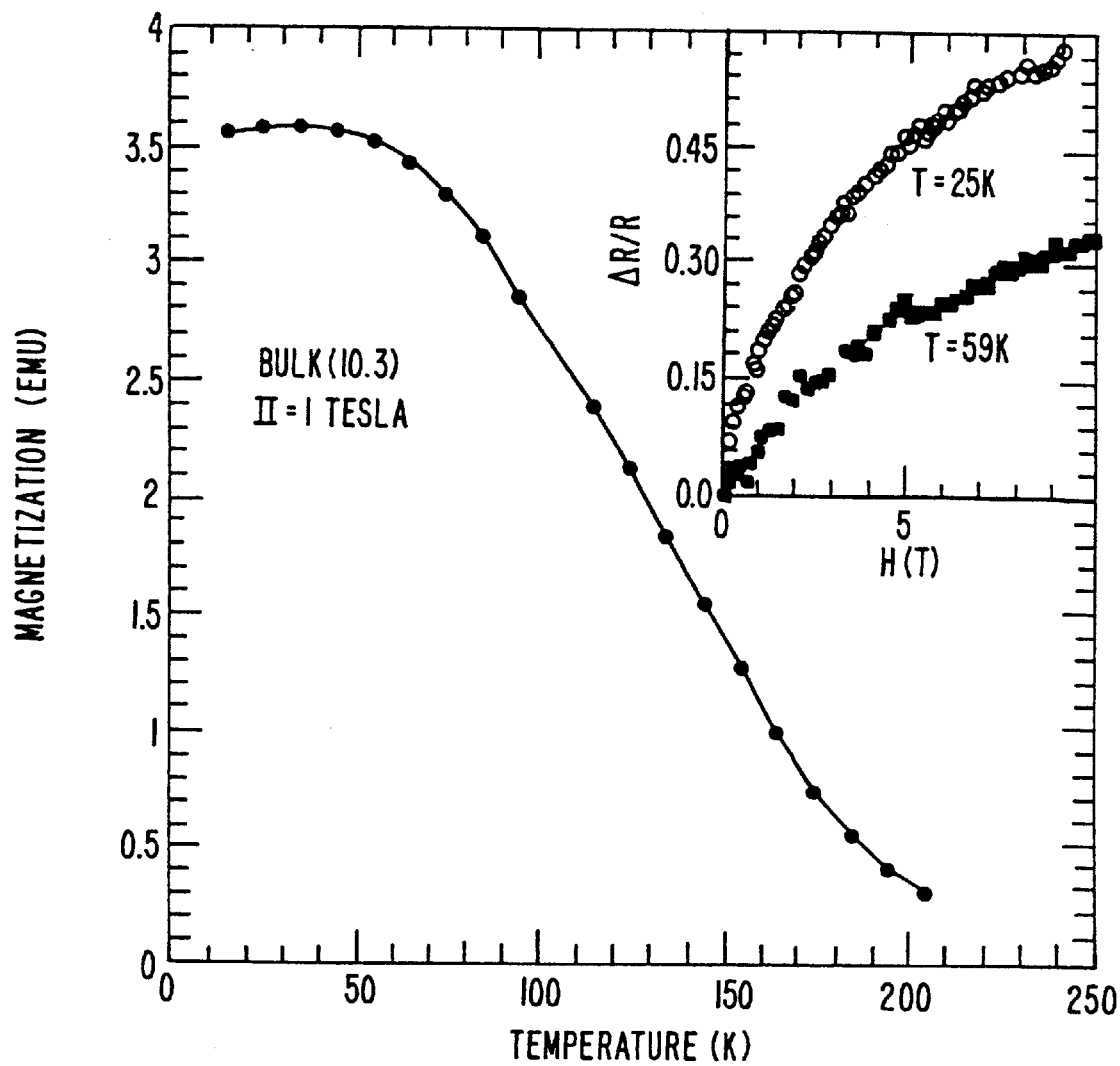
FIG. 22 illustrates the magnetization of the bulk sample $La_{0.58}Sr_{0.41}CoO_\delta$ under 1T field as a function of temperature. The solid line is a guide to the eye. The inset in FIG. 22 illustrates the MR ratios of the sample at different temperatures as a function of magnetic field.

In addition, a bulk sample of stoichiometry $La_{0.58}Sr_{0.41}CoO_z$, wherein z has a value of about 2 to about 4, was synthesized and its magnetization was measured with a SQUID magnetometer (Quantum Design). The sample MR as a function of magnetic field and the sample magnetization under 1T magnetic field as a function of temperature were measured and are shown in FIG. 22. A gradual ferromagnetic transition starts at −200° K. and substrates below 50° K. The MR ratio of this bulk sample (60%) is significantly higher than that of the corresponding thin film sample L2 (30%). The X-ray analysis of this sample confirmed the cubic perovskite structure with a =3.82 Å.

E. Synthesis of An Array of 16 Different Organic Polymers

This example illustrates the possible synthesis of an array of 16 different organic polymers formed by the polymerization of styrene with acrylonitrile. A 3 cm×3 cm pyrex substrate having 16 predefined regions thereon is used in this example. Each of the predefined regions is 3 mm×3 mm×5 mm and, thus, the volume of each predefined region is about 45 μL. To ensure that the reactants in a given region do not move to adjacent regions, 35 μL reaction volumes will be used.

A 2 M solution of the styrene monomer in toluene and a 2 M solution of acrylonitrile in toluene are used. The initiator used to initiate the polymerization reaction is benzoyl peroxide. A 70 mM solution of benzoyl peroxide in toluene is used. The initiator is present in each of the reactions at a 10 mM concentration. The styrene, acrylonitrile and benzoyl peroxide solutions are delivered to each of the 16 predefined regions on the substrate using an ink-jet dispenser having three nozzles. The first nozzles is connected to a reservoir containing the 2 M solution of styrene in toluene, the second nozzle is connected to a reservoir containing the 2 M solution of acrylonitrile in toluene, and the third nozzle is connected to a reservoir containing the 70 mM solution of benzoyl peroxide in toluene. The initiator is delivered to each of the 16 predefined regions only after the monomers have been delivered.

To generate an array of 16 different polymers of styrene and acrylonitrile, the reactant amounts set forth in Table IV, infra, are delivered to the 16 predefined regions on the substrate. Once the monomers have been delivered to the 16 predefined regions on the substrate, 5 μL of the 70 mM initiator solution is added. The polymerization reaction is carried out at a temperature of about 60° C. and at ambient pressure. The reactions are allowed to proceed until the terminator is used up. Upon completion of the polymerization reaction, the organic solvent is removed by evaporation in vacuo (100 Torr). The resulting polymers can be screened for hardness using, for example, a nanoindentor (sharp tip).

TABLE IV

VARIOUS REACTANT COMPONENTS USED TO GENERATE AN ARRAY OF 16 DIFFERENT POLYMERS

| Reaction Region | Amount of 2 M Solution of Styrene (μL) | Amount of 2 M Solution of Acrylonitrile (μL) |
|---|---|---|
| 1 | 30 | 0 |
| 2 | 28.5 | 1.5 |
| 3 | 27 | 3 |
| 4 | 25.5 | 4.5 |
| 5 | 24 | 6 |
| 6 | 22.5 | 7.5 |
| 7 | 21 | 9 |
| 8 | 19.5 | 10.5 |
| 9 | 18 | 12 |
| 10 | 16.5 | 13.5 |
| 11 | 15 | 15 |
| 12 | 13.5 | 16.5 |
| 13 | 12 | 18 |
| 14 | 10.5 | 19.5 |
| 15 | 9 | 21 |
| 16 | 7.5 | 22.5 |

F. Synthesis of an Array of Zeolites

This example illustrates a possible method for the synthesis of an array of different zeolites. The reactants are delivered to a 9 cm×9 cm Teflon substrate having 16 predefined regions thereon. The substrate is placed in a sealed container having a temperature of about 100° C. Each of the 16 predefined regions on the substrate is a 1 cm×1 cm×2 cm well. The reactants are delivered to the substrate using a automated pipette.

The five components used to generate the array of zeolites are as follows: $Na_2O \bullet Al_2O_3 \bullet 5H_2O$, KOH, $Na_2O \bullet 2SiO_2 \bullet 5H_2O$, NaOH and $H_2O$. The first four components are dissolved in water to concentrations of 2.22 M, 2.22 M, 8.88 M and 11.1 M, respectively. In delivering the components to the predefined regions on the substrate, it is important that the $Na_2O \bullet 2SiO_2 \bullet 5H_2O$ solution is added last. The five reactant components are delivered to the predefined regions on the substrate in the amounts set forth in Table V, infra.

Once the foregoing components have been delivered to the appropriate predefined regions on the substrate and allowed to react, the array can be scanned for microstructure using a Raman Light Scattering System. Scanning of the array can begin 2 to 3 hours after the components have been delivered to the substrate and can continue for anywhere from 5 to 10 days. In this example, Zeolite A will initially be formed at reaction region 1. With time, however, Zeolite A will be converted to Zeolite P. Zeolite X will be formed at reaction region 3. Sodalite will be formed at reaction region 6. Zeolite L will be formed at reaction region 12. In addition, other zeolites may be formed at other reaction regions on the substrate.

TABLE V

VARIOUS REACTANT COMPONENTS USED TO GENERATE AN ARRAY OF ZEOLITES

| Reaction Region | Amount of 2.2 M Solution of $Na_2O.Al_2O_3$ .5$H_2O$ (μL) | Amount of 8.88 M Solution of KOH (μL) | Amount of 2.2 M Solution of $Na_2O.2SiO_2$ .5$H_2O$ (μL) | Amount of 11.1 M Solution of NaOH (μL) | Amount of $H_2O$ (μL) |
|---|---|---|---|---|---|
| 1 | 100 | 0 | 100 | 80 | 480 |
| 2 | 100 | 0 | 100 | 80 | 1280 |

TABLE V-continued

VARIOUS REACTANT COMPONENTS USED TO GENERATE AN ARRAY OF ZEOLITES

| Reaction Region | Amount of 2.2 M Solution of Na$_2$O.Al$_2$O$_3$ .5H$_2$O (µL) | Amount of 8.88 M Solution of KOH (µL) | Amount of 2.2 M Solution of Na$_2$O.2SiO$_2$ .5H$_2$O (µL) | Amount of 11.1 M Solution of NaOH (µL) | Amount of H$_2$O (µL) |
|---|---|---|---|---|---|
| 3  | 100 | 0   | 200 | 40  | 420  |
| 4  | 100 | 0   | 200 | 40  | 1220 |
| 5  | 100 | 0   | 100 | 320 | 240  |
| 6  | 100 | 0   | 100 | 320 | 1040 |
| 7  | 100 | 0   | 200 | 280 | 180  |
| 8  | 100 | 0   | 200 | 280 | 980  |
| 9  | 100 | 200 | 100 | 80  | 280  |
| 10 | 100 | 200 | 100 | 80  | 1080 |
| 11 | 100 | 200 | 200 | 40  | 220  |
| 12 | 100 | 200 | 200 | 40  | 1020 |
| 13 | 100 | 200 | 100 | 320 | 40   |
| 14 | 100 | 200 | 100 | 320 | 840  |
| 15 | 100 | 200 | 200 | 280 | 0    |
| 16 | 100 | 200 | 200 | 280 | 800  |

G. Synthesis of An Array of Copper Oxide Compounds Using Spraying Deposition Techniques This example illustrates the synthesis of an array of copper oxide compounds using spraying deposition techniques. The reactants are delivered to a 1.25 cm×1.25 cm MgO substrate having 16 predefined regions thereon. The reactants are delivered in the form of thin-films using a sprayer in combination with physical masking techniques. The sprayer used in this example is a Sinitek 8700-120MS ultrasonic sprayer. At a water flow rite of 0.26 GPM and a frequency of 120 KHz, this sprayer can generate a cone-line spraying pattern of 2 inches and a droplet diameter of 18 microns.

The four components used in this example to generate the array of inorganic materials are Bi(NO$_3$)$_3$, Cu(NO$_3$)$_3$, Ca(NO$_3$)$_3$ and Si(NO$_3$)$_3$. These components were dissolved in water to concentrations of 0.8 M, 2 M, 2 M and 2 M, respectively. The pH of the Bi(NO$_3$)$_3$ solution was about 0.9. In delivering the reactants to the predefined regions on the substrate, it is important to control the flow rate of the sprayer as well as the temperature of the substrate so that the reactant droplets dry immediately upon contact with the substrate surface. The flow rate used was kept at about 0.26 GPM, and the temperature of the substrate was maintained at about 210° C. In addition, it is important to control the spraying time so that the amount, i.e., moles, of each reactant is approximately the same. The spraying time was such that each of the thin-layer films deposited on the surface of the substrate had a thickness of about 1 to 4 microns.

Using a binary masking strategy, the aqueous solutions of Ca(NO$_3$)$_3$, Bi(NO$_3$)$_3$, Cu(NO$_3$)$_3$ and Si(NO$_3$)$_3$ were delivered, in this order, to the substrate using the following steps. As mentioned, the MgO substrate had 16 predefined regions 1, 2, 3, 4, 5, 6, 7, 8, 9, 10, 11, 12, 13, 14, 15 and 16. In a first masking step, regions 9, 10, 11, 12, 13, 14, 15, and 16 were masked and an aqueous solution of Ca(NO$_3$)$_3$ was delivered to the exposed regions in the form of a thin-film. Thereafter, in a second masking step, the mask was repositioned so that regions 3, 4, 7, 8, 11, 12, 15 and 16 were masked, and an aqueous solution of Bi(NO$_3$)$_3$ was delivered to the exposed regions in the form of a thin-film. In a third masking step, regions 5, 6, 7, 8, 13, 14, 15 and 16 were masked, and an aqueous solution of Cu(NO$_3$)$_3$ was delivered to the exposed regions in the form of a thin-film. Finally, in a fourth masking step, regions 2, 4, 6, 8, 10, 12, 14 and 16 were masked, and an aqueous solution of Si(NO$_3$)$_3$ was delivered to the exposed regions in the form of a thin-film.

Once the components of interest were delivered to the appropriate predefined regions on the substrate, the substrate having the array of reactants thereon was oxidized at 300° C. to remove any nitrogen from the array. Thereafter, the substrate was flash heated at 880° C. for about 2 minutes and rapidly quenched on a copper block. Thereafter, the array of materials was screened for superconducting material.

H. Synthesis of An Array of 16 Different Zinc Silicate Phosphors

This example illustrates the possible synthesis of an array of 16 different zinc silicate phosphors. A 1 mm×1 mm pyrex substrate having 16 predefined regions thereon is used in this example. Each of the predefined regions is 100 µm×100 µm×500 µm and, thus, the volume of each predefined region is about 5,000 picoliters. To ensure the reactants in a given region do not move to adjacent regions, 3,000 picoliter reaction volumes will be used.

The reactants will be delivered simultaneously to each region on the substrate using an ink-jet dispenser having three nozzles. The first nozzle is connected to a reservoir containing a 1M solution of ZaO in water. To generate an array of 16 different phosphors, the reactant amounts set forth in Table VI, infra, are delivered to the 16 predefined regions on the substrate. The synthesis reaction is carried out under a nitrogen atmosphere for a period of 2 hrs. at 1400° C. Once formed, each of the 16 predefined reaction regions is screened for electroluminescent materials or phosphors by radiating the sample with a specific excitation wavelength and recording the emission spectra with a Perkin-Elmer LS50 spectrofluorimeter.

TABLE VI

VARIOUS REACTANT COMPONENTS USED TO GENERATE AN ARRAY OF ZINC SILICATE PHOSPHORS

| Reaction Region | SiO$_2$ | MnCO$_3$ (picoliters) | ZnO |
|---|---|---|---|
| 1  | 1500 | 1425 | 75  |
| 2  | 1500 | 1350 | 150 |
| 3  | 1500 | 1275 | 225 |
| 4  | 1500 | 1200 | 300 |
| 5  | 1500 | 1125 | 375 |
| 6  | 1500 | 1050 | 450 |
| 7  | 1500 | 975  | 525 |
| 8  | 1500 | 900  | 600 |
| 9  | 2000 | 950  | 50  |
| 10 | 2000 | 900  | 100 |
| 11 | 2000 | 850  | 150 |
| 12 | 2000 | 800  | 200 |
| 13 | 2000 | 750  | 250 |
| 14 | 2000 | 700  | 300 |
| 15 | 2000 | 650  | 350 |
| 16 | 2000 | 600  | 400 |

I. Synthesis of an Array of Copper Oxide Thin-Film Materials Using Sputtering Techniques in Combination with Photolithography Masking Techniques This example illustrates the possible synthesis and screening of an array of copper oxide materials. The reactants are delivered to a 1.25 cm×1.25 cm MgO substrate having 256 predefined regions thereon. One side of the MgO substrate has a rough side, while the other side is finely polished (1 micron diamond paste). An extremely clean and smooth surface is needed for good adhesion of the sputtered metal oxide layers. The reactants are delivered to the substrate in the form of thin-films using a sputtering system in combination with photolithography techniques, i.e., a patterned photoresist serves as the physical mask. The pattern of the photoresist determines where sputtered material is deposited and where it will be lifted off.

Starting with a clean, finely polished substrate, the first step is to spin on the photoresist. Shipley 1400-31 is used as the photoresist because it has good heat resistant characteristics, i.e., it remains soluble after exposure to temperatures of about 100° C. The photoresist is deposited in two layers for a total thickness of 3 microns. The photoresist is applied to the substrate from a dropper bottle, and the substrate is spun at 600 rpm for 30 sec. Once the first photoresist layer is deposited, it is soft-baked at 90° C. for 15 min. Thereafter, the substrate is cooled, the second photoresist layer is deposited and then soft-baked at 90° C. for 5 min. The substrate is cooled and then immersed in chlorobenzene for 10 min. Chlorobenzene modifies the surface of the resist, thereby removing the low-molecular-weight resin. As such, after treatment with chlorobenzene, the surface of the photoresist has a lower solubility in the developer than the underlying regions. In conjunction with back scattering of light at the photoresist-substrate interface and the differential photoresist development rates, an overhang is created in the photoresist. This creates a discontinuity of the photoresist layer and prevents encapsulation of the photoresist by thin metal layers.

Once the photoresist has been deposited, the substrate is ready to be exposed. A mask is selected based on the desired location of the first layer. The photoresist is exposed on a Canon Fine Pattern Projection Mask Aligner (FPA-141F). The first layer of a 256 library contains 128 sites, each of the sites being 100 microns×100 microns, with a 50 microns distance between sites. After exposure, the photoresist is developed in a microposit developer for 45 seconds and then rinsed in water for 1 min.

The substrate is now ready for deposition of the first layer. 300 Å of $BiO_3$ is sputtered onto the substrate. Normally, the sputtering temperature can exceed the limits of the photoresist. It is found, however, that with a low-power sputtering (150 watts) gun and a target substrate distance of 10 cm, substrate heating has not been a problem, even for deposition periods lasting as long as 8 hours. A cooling block should be available in case the substrate temperate exceeded 100° C.

The liftoff process is achieved by placing the substrate in an ultrasonic bath of acetone. The metal adheres at sites where the photoresist had been removed as a result of prior exposure and development, whereas the metal is lifted off where the resist remained after patterning. The acetone readily dissolves the photoresist and, thus, the metal peels off. The subsequent component layers are deposited on the substrate in the same manner, except the next layer must be aligned to the first, and the sites at which the metal is to be deposited are changed. In this example, the next layer is CuO, then $SrCo_3$ and then CaO.

Once the components of interest are delivered to the 256 predefined regions on the substrate, the substrate is placed in a furnace, and the components are subsequently reacted. Once reacted, each of the 256 predefined regions can be screened for resistance using, for example, a 4-point contact probe.

X. Conclusion

The present invention provides greatly improved methods and apparatus for the parallel deposition, synthesis and screening of an array of materials on a single substrate. It is to be understood that the above description is intended to be illustrative and not restrictive. Many embodiments and variations of the invention will become apparent to those of skill in the art upon review of this disclosure. Merely by way of example a wide variety of process times, reaction temperatures and other reaction conditions may be utilized, as well as a different ordering of certain processing steps. The scope of the invention should, therefore, be determined not with reference to the above description, but instead should be determined with reference to the appended claims along with the full scope of equivalents to which such claims are entitled.

What is claimed is:

1. A method of making at least two different arrays of materials, said method comprising:
    (a) delivering a first component of a first material to a first region on a first single substrate and delivering said first component of said first material to a first region on a second single substrate;
    (b) delivering a first component of a second material to a second region on said first single substrate and delivering said first component of said second material to a second region on said second single substrate;
    (c) delivering a second component of said first material to said first region on said first single substrate and delivering said second component of said first material to said first region on said second single substrate;
    (d) delivering a second component of said second material to said second region on said first single substrate and delivering said second component of said second material to said second region on said second single substrate; and
    (e) reacting said components on said first single substrate under a first set of reaction conditions and said components on said second single substrate under a second set of reaction conditions to form at least two different arrays of at least two different materials.

2. The method as recited in claim 1 wherein said materials are covalent network solids.

3. The method as recited in claim 1 wherein said materials are ionic solids.

4. The method as recited in claim 1 wherein said materials are molecular solids.

5. The method as recited in claim 1 wherein said materials are inorganic materials.

6. The method as recited in claim 5 wherein said materials are intermetallic materials.

7. The method as recited in claim 5 wherein said inorganic materials are metal alloys.

8. The method as recited in claim 5 wherein said inorganic materials are ceramic materials.

9. The method as recited in claim 1 wherein said materials are organometallic materials.

10. The method as recited in claim 1 wherein said materials are composite materials.

11. The method as recited in claim 1 wherein said materials are non-biological organic polymers.

12. The method as recited in claim 1 wherein said first set of reaction conditions differs from said second set of reaction conditions in terms of the temperature at which the reactions are carried out.

13. The method as recited in claim 1 wherein said first set of reaction conditions differs from said second set of reaction conditions in terms of the pressure at which the reactions are carried out.

14. The method as recited in claim 1 wherein said first set of reaction conditions differs from said second set of reaction conditions in terms of the reaction times at which the reactions are carried out.

15. The method as recited in claim 1 wherein said first set of reaction conditions differs from said second set of reaction conditions in terms of the atmosphere in which the reactions are carried out.

16. The method as recited in claim 1 wherein said first component of said first material and said first component of said second material are the same, but are offered in different amounts.

17. A method of making at least two different arrays of materials, said method comprising:

(a) delivering a first component of a first material to a first region on a first single substrate and delivering said first component of said first material to a first region on a second single substrate;

(b) delivering a first component of a second material to a second region on said first single substrate and delivering said first component of said second material to a second region on said second single substrate;

(c) delivering a second component of said first material to said first region on said first single substrate and delivering said second component of said first material to said first region on said second single substrate;

(d) delivering a second component of said second material to said second region on said first single substrate and delivering said second component of said second material to said second region on said second single substrate; and (e) reacting said components on said first single substrate under a first set of reaction conditions and said components on said second single substrate under a second set of reaction conditions to form at least two different arrays of at least two different materials;

wherein at least 100 different materials are synthesized on each of said first single substrate and said second single substrate.

18. A method of making at least two different arrays of materials, said method comprising:

(a) delivering a first component of a first material to a first region on a first single substrate and delivering said first component of said first material to a first region on a second single substrate;

(b) delivering a first component of a second material to a second region on said first single substrate and delivering said first component of said second material to a second region on said second single substrate;

(c) delivering a second component of said first material to said first region on said first single substrate and delivering said second component of said first material to said first region on said second single substrate;

(d) delivering a second component of said second material to said second region on said first single substrate and delivering said second component of said second material to said second region on said second single substrate; and (e) reacting said components on said first single substrate under a first set of reaction conditions and said components on said second single substrate under a second set of reaction conditions to form at least two different arrays of at least two different materials;

wherein each of said materials is synthesized in an area of less than 1 cm$^2$.

19. A method of making at least two different arrays of materials, said method comprising:

(a) delivering a first component of a first material to a first region on a first single substrate and delivering said first component of said first material to a first region on a second single substrate;

(b) delivering a first component of a second material to a second region on said first single substrate and delivering said first component of said second material to a second region on said second single substrate;

(c) delivering a second component of said first material to said first region on said first single substrate and delivering said second component of said first material to said first region on said second single substrate;

(d) delivering a second component of said second material to said second region on said first single substrate and delivering said second component of said second material to said second region on said second single substrate; and (e) reacting said components on said first single substrate under a first set of reaction conditions and said components on said second single substrate under a second set of reaction conditions to form at least two different arrays of at least two different materials;

wherein there is a sufficient amount of space between each of said regions on said first single substrate and said second single substrate such that said components cannot interdiffuse between said regions.

20. A method of making and screening at least two different arrays of materials, said method comprising:

(a) delivering a first component of a first material to a first region on a first single substrate and delivering said first component of said first material to a first region on a second single substrate;

(b) delivering a first component of a second material to a second region on said first single substrate and delivering said first component of said second material to a second region on said second single substrate;

(c) delivering a second component of said first material to said first region on said first single substrate and delivering said second component of said first material to said first region on said second single substrate;

(d) delivering a second component of said second material to said second region on said first single substrate and delivering said second component of said second material to said second region on said second single substrate;

(e) reacting said components on said first single substrate under a first set of reaction conditions and said components on said second single substrate under a second set of reaction conditions to form at least two different arrays of at least two different materials; and (f) screening said materials on said first single substrate and said materials on said second single substrate for a useful property.

21. The method as recited in claim 1 wherein said first component of said first material and said second component of said first material are simultaneously delivered to said first region on said first single substrate.

22. The method as recited in claim 1 wherein said fist component of said first material and said first component of said second material are simultaneously delivered to said first region and said second region on said first single substrate, respectively.

23. The method as recited in claims 1, 17 or 20 wherein said first component of said first material and said first component of said second material are the same, but are offered in different concentrations.

24. The method as recited in claims 1, 17 or 20 wherein said second component of said first material and said second component of said second material are the same, but are offered in different concentrations.

25. The method as recited in claim 1 wherein said first component of said first material is delivered to said first region on said first single substrate and said second single substrate in a gradient of stoichiometries.

26. The method as recited in claim 1 wherein said first component of said first material and said first component of said second material are the same, but are offered to said first and second regions on said first single substrate and said second single substrate in a gradient of stoichiometries.

27. The method as recited in claim 1 wherein the components of said materials are delivered to said first and second regions on said first single substrate and said second single substrate from a dispenser.

28. The method as recited in claim 27 wherein said dispenser is a pipette.

29. The method as recited in claim 27 wherein said dispenser is selected from the group consisting of a pulse pressure ink-jet dispenser, a bubble jet ink-jet dispenser and a slit jet ink-jet dispenser.

30. The method as recited in claim 1 wherein said steps of delivering said components to said first single substrate each comprises the following steps:
    (i) identifying a reference point on said first single substrate;
    (ii) moving a dispenser of said component a fixed distance and direction from said reference point such that said dispenser is positioned approximately above said first region on said first single substrate;
    (iii) delivering said component to said first region; and
    (iv) repeating steps (ii) and (iii) for each remaining component for each remaining region.

31. The method as recited in claim 1 wherein said step of delivering said first component of said first material to said first region on said first single substrate comprises the steps of:
    (i) placing a mask adjacent to said first single substrate, said mask permitting said first component of said first material to be delivered to said first region on said first single substrate, but not to said second region on said first single substrate;
    (ii) delivering said first component of said first material to said first region on said first single substrate; and
    (iii) removing said mask.

32. The method as recited in claim 1 wherein said step of delivering said first component of said first material to said first region on said first single substrate comprises the steps of:
    (i) placing a mask adjacent to said first single substrate, said mask permitting said first component of said first material to be delivered to said first region on said first single substrate, but not to said second region on said first single substrate;
    (ii) depositing a thin-film of said first component of said first material on said first region on said first single substrate; and
    (iii) removing said mask.

33. The method as recited in claim 1 wherein said step of delivering said first component of said first material to said first region on said first single substrate comprises the steps of:
    (i) placing a mask adjacent to said substrate, said mask permitting said first component of said first material to be delivered to said first region on said first single substrate, but not to said second region on said first single substrate;
    (ii) spraying said first component of said first material onto said first region on said first single substrate; and
    (iii) removing said mask.

34. The method as recited in claims 1, 17 or 20 wherein said step of delivering said first component of said first material to said first region on said first single substrate comprises the steps of:
    (i) placing a shutter adjacent to said first single substrate, said shutter permitting said first component of said first material to be delivered to said first region on said first single substrate, but not to said second region on said first single substrates;
    (ii) delivering said first component of said first material to said first region on said first single substrate; and
    (iii) removing said shutter.

35. The method as recited in claims 1, 17 or 20 wherein said step of delivering said first component of said first material to said first region on said first single substrate comprises the steps of;
    (i) placing a shutter adjacent to said first single substrate, said shutter permitting said first component of said first material to be delivered to said first region on said first single substrate, but not to said second region on said first single substrate;
    (ii) depositing a thin-film of said first component of said first material on said first region on said first single substrate; and
    (iii) removing said shutter.

36. The method as recited in claims 1, 17 or 20 wherein said step of delivering said first component of said first material to said first region on said first single substrate comprises the steps of:
    (i) placing a shutter adjacent to said first single substrate, said shutter permitting said first component of said first material to be delivered to said first region on said first single substrate, but not to said second region on said first single substrate;
    (ii) spraying said first component of said first material onto said first region on said first single substrate; and
    (iii) removing said shutter.

37. The method as recited in claim 1 wherein each of said materials is synthesized in an area of less than 25 $cm^2$.

38. The method as recited in claim 1 wherein each of said materials is synthesized in an area of less than 10 $cm^2$.

39. The method as recited in claim 1 wherein each of said materials is synthesized in an area of less than 5 $cm^2$.

40. The method as recited in claims 1, 17 or 20 wherein each of said materials is synthesized in an area of less than 1 $cm^2$.

41. The method as recited in claims 1, 17 or 20 wherein each of said materials is synthesized in a area of less than 1 $mm^2$.

42. The method as recited in claims 1, 17 or 20 wherein each of said materials is synthesized in an area of less than 10,000 $\mu m^2$.

43. The method as recited in claim 1 wherein each of said materials is synthesized in an area of less than 1,000 $\mu m^2$.

44. The method as recited in claim 1 wherein each of said materials is synthesized in an area of less than 100 $\mu m^2$.

45. The method as recited in claim 1 wherein each of said materials synthesized in an area of less than 1 $\mu m^2$.

46. The method as recited in claim 1 wherein at least 10 different materials are synthesized on each of said first single substrate and said second single substrate.

47. The method as recited in claim 1 wherein at least 100 different materials are synthesized on each of said first single substrate and said second single substrate, and each different material is contained within an area of about 1 mm² or less.

48. The method as recited in claims 1 or 17 further comprising the step of screening said arrays of materials for a useful property.

49. The method as recited in claim 48 wherein said useful property is a member selected from the group consisting of an electrical property, a thermal property, a mechanical property, a morphological property, an optical property, a magnetic property and it chemical property.

50. The method as recited in claim 48 wherein said useful property is a the property and said useful property is measured using an infrared camera.

51. The method as recited in claim 48 wherein said useful property is a chemical property and said useful property is measured using an infrared camera.

52. The method as recited in claim 48 wherein each of said arrays of materials is screened in parallel.

53. The method as recited in claim 52 wherein said parallel screening is carried out using an infrared camera.

54. The method as recited in claim 53 wherein said sequential screening is carried out using an infrared camera.

55. The method as recited in claim 48 wherein each of said arrays of materials is screened sequentially.

56. The method as recited in claim 8 wherein there is a barrier between each of said regions on said first single substrate and said second single substrate.

57. The method as recited in claim 56 wherein said barrier is a physical barrier.

58. The method as recited in claim 19 wherein each of said first single substrate and said second single substrate has a dimple to define each of said regions.

59. The method as recited in claims 1 or 20 wherein at least 100 different materials are synthesized on each of said first single substrate and said second single substrate.

60. The method as recited in claims 1 or 20 wherein at least 1000 different materials are synthesized on each of said first single substrate and said second single substrate.

61. The method as recited in claims 1 or 20 wherein at least 106 different materials are synthesized on each of said first single substrate and said second single substrate.

* * * * *

UNITED STATES PATENT AND TRADEMARK OFFICE
CERTIFICATE OF CORRECTION

PATENT NO.    : 6,004,617
DATED         : December 21, 1999
INVENTOR(S)   : Schultz et al.

It is certified that error appears in the above-identified patent and that said Letters Patent is hereby corrected as shown below:

Column 50,
Line 14, delete the "s" at the end of the word "substrates;"

Column 51,
Line 12, delete the word "it" and insert the word -- a --
Line 14, delete the word "the" and insert the word -- thermal --

Column 52,
Line 5, delete the number "8" and insert the number -- 18 --

Signed and Sealed this

Sixth Day of August, 2002

Attest:

JAMES E. ROGAN
Attesting Officer    Director of the United States Patent and Trademark Office